US012722358B2

(12) United States Patent
Fathi et al.

(10) Patent No.: US 12,722,358 B2
(45) Date of Patent: *Sep. 1, 2026

(54) ADHESIVE BONDING COMPOSITION AND METHOD OF USE

(71) Applicant: Immunolight, LLC, Detroit, MI (US)

(72) Inventors: Zakaryae Fathi, Raleigh, NC (US); Frederic A. Bourke, Jr., Aspen, CO (US); Harold Walder, Oak Island, NC (US)

(73) Assignee: Immunolight, LLC, Detroit, MI (US)

( * ) Notice: Subject to any disclaimer, the term of this patent is extended or adjusted under 35 U.S.C. 154(b) by 649 days.

This patent is subject to a terminal disclaimer.

(21) Appl. No.: 18/173,373

(22) Filed: Feb. 23, 2023

(65) Prior Publication Data

US 2023/0191747 A1 Jun. 22, 2023

Related U.S. Application Data

(63) Continuation of application No. 16/944,877, filed on Jul. 31, 2020, now Pat. No. 11,648,750, which is a (Continued)

(51) Int. Cl.
*B32B 7/12* (2006.01)
*B32B 5/02* (2006.01)

(Continued)

(52) U.S. Cl.
CPC .................. *B32B 7/12* (2013.01); *B32B 5/02* (2013.01); *B32B 5/18* (2013.01); *B32B 5/26* (2013.01);

(Continued)

(58) Field of Classification Search
None
See application file for complete search history.

(56) References Cited

U.S. PATENT DOCUMENTS 2,388,373 A 11/1945 Stewart
4,929,401 A 5/1990 Shippen (Continued)

FOREIGN PATENT DOCUMENTS

KR 20030088660 11/2003
WO WO 2011/140469 A1 11/2011
WO WO 2015/143065 A1 9/2015

OTHER PUBLICATIONS

Office Action issued Jul. 15, 2020 in corresponding European Patent Application No. 15 814 784.3, 5 pages.

(Continued)

*Primary Examiner* — Sanza L. McClendon
(74) *Attorney, Agent, or Firm* — TUCKER ELLIS, L.L.P.; J. Derek Mason

(57) ABSTRACT

A method of and system for adhesive bonding by a) providing a polymerizable adhesive composition on a surface of an element to be bonded to form an assembly; b) irradiating the assembly with radiation at a first wavelength capable of vulcanization of bonds in the polymerizable adhesive composition by activation of sulfur-containing compound with at least one selected from x-ray, e-beam, visible, or infrared light to thereby generate ultraviolet light in the polymerizable adhesive composition; and c) adhesively joining two or more components together by way of the polymerizable adhesive composition, and a curable polymer for use therein.

63 Claims, 19 Drawing Sheets

Related U.S. Application Data continuation of application No. 16/515,754, filed on Jul. 18, 2019, now Pat. No. 10,734,353, which is a continuation of application No. 15/322,928, filed as application No. PCT/US2015/038290 on Jun. 29, 2015, now Pat. No. 10,410,991.

(60) Provisional application No. 62/018,915, filed on Jun. 30, 2014.

(51) Int. Cl.

| | |
|---|---|
| ***B32B 5/18*** | (2006.01) |
| ***B32B 5/26*** | (2006.01) |
| ***B32B 7/06*** | (2019.01) |
| ***B32B 9/02*** | (2006.01) |
| ***B32B 9/04*** | (2006.01) |
| ***B32B 17/00*** | (2006.01) |
| ***B32B 18/00*** | (2006.01) |
| ***B32B 21/04*** | (2006.01) |
| ***B32B 25/04*** | (2006.01) |
| ***B32B 27/08*** | (2006.01) |
| ***B32B 27/16*** | (2006.01) |
| ***B32B 27/30*** | (2006.01) |
| ***B32B 27/32*** | (2006.01) |
| ***B32B 27/34*** | (2006.01) |
| ***B32B 27/36*** | (2006.01) |
| ***B32B 37/12*** | (2006.01) |
| ***B32B 38/00*** | (2006.01) |
| ***C09J 7/10*** | (2018.01) |
| ***C09J 11/06*** | (2006.01) |
| ***C09J 133/00*** | (2006.01) |
| ***C09J 133/06*** | (2006.01) |
| ***H10W 72/00*** | (2026.01) |
| *H10W 72/30* | (2026.01) |
| *H10W 72/59* | (2026.01) |
| *H10W 72/90* | (2026.01) |
| *H10W 90/00* | (2026.01) |

(52) U.S. Cl.

CPC ................ *B32B 7/06* (2013.01); *B32B 9/025* (2013.01); *B32B 9/04* (2013.01); *B32B 9/043* (2013.01); *B32B 17/00* (2013.01); *B32B 18/00* (2013.01); *B32B 21/042* (2013.01); *B32B 25/045* (2013.01); *B32B 27/08* (2013.01); *B32B 27/16* (2013.01); *B32B 27/302* (2013.01); *B32B 27/304* (2013.01); *B32B 27/308* (2013.01); *B32B 27/32* (2013.01); *B32B 27/322* (2013.01); *B32B 27/34* (2013.01); *B32B 27/36* (2013.01); *B32B 37/12* (2013.01); *B32B 38/0008* (2013.01); *C09J 7/10* (2018.01); *C09J 11/06* (2013.01); *C09J 133/00* (2013.01); *C09J 133/06* (2013.01); *H10W 72/00* (2026.01); *B32B 2037/1253* (2013.01); *B32B 2255/26* (2013.01); *B32B 2305/18* (2013.01); *B32B 2307/202* (2013.01); *B32B 2307/204* (2013.01); *B32B 2307/21* (2013.01); *B32B 2307/3065* (2013.01); *B32B 2307/41* (2013.01); *B32B 2307/412* (2013.01); *B32B 2307/422* (2013.01); *B32B 2307/50* (2013.01); *B32B 2307/546* (2013.01); *B32B 2307/548* (2013.01); *B32B 2307/552* (2013.01); *B32B 2307/706* (2013.01); *B32B 2307/72* (2013.01); *B32B 2307/748* (2013.01); *B32B 2307/75* (2013.01); *B32B 2310/0806* (2013.01); *B32B 2439/00* (2013.01); *B32B 2439/70* (2013.01); *B32B 2439/80* (2013.01); *B32B 2457/14* (2013.01); *B32B 2479/00* (2013.01); *B32B 2605/003* (2013.01); *B32B 2605/08* (2013.01); *H10W 72/01323* (2026.01); *H10W 72/01325* (2026.01); *H10W 72/01333* (2026.01); *H10W 72/01336* (2026.01); *H10W 72/01351* (2026.01); *H10W 72/01355* (2026.01); *H10W 72/01951* (2026.01); *H10W 72/01953* (2026.01); *H10W 72/0198* (2026.01); *H10W 72/07311* (2026.01); *H10W 72/07338* (2026.01); *H10W 72/074* (2026.01); *H10W 72/322* (2026.01); *H10W 72/325* (2026.01); *H10W 72/352* (2026.01); *H10W 72/353* (2026.01); *H10W 72/354* (2026.01); *H10W 72/59* (2026.01); *H10W 72/925* (2026.01); *H10W 72/953* (2026.01); *H10W 90/732* (2026.01); *H10W 90/734* (2026.01); *H10W 90/736* (2026.01)

(56) References Cited

U.S. PATENT DOCUMENTS

| | | | |
|---|---|---|---|
| 5,939,206 | A | 8/1999 | Kneezel |
| 7,032,492 | B2 | 4/2006 | Meshirer |
| 7,943,235 | B2 | 5/2011 | Yamamoto et al. |
| 2002/0000037 | A1 | 1/2002 | Chou |
| 2002/0011306 | A1 | 1/2002 | Hannington |
| 2002/0101004 | A1 | 8/2002 | Farris |
| 2002/0105567 | A1 | 8/2002 | Yamada |
| 2003/0124357 | A1 | 7/2003 | Kagerer |
| 2003/0226472 | A1 | 12/2003 | Kneafsey |
| 2005/0064182 | A1 | 3/2005 | Lunsford |
| 2005/0084640 | A1 | 4/2005 | Bilodeau |
| 2005/0233547 | A1 | 10/2005 | Noda |
| 2008/0122067 | A1 | 5/2008 | Wang |
| 2009/0027872 | A1 | 1/2009 | Debije |
| 2010/0173167 | A1 | 7/2010 | Vissing |
| 2010/0261263 | A1 | 10/2010 | Vo-Dinh |
| 2010/0279491 | A1 | 11/2010 | Kiuchi |
| 2011/0127445 | A1 | 6/2011 | Zhang |
| 2012/0089180 | A1 | 4/2012 | Fathi et al. |
| 2012/0201973 | A1 | 8/2012 | Guo |
| 2013/0011608 | A1 | 1/2013 | Wolk |
| 2013/0203895 | A1 | 8/2013 | Dershem |
| 2013/0288062 | A1 | 10/2013 | Van Loon et al. |
| 2014/0113078 | A1 | 4/2014 | Aberle et al. |
| 2014/0248496 | A1 | 9/2014 | Kuwajima |
| 2015/0182321 | A1 | 7/2015 | Karazivan |
| 2015/0184031 | A1 | 7/2015 | Yurt |
| 2015/0210783 | A1 | 7/2015 | Youngbull |
| 2015/0246521 | A1 | 9/2015 | Fathi et al. |
| 2016/0024358 | A1 | 1/2016 | Zambova |
| 2017/0162537 | A1 | 6/2017 | Fathi et al. |
| 2017/0186720 | A1 | 6/2017 | Fathi et al. |

OTHER PUBLICATIONS

Office Action issued Mar. 1, 2021 in corresponding European Patent Application No. 15 814 784.3, 10 pages.

International Search Report and Written Opinion of the International Searching Authority issued Sep. 24, 2015 in PCT/US2015/038290 filed Jun. 29, 2015.

International Preliminary Report on Patentability and Written Opinion of the International Searching Authority issued Jan. 12, 2017 in PCT/US2015/038290 filed Jun. 29, 2015.

Partial Supplementary European Search Report issued Oct. 30, 2017 in Patent Application No. 15814784.3.

Extended European Search Report issued Feb. 9, 2018 in European Patent Application No. 15814784.3.

European Office Action issued Feb. 27, 2018 in European Patent Application No. 15814784.3.

$YTaO_4$ having a peak emission measured at 327nm.

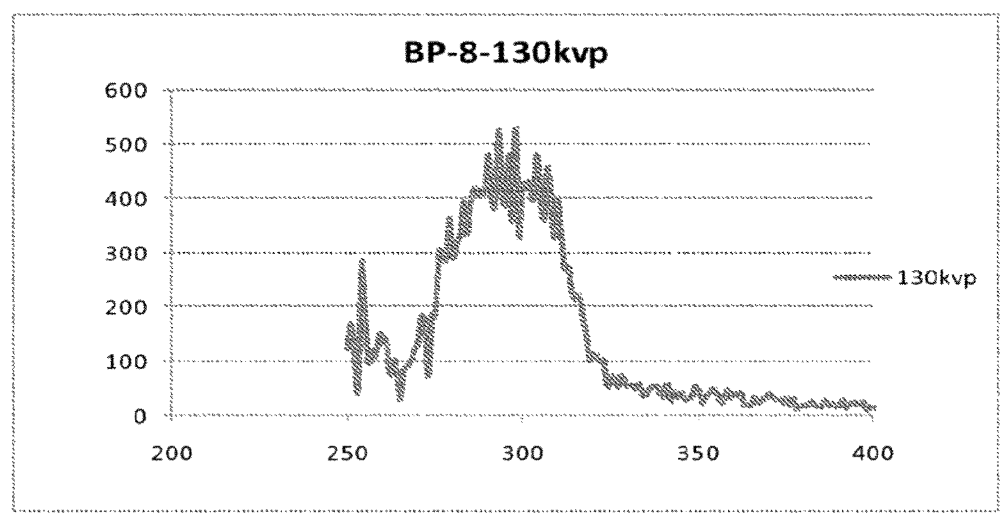
FIG. 2B $LaF_3$:Ce having a measured emission at 300nm.

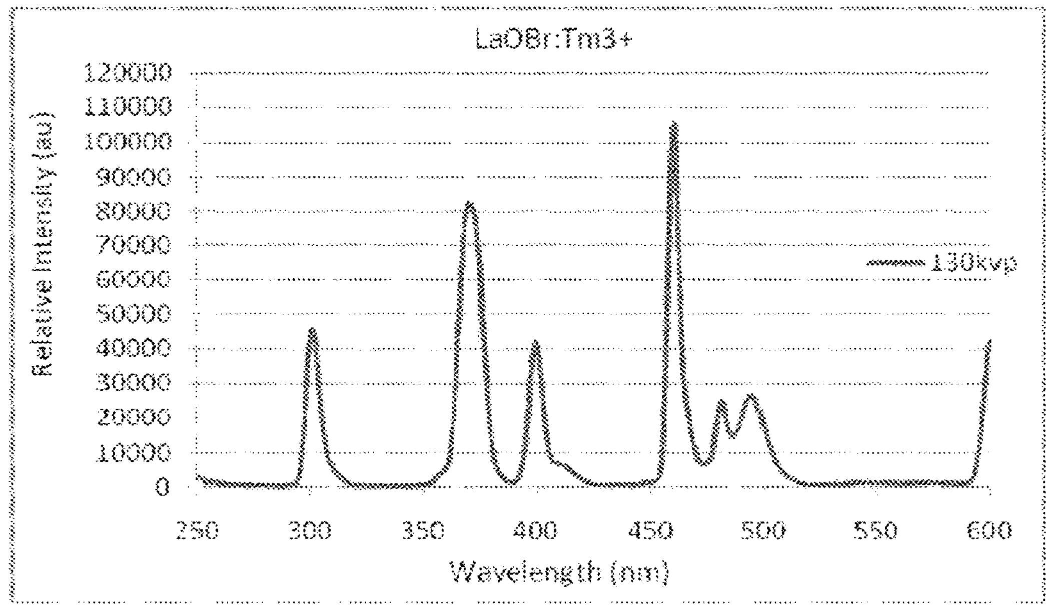
FIG. 3. LaOBr:$Tm_3$+ coated with Silica was measured during the course of the present invention to emit in the UVB, UVA and the Visible.

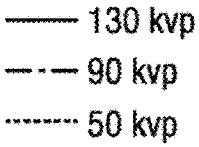
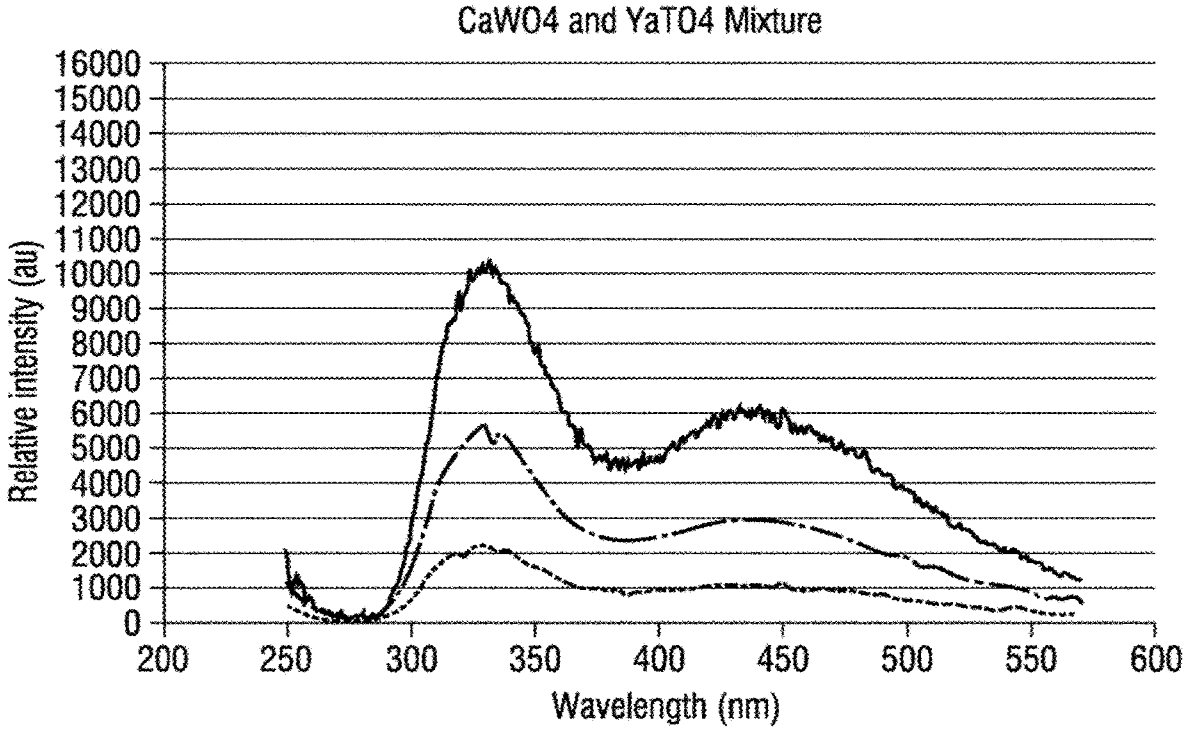
FIG. 6

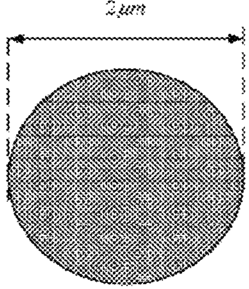
FIG. 11A The silica carrier particle of 2 microns in size
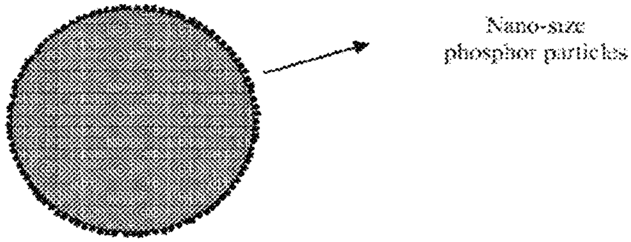
FIG. 11B The silica carrier particle decorated with nano-size particles Irgacure 2959 photoinitiator Irgacure 2959 photoinitiator activated ester

1

ADHESIVE BONDING COMPOSITION AND METHOD OF USE

CROSS REFERENCE TO RELATED APPLICATIONS

The present application is a continuation of U.S. application Ser. No. 16/944,877, filed Jul. 31, 2020, now allowed, which is a continuation of U.S. application Ser. No. 16/515,754, filed Jul. 18, 2019, now U.S. Pat. No. 10,734,353, which is a continuation of U.S. application Ser. No. 15/322,928, filed Dec. 29, 2016, now U.S. Pat. No. 10,410,991, which is a 371 of PCT application no. PCT/US15/38290, filed Jun. 29, 2015, which claims benefit of priority to U.S. provisional application No. 62/018,915, filed Jun. 30, 2014, the entire contents of each of which are hereby incorporated by reference. The present application is related to U.S. application Ser. No. 15/126,834, filed Sep. 16, 2016, now U.S. Pat. No. 10,087,343, which is a 371 of PCT application no. PCT/US15/21307, filed Mar. 17, 2015, the entire contents of each of which are incorporated herein by reference. The present application is also related to U.S. Provisional application Ser. No. 61/955,547, filed Mar. 19, 2014, the entire contents of which is hereby incorporated by reference. The present application is also related to U.S. Provisional application Ser. No. 61/955,131, filed Mar. 18, 2014, the entire contents of which is hereby incorporated by reference. The present application is related to U.S. Provisional application Ser. No. 61/331,990, filed May 6, 2010, and U.S. Provisional application Ser. No. 61/443,019, filed Feb. 15, 2011, the entire contents of each of which are hereby incorporated by reference. The present application is also related to U.S. provisional patent application 61/161,328, filed Mar. 18, 2009; U.S. provisional patent application 61/259,940, filed Nov. 10, 2009; U.S. Provisional Applications Ser. No. 60/954,263, filed Aug. 6, 2007, and 61/030,437, filed Feb. 21, 2008; U.S. application Ser. No. 12/059,484, filed Mar. 31, 2008; U.S. application Ser. No. 11/935,655, filed Nov. 6, 2007; U.S. Provisional Applications Ser. No. 61/042,561, filed Apr. 4, 2008; 61/035,559, filed Mar. 11, 2008; and 61/080,140, filed Jul. 11, 2008; U.S. patent application Ser. No. 12/401,478 filed Mar. 10, 2009; U.S. patent application Ser. No. 11/935,655, filed Nov. 6, 2007; U.S. patent application Ser. No. 12/059,484, filed Mar. 31, 2008; U.S. patent application Ser. No. 12/389,946, filed Feb. 20, 2009; and U.S. patent application Ser. No. 12/417,779, filed Apr. 3,2009, the entire contents of each of which is hereby incorporated by reference. This application is related to U.S. patent application Ser. No. 13/102,277 filed May 6, 2011, the entire contents of which is hereby incorporated by reference. This application is related to U.S. patent application 61/735,754 filed Dec. 11, 2012, the entire contents of which are hereby incorporated by reference.

BACKGROUND OF THE INVENTION

Field of Invention

The invention pertains to materials and methods for polymer curing, particularly adhesive curing and bonding, and more particularly to methods for using energy conversion and photoinitiator chemistries in applications where access to an external light source is not available.

Discussion of the Background

Thermosetting polymers and adhesives are well known and are used for a wide variety of applications. One particularly important application domain is in the field of microelectronics assembly, where thermoset adhesives are used to bond bare die to substrate, establish conductive contacts, and perform various roles in packaging and sealing structures such as glob-top and die-underfill structures. Commercially available materials are formulated to meet various requirements, and in addition to the monomer(s) may contain particulate fillers such as metal, oxides, or dielectric powders, as well as various additives to control thermal conductivity, viscosity and other properties. The materials are typically dispensed as a thixotropic fluid in precise locations, and after all the parts are placed, the entire assembly is heated to a temperature necessary to polymerize the monomers or crosslink resins.

As modern electronic components evolve to smaller sizes, and integrated circuits include ever-smaller features such as ultra-shallow junctions, the permissible thermal budget during assembly continues to decrease. New memory device technologies, for example, incorporate phase-change materials that are temperature sensitive and may need to be assembled using low-temperature processing. Similarly, polymer composites used for dental restorations must be cured without subjecting the patient to high curing temperatures. To address these issues, many photo-curing polymer systems have been developed. In general, these systems employ at least one photoinitiator, which, when exposed to UV light, releases chemical energy to form free radicals or cations to initiate the reaction of the monomers at substantially ambient temperatures.

The clear limitation of conventional photoinitiators is the need to have direct line-of-sight access to a suitable light source. This prevents the use of conventional materials for advanced processes such as multilayer stacks of individual silicon dies, because there is no way to get the UV light into the interior of the stack.

Furthermore, the conventional UV curable adhesives cure from the outside surface of an adhesive bead to the inside of the adhesive bead; and, in most cases curing is accompanied by the formation of a skin. In the present invention curing is more controllable and can proceed across the entire volume of the adhesive bead.

SUMMARY OF THE INVENTION

One object of the present invention is to provide polymer formulations (i.e. monomers, photoinitiators, adhesion promoters, and energy converters) that can be activated (and subsequently cured) by indirect photoinitiation, i.e. in the absence of line-of-sight access to the external energy source.

A further object of the present invention is to provide adhesive compositions that may be cured at ambient temperature and that readily adhere across the interface between the photactivatable resin and the substrate or medium being adhered to.

Another object of the present invention is to provide an adhesion promoter or an adhesive promoting treatment to increase the strength of the resultant bonded complex.

Another object of the present invention is to provide an adhesion promoter or an adhesive promoting treatment to increase the strength of the resultant bonded complex when adhered to a low surface energy substrate.

Another object of the present invention is to provide a flexible sheet adhesive material capable of being polymerized by selected ionizing radiation.

These and other objects and advantages of the invention, either alone or in combinations thereof, have been satisfied by a method of and system for adhesive bonding that comprises the steps of:

a) treating a surface of an element to be bonded to provide an adherent structure including one or more rubber compounds on said surface;
b) placing a polymerizable adhesive composition, including at least one photoinitiator and at least one energy converting material, in contact with the adherent structure and two or more components to be bonded to form an assembly;
c) irradiating the assembly with radiation at a first wavelength, capable of conversion by the at least one energy converting material, preferably a down converting material such as a phosphor, to a second wavelength capable of activating the at least one photoinitiator to produce from the polymerizable adhesive composition a cured adhesive composition; and
d) adhesively joining the two or more components by way of the adherent structure and the cured adhesive composition.

These and other objects and advantages of the invention, either alone or in combinations thereof, have been satisfied by a curable polymer system comprising an adherent structure attached to a low energy surface of an element to be bonded (the surface having a surface energy less than 50 $mJ/m^2$), at least one polymerizable adhesive composition for adhesive attachment to the adherent structure, at least one photoinitiator responsive to a selected wavelength of light, and at least one energy converting material selected to emit the wavelength of light when exposed to an imparted radiation.

These and other objects and advantages of the invention, either alone or in combinations thereof, have been satisfied by an adhesive transfer member comprising a release substrate, one or more rubber compounds disposed on a surface of the release element, and an energy converting material intermixed the one or rubber compounds in the a surface of the release element.

BRIEF DESCRIPTION OF THE FIGURES

Various other objects, features and attendant advantages of the present invention will be more fully appreciated as the same becomes better understood from the following detailed description when considered in connection with the accompanying drawings in which like reference characters designate like or corresponding parts throughout the several views and wherein:

FIG. 2B provides an emission spectrum of a material that emits in the UVB regime, upon irradiation with X-rays.

FIG. 3 provides an emission spectrum of a material that emits in the UVA, UVB, and visible regimes, upon irradiation with X-rays.

FIG. 6 provides emission spectra of a mixture of $CaWO_4$ and $YaTO_4$, upon irradiation with X-rays at intensities of 50, 90, and 130 kvp.

FIGS. 11A and 11B show a representation of a bare silica carrier particle and a silica carrier particle decorated with nano-size phosphor particles, respectively.

DETAILED DESCRIPTION OF THE INVENTION

Figure 1A:
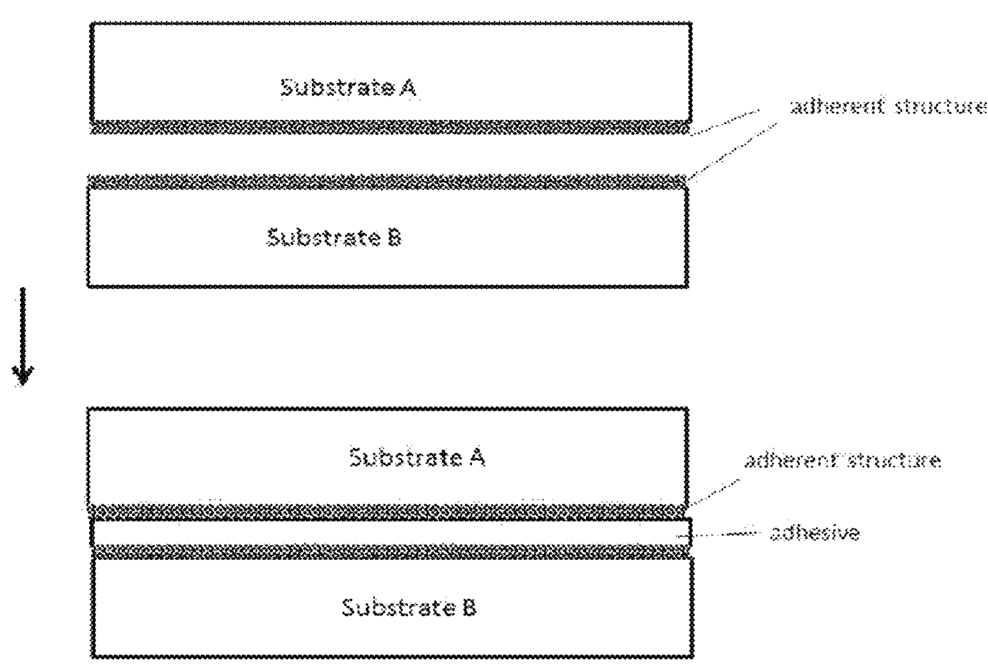
FIG. 1A is a schematic depicting two substrates bonded together using the methods and systems of the present invention.

In one embodiment of this invention, a class of curable adhesives is utilized by the present invention in combination with an adhesion promoter or an adhesion promoting treatment. This class of adhesives has one or more of the following desirable attributes:

a—Cure without line of sight (bond line where the adhesion takes place is internal to structures to be bonded)

b—Cure without depth of penetration limitation (Bond line can be deep inside materials without compromising the cure kinetics)

c—Cure without thermal expansion mismatch (ability to bond at room temp and to avoid compressive and tensile stresses at the bond line)

d—Cure adhesive selectively (only where the adhesive has an energy converting particle does the adhesive form a network; this can be used to generate selective curing geometries)

e—The adhesives have suitable properties (electrical-including dielectric non-conductive to anisotropically semiconductive to conductive, mechanical—rigidity or compliancy (use of a second phase flexibilizer), optical—from transparent to opaque, Acid vs. Base Control—ability to withstand a variety of environments from Inks to aqueous solutions, Adhesive Bond strength of a desirable range)

These attributes make it possible to improve on existing adhesive curing applications. The present invention's adhesive curing and bonding leads to novel assemblies and processing methods that are advantageous as compared to the state of the art.

In one embodiment, the present invention provides a way to bond materials at ambient temperature using photoinitiator chemistries that convert absorbed light energy (typically UV light) to chemical energy in the form of initiating species such as free radicals or cations and thereby initiate a polymerization reaction in a monomer-containing adhesive. In another aspect, the invention provides a way to perform photo-initiation in situations where the area to be bonded is not accessible to an external light source.

According to one embodiment of the invention, the adhesive composition comprises: an organic vehicle comprising at least one polymerizable monomer; at least one photoinitiator responsive to a selected wavelength of light; and, at least one energy converting material selected to emit the selected wavelength of light when exposed to a selected imparted radiation.

One issue associated with the bonding of two substrates together is that, while the photo initiated curing can partially or completely cure the polymerizable adhesive composition, the adhesions of those materials to the respective substrates being bonded together requires additional selection of structures or materials which have the capacity to bond to either substrate.

According one embodiment of the invention, the method of adhesive bonding comprises the steps of: a) treating a surface of an element to be bonded to provide an adherent structure on said surface; b) placing a polymerizable adhesive composition, including at least one photoinitiator and at least one energy converting material, in contact with the adherent structure and two or more components to be bonded to form an assembly; c) irradiating the assembly with radiation at a first wavelength, capable of conversion by the at least one energy converting material, preferably a down converting material such as a phosphor, to a second wavelength capable of activating the at least one photoinitiator to produce from the polymerizable adhesive composition a cured adhesive composition; and d) adhesively joining the and two or more components by way of the adherent structure and the cured adhesive composition.

In one embodiment, the adhesive composition includes curable polymer system comprising an adherent structure attached to a low energy surface of an element to be bonded (the surface having a surface energy less than 50 mJ/m$^2$), at least one polymerizable adhesive composition for adhesive attachment to the adherent structure, at least one photoinitiator responsive to a selected wavelength of light, and at least one energy converting material selected to emit the wavelength of light when exposed to an imparted radiation.

In one embodiment, the adhesive composition includes an adhesive transfer member comprising a release substrate, one or more rubber compounds disposed on a surface of the release element, and an energy converting material intermixed said one or rubber compounds in the a surface of the release element.

The methods and systems described herein as part of the invention, these methods and systems permit the at least one energy converting material to be either a downconverting material, and upconverting material or a combination of thereof. In one aspect of the invention, the downconverting material can comprise inorganic particulates selected from the group consisting of: metal oxides; metal sulfides; doped metal oxides; and mixed metal chalcogenides. In one aspect of the invention, the downconverting material can comprise at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS and alkali lead silicate including compositions of $SiO_2$, $B_2O_3$, $Na_2O$, $K_2O$, PbO, MgO, or Ag, and combinations or alloys or layers thereof. In one aspect of the invention, the downconverting material can include a dopant including at least one of Er, Eu, Yb, Tm, Nd, Mn Tb, Ce, Y, U, Pr, La, Gd and other rare-earth species or a combination thereof. The dopant can be included at a concentration of 0.01%-50% by mol concentration.

In one aspect of the invention, the downconverting material can comprise materials such as ZnSeS:Cu, Ag, Ce, Tb; CaS:Ce,Sm; $La_2O_2S$: Tb; $Y_2O_2S$: Tb; $Gd_2O_2S$:Pr, Ce, F; $LaPO_4$. In other aspects of the invention, the downconverting material can comprise phosphors such as ZnS: Ag and ZnS: Cu, Pb. In other aspects of the invention, the downconverting material can be alloys of the ZnSeS family doped with other metas. For example, suitable materials include $ZnSe_xS_y$: Cu, Ag, Ce, Tb, where the following x, y values and intermediate values are acceptable: x: y; respectively 0:1; 0.1:0.9; 0.2:0.8; 0.3:0.7; 0.4:0.6; 0.5:0.5; 0.6:0.4; 0.7:0.3; 0.8:0.2; 0.9:0.1; and 1.0:0.0.

In other aspects of the invention, the downconverting material can be materials such as sodium yttrium fluoride ($NaYF_4$), lanthanum fluoride ($LaF_3$), lanthanum oxysulfide ($La_2O_2S$), yttrium oxysulfide ($Y_2O_2S$), yttrium fluoride ($YF_3$), yttrium gallate, yttrium aluminum garnet (YAG), gadolinium fluoride ($GdF_3$), barium yttrium fluoride ($BaYF_5$, $BaY_2F_8$), gadolinium oxysulfide ($Gd_2O_2S$), calcium tungstate ($CaWO_4$), yttrium oxide: terbium ($Yt_2O_3Tb$), gadolinium oxysulphide: europium ($Gd_2O2S$:Eu), lanthanum oxysulphide: europium ($La_2O_2S$:Eu), and gadolinium oxysulphide: promethium, cerium, fluorine ($Gd_2O_2S$:Pr,Ce,F), $YPO_4$:Nd, $LaPO_4$:Pr, (Ca,Mg)$SO_4$:Pb, $YBO_3$:Pr, $Y_2SiO_5$:Pr, $Y_2Si_2O_7$:Pr, $SrLi_7SiO_4$:Pr,Na, and $CaLi_2SiO_4$:Pr.

In these methods and systems, the wavelength of radiation capable of conversion by the at least one energy converting material can be at least one of X-rays, electron beams, deep UV light (e.g., 160-400 nm for down conversion). In these methods and systems, the wavelength of radiation capable of conversion by the at least one energy converting material can be near infrared (e.g., for up conversion).

In these methods and systems, down converting and/or upconverting materials (such as those described herein) can be included in an organic vehicle which is cured by activation of a photoinitiator contained therein or by vulcanization of a sulfur containing compound therein.

In these methods and systems, the organic vehicle (e.g., a polymerizable adhesive composition) can comprise a monomer forming a thermoset resin. The thermoset resin can be selected from the group consisting of: acrylics, phenolics, urethanes, epoxies, styrenes, and silicones. In these methods and systems, the at least one photoinitiator can be selected from the group consisting of: benzoin ethers, benzil ketals, α-dialkoxyacetophenones, α-aminoalkylphenones, acylphosphine oxides, benzophenones/amines, thioxanthones/amines, and titanocenes. In these methods and systems, the polymerizable adhesive composition further comprises inorganic particulates selected from the group consisting of: metals and metal alloys, ceramics and dielectrics, and metal-coated polymers. The polymerizable adhesive composition can further comprise an organic component selected from the group consisting of: solvents, viscosity modifiers, surfactants, dispersants, and plasticizers.

In these methods and systems, the adherent structure can be provided by way of a solution containing natural or synthetic rubber (i.e., rubber-like) compounds which are disposed on the surface of an element to be bonded, the solvent can be removed (e.g., by evaporation), and the rubber compounds can be polymerized.

Natural Rubber, Isoprene and Poly-Isoprene:

Natural rubber has a long fatigue life and high strength even without reinforcing fillers. It can be used to approximately 100° C., and sometimes above. It can maintain flexibility down to −60° C. if compounded for the purpose. It has suitable creep and stress relaxation resistance and is low cost.

Furthermore, natural rubber as utilized in various embodiments of this invention includes milled grades of the natural rubber. Natural rubber as shown above can be a naturally-occurring polyisoprene elastomer recovered from the sap of rubber trees (hevea *brasiliensis*) and certain other trees and plants. Natural rubber as a commodity can generally be supplied in solid form or as alkali-stabilized latex.

In one embodiment of this invention, the "rubber-like" compounds can include isoprene. Isoprene can be derived from many plants. Isoprene, or 2-methyl-1,3-butadiene, is a common organic compound used across a wide range of industrial applications and can be found with the following formula $CH_2—C(CH_3)CH═CH_2$. Isoprene has the advantage of being a colorless volatile liquid and therefore can be blended with various other compounds that are compatible with its miscibility characteristics.

An example of polyisoprene is shown below, where a poly cis-1,4 isoprene is shown as the building block of a longer chain.

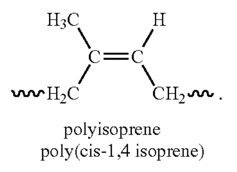

polyisoprene
poly(cis-1,4 isoprene)

Once the longer chain is crosslinked, the crosslinked material develops elastomeric properties. The elongation of the material depends on the number of crosslinks that are imparted to form the network. When under a tensile stress, the networked material can stretched. When the stress is removed; the material fully recovers (as long as it has been stressed below its non elastic deformation threshold).

For solvent-based adhesives or primers utilized in various embodiments of this invention, the solid natural rubber is usually masticated on a two-roll mill prior to being dissolved in hydrocarbon solvents. Although it is possible to prepare solutions of unmilled natural rubber, milling reduces gels, thereby affecting viscosity, stability, uniformity and speed of dissolving. Solvents such as toluene can and have been used to dissolve the natural rubber compounds into a mixture that which can be applied to the surfaces of substrate a and substrate b.

Natural rubber can be utilized in various embodiments of this invention where its bonds are cross-linked by the assistance of ultraviolet light generated from at least one or more of down converting or up converting materials (such as the ones described above). The natural rubber formulations in the present invention (prior to inclusion of energy modulation agents) then follows, for example, conventional formulations and preparations such as those described in "UV-curable natural rubbers such as those described in "Ultraviolet curing of acrylated liquid natural rubber for surface coating application," Songklanakarin J. Sci. Technol. 31 (1), 49-55, January-February 2009, the entire contents of which are incorporated herein by reference.

Accordingly, in one aspect of the present invention, ultraviolet light generated from at least one or more of down converting or up converting materials (such as the ones described above) can be used to cross-link the following liquid natural rubber (LNR) samples:

1) The liquid natural rubber (LNR) obtained by degradation of 20% DRC natural rubber latex with hydrogen peroxide of 0.5 phr and cobalt acetylacetonate of 1 phr by means of mechanical stirrer in a round bottom flask at 65° C. for 72 hrs. LNR was precipitated in methanol and then dried in a hot oven at 40° C.
2) Epoxidized liquid natural rubber (ELNR) obtained from 10% w/v LNR in toluene. Formic acid and hydrogen peroxide in ratio of 30:60 (mol % with respect to isoprene unit) added drop wise and stirred at 50° C. for 2 hrs. ELNR was then washed in 5.0% $NaHCO_3$ solution, precipitated in methanol and dried at 40° C.

In one aspect of the present invention, ultraviolet light generated from at least one or more of down converting or up converting materials (such as the ones described above) cross links a rubber prepared from the liquid natural rubber compounds noted above, and/or other liquid natural rubber compounds. For example, the ultraviolet light generated from at least one or more of down converting or up converting materials (such as the ones described above) can serve to cross link a surface coating material obtained by the mixing of LNR with 80 phr tripropylene glycol diacrylate and 10 phr Irgacure 651.

Moreover, it has been discovered that natural and synthetic rubber compounds can be directly activated by x-ray flux to bond and be used as the interface material between the respective substrates and the cured polymers. Such natural and synthetic rubber compounds can be prepared in a fine powder form, applied to the surfaces, and then exposed to x-ray energy for example energy at 320 kVp, 160kVp or 106 kVp. Higher or lower kVp energies can be used in various embodiments of the invention. X-ray energies ranging up to 1-10 MeV can be envisioned if necessary. However, lower x-ray energies are preferred, both from an exposure standpoint, and from the standpoint of avoiding detrimental effects as side reactions to the high energy x-rays. In one embodiment of the invention, MVp energies are used to penetrate more deeply into the object being cured. In one embodiment of the invention, 10-100 kVp energies are used where the object being cured is on a surface of an article or relatively close to the surface or inside of a low mass number material such as a plastic. In general, the selection of the kVp will depend on a number of factors including the geometry and construction of the material being cured, the x-ray dose, and the rate of production desired.

In one embodiment of the invention, the rubber-containing bonding compounds (upon being exposed to this x-ray flux) have shown the capacity to bond to the low energy substrates. Energy modulation agents such as the down converters and upconverter described herein are not necessarily needed. In one embodiment of the invention, once these rubber compounds have been bonded to the respective substrates, then one of the photo initiated curing processes described below can be used to form a robust adhesion of substrates through the primer interface and the intermediate cured polymer resin between the substrates. In one embodiment of the invention, these rubber compounds bonded to the respective substrates can be directly. bonded together without necessarily using the intermediate cured polymer resin between the substrates.

Accordingly, the natural rubber compounds provide a double-bond backbone which can be activated by x-ray alone or either by UV light generated by x-ray phosphors (discussed below) which emit UV light upon exposure to x-rays or an e-beam flux. When using down converters the UV light is used to specifically open a double bond in the natural rubbers.

Accordingly, in the methods and systems of this invention, the polymerization of disposed rubber compounds on the surface of the element to be bonded can be accomplished by exposing the rubber compounds to at least one of x-rays, e-beam, or UV flux. While not tied to any particular theory, the exposing can break or "open up" double bonds in the rubber compounds, followed in turn by bonding of the rubber compounds to the surface of the element to be bonded. With this approach, the solution is provided with a concentration of the natural or synthetic rubber compounds between 33% and 45%. Other concentrations are also possible.

With regard to e-bean activation, electrons of an energy range of 80-300 keV, for example, can break chemical bonds and generate ions. The ions then transform themselves into free radicals, which then initiate polymerization. Electron beams having an energy of 80-300 keV capable of curing even pigmented resins of about 400 μm as well as clear coatings of up to 500 μm stability for the cured coatings. The present invention is not limited to this range of e-beam energies. Other (in particular) higher energy e-beams can be used. Prior rubber compound vulcanization studies have reported the use of e-beam induced vulcanization from electrons out of a 1.8 MeV accelerator with an output power of 10.8 kW.

The paper entitled "Comparison between electron-beam and chemical crosslinking of silicone rubber" in Nuclear Instruments and Methods in Physics Research B 243 (206) 354-358, the entire contents of which are incorporated herein by reference, describes silicone rubber compounds being irradiated by electron beams in the absence of chemical reagents. The silicone rubber compounds described therein are useful in various embodiments of this invention where x-rays, e-beam, or UV flux (from for example the down converters or up converters described herein) initiate chemical crosslinking without necessarily the need to add chemical reagents to promote the crosslinking.

The following is a list of rubber compounds suitable for the present invention. (The present invention is not limited to this list.) The list includes four kinds of rubber samples: NR (natural rubber), EPDM (ethylene-propylene terpolymer) rubber, EVA (ethylene vinyl acetate) rubber and CPE (chlorinated polyethylene).

NR rubber:
- NR+0 phr TMPT, containing 62,70% NR and 37,30% filler;
- NR+3 phr TMPT, containing 61,52% NR, 1,85% TMPT and 36,63% filler;
- NR+6 phr TMPT, containing 60,42% NR, 3,63% TMPT and 35,95% filler;
- NR+9 phr TMPT, containing 59,35% NR, 5,34% TMPT and 35,31% filler.

EPDM Rubber:
- EPDM+0 phr TMPT, containing 62,70% EPDM and 37,30% filler;
- EPDM+3 phr TMPT, containing 61,52% EPDM, 1,85% TMPT and 36,63% filler;
- EPDM+6 phr TMPT, containing 60,42% EPDM, 3,63% TMPT and 35,95% filler;
- EPDM+9 phr TMPT, containing 59,35% EPDM, 5,34% TMPT and 35,31% filler.
- EPDM+12 phr TMPT, containing 58,31% EPDM, 7,00% TMPT and 34,69% filler.

EVA Rubber:
- EV A+0 phr T AC, containing 62,70% EVA and 37,30% filler;
- EVA+3 phr T AC, containing 61,52% EVA, 1,85% T AC and 36,63% filler;
- EVA+6 phr TAC, containing 60,42% EVA, 3,63% TAC and 35,95% filler;
- EVA+9 phr T AC, containing 59,3 5% EVA, 5,34% T AC and 35,31% filler.

CPE Rubber:
- CPE+0 phr TAC, containing 62,70% CPE and 37,30% filler;
- CPE+3 phr TAC, containing 61,52% CPE, 1,85% TAC and 36,63% filler;
- CPE+6 phr T AC, containing 60,42% CPE, 3,63% T AC and 35,95% filler;
- CPE+9 phr T AC, containing 59,35% CPE, 5,34% T AC and 35,31% filler.

In one embodiment of the present invention, blended rubber compounds such as for example acrylonitrile butadiene rubber-poly vinyl chloride (NBR-PVC) blends can be exposed to e-beams to affect a cure. Energy modulation agents such as the down converters and upconverter described herein can be included but are not necessarily needed. Dose rates from 25 to 150 kGy are effective in curing these blends.

Blends of acrylonitrile butadiene rubber (NBR) and poly vinyl chloride (PVC), with a density of 0.7-1.2 g/cm$^3$, are commercially available. Acrylonitrile butadiene rubber-poly vinyl chloride (NBR-PVC) is a miscible physical mixture of commercial importance. The NBR can act as a permanent plasticizer for PVC. The presence of PVC improves aging resistance of NBR as both PVC and NBR are polar and blending NBR with PVC increases the compatibility. The aim in blending plastic and rubber is to improve the physical, thermal, and mechanical properties as well as to modify the processing characteristics and cost reduction of the final product.

Crosslinking and Vulcanization:

The formation of a network in a "rubbery" material can be done using various methods. When dealing with a "rubbery" material, the most common way of forming a network between chains is called vulcanization.

Vulcanization of rubber is well known and can be generally defined as the formation of crosslinks between the polymeric chains using sulfur, heat, curing agents, accelerators and other sensitizing chemistries.

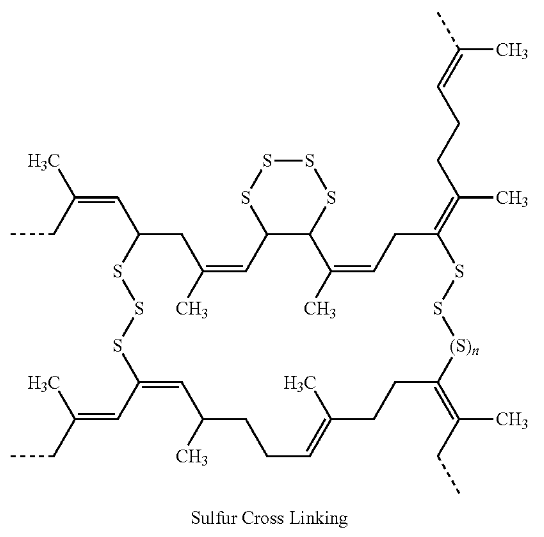

Sulfur Cross Linking

Vulcanization is an example of cross-linking. The schematic above is an illustration of two "polymer chains" (a lower chain and an upper chain) cross-linked after the vulcanization of natural rubber with sulfur (n=0, 1, 2, 3 . . . ).

Alternatively, the crosslinks between rubber chains can be achieved using peroxides, UV light, electron beam, microwave, etc. The use of peroxides as crosslinking agents is well known and offers the potential to carry out the crosslinking process at lower temperatures. In fact all low temperature process alternatives have the potential of reducing degradation by oxidation and limit rubber blooming when compared to the standard sulfur based vulcanization. However, the properties developed with standard vulcanization are considered superior to those developed with alternate methods. Commercial products such as ethylene-propylene rubber (EPM), fluoro-elastomers (FKM) can undergo peroxide cure to undergo crosslinks formation between chains and result in the formation of a stable network with good properties. This crosslinking is done via the covalent carbon-carbon bonds. Both unsaturated and saturated polymers can be processed using peroxide curing methods. The mechanical properties and thermal stability that are obtained are directly related to the number of crosslinking taking place in the network. Higher crosslink density would result in more stable rubbery compounds.

In the present invention, peroxide curable rubbers were achieved using activation through a down conversion from X-Ray energy to UV light using phosphor materials (and other energy modulation agents both down conversion and up conversion described herein). One of the advantages of the present invention is that the rubbers can be activated with no direct line of site. This allows the rubber doped with peroxide generators and the phosphors to remain un-reactive until such a time that X-Ray activation is performed. Incidentally, the same phosphors can convert energy from an Electron Beam (EB) to UV energy suitable for peroxide activation and initiation of the curing. A further advantage of this method is the low energies required to carry out the curing. The X-Ray energy/dose and the e-beam energy/dose used for activation can be range from 20 mGy to 3 Gy as opposed to standard EB ionization that can require up to 10 kGy.

In one embodiment of the present invention, the natural and synthetic rubber compounds and/or the blends noted above are applied to surface and then vulcanized to form a cured product bonded to the substrate. Vulcanization may be considered to have occurred when two radicals produced on neighboring polymer units recombine. These radicals can produced by a chemical agent, such as peroxide or sulfur. In general, vulcanization is a process for converting rubber or related polymers into more durable materials via the addition of sulfur or other equivalent curatives or accelerators. These additives modify the polymer by forming crosslinks (or bridges) between individual polymer chains (as shown above). Vulcanized materials are typically less sticky and have superior mechanical properties. In one embodiment of the present invention, radiation, such as electron beam or gamma. radiation can be used to cause vulcanization of polymers. These and other vulcanization techniques can be used in the present invention. As used herein, vulcanization is the process of converting natural or synthetic rubbers from their natural state into a more robust durable state where the natural or synthetic rubbers are cross linked.

In one embodiment of the present invention, the interaction of electron beam radiation with a polymer results in the formation of free radicals by dissociation of the excited state or by ion molecular reaction. The vulcanization reaction occurs during the irradiation of the polymer. Coagents, such as ethylene glycol dimethacrylate (EDMA), trimethylol propane trimethacrylate (TMPTMA), or trim ethyl-propane trimethacrylate (TPTA) can be used to reduce the dose required for cross-linking.

In one embodiment of the present invention, the natural and synthetic rubber compounds and/or the blends noted above can also be activated by UV light emitted for example from a downconverter converting x-rays (or e-beams) into UV light to cure or otherwise vulcanize the natural and synthetic rubber compounds and/or the blends noted above. In one embodiment of the present invention, the natural and synthetic rubber compounds and/or the blends noted above can also be activated by visible light emitted for example from a downconverter converting x-ray or e-beams into visible light or for example from an upnconverter converting infrared light into visible light to cure or otherwise vulcanize the natural and synthetic rubber compounds and/or the blends noted above.

One of the most common agents used for vulcanization is sulfur. Sulfur, by itself, is a slow vulcanizing agent and does not vulcanize synthetic polyolefins. Even with natural rubber, large amounts of sulfur, as well as high temperatures and long heating periods are necessary. Vulcanization accelerators are used including activators like zinc oxide and stearic acid. The accelerators and activators are catalysts. An additional level of control is achieved by retarding agents that inhibit vulcanization until some optimal time or temperature.

In one embodiment of the present invention, vulcanization is achieved by the activation of sulfur-containing compounds added to the polymerizable adhesive compositions. The sulfur-containing compounds can themselves by phosphors and can be activated by UV light or directly by x-ray or electron beam exposure. While not bound to a particular theory, upon activation (i.e., exposure to UV light or direct exposure to x-rays or electron beams or other high energy particles), free radicals are generated which serve to cross link the natural or synthetic rubber compounds.

More specifically, in one embodiment of this invention, a low temperature sulfur based crosslinking occurs. In this particular case, natural rubber is mixed with a media that undergoes a partial degradation under X-Ray to release a substantial level of sulfur. Once the sulfur is released between the polyisoprene chains, it can be made to react further in the presence of X-Ray or EB energy. In the case the chemical reaction can be carried out under thermal heat or not. Higher temperatures were found to accelerate the curing. However, even in the presence of room temperature, the curing is enhanced when X-Ray of EB energy is supplied to the material undergoing the reaction. The chemistries employed can remain partially cured for days and accelerated toward full cure by X-Ray energy when needed. This is advantageous from a manufacturing stand point since production line stoppage can take place and work in process can be maintained in a queue until such time that X-Ray or EB energy is applied to the materials.

This aspect of the present invention reduces the amount of energy required to obtain X-Ray and/or EB curing. This is very useful in view of the fact that radiation curing has limited adoption in the manufacturing environment due to the high level of energies required and due to the high cost of radiation equipment capable of delivering high levels of energy. By reducing the energy level required, the present invention can be utilized in more industrial applications than previously considered possible.

X-Ray Curable Rubber Containing Sulfur Chemistry:

The compounded rubbers in the present invention included in one example, Cake Rubber (that has undergone a mastication process consisting of shear through a milling machine), a Tackifying resin (C5 & C9 resins), a Wood Rosin (turpine based short chain), Kraton (a synthetic polymer) and Xylene (a solvent). These components were mixed and prepared to form a rubber base. The prepared rubber based was then used to form a curable rubber. The curable rubber in this case was formed by adding Iron Sulfate hydrated 10:1 in water to the rubber base. Eight grams of the rubber base was used to which 0.25 grams of the hydrated Iron Sulfate was added, followed by the addition of 0.25 grams of IRGACURE 250 (which contains an iodonium salt). See attached BASF data sheet. Furthermore, one gram of a sulfur containing phosphor was added. Phosphors such as CaS phosphor and/or ZnSeS are suitable. The mixture was then stirred and allowed to homogenize.

0.5 grams was applied to a silicone treated Mylar film to cover a surface area of 1 in by 4 in. The rubber mixture was then flattened to have a thickness of about 1 mm. The Mylar containing this rubber pattern was allowed to dry in air or under 60° C. heat. The solvent was removed in less than 10 minutes, and the rubber coupon on the Mylar firm was dried. At this stage the rubber coupon is very tacky but malleable.

The Mylar film was removed from the hot plate. The rubber coupon was aligned with a low energy substrate. The rubber coupon and the low energy substrate were pressed together to make intimate contact. The Mylar film was then removed from the rubber coupon and then rubber coupon was therefore left in contact and on top of the low energy substrate. The low energy substrate was unprimed and yet the tackiness of the rubber coupon was good enough to provide enough mechanical interlocking to hold the substrates in contact. Another substrate was then placed on top of the rubber coupons to form a sandwich where the rubber coupon was maintained under pressure.

The assembly formed by the two substrates sandwiching the rubber coupon was then exposed to X-Ray energy. A total of five such assemblies were exposed to X-Ray energy, and a total of three such assemblies were prepared but not exposed to X-Ray energy. The X-Ray energy exposure consist of 180 sec under energy produced using 320 kVp, 10 mA in a Precision X-Ray machine. The assemblies were then tested for peel strength.

This was done by splitting one end of the assembly apart. About half an inch (0.5 in) was slices apart at the join line where the rubber coupon is located. One end of the low energy substrate was attached to a fix location while the end of the second substrate was attached to a five pound weight. In this configuration the rubber coupon was subjected to peel (which is a known test in the industry). The three assemblies that were not processed under X-Ray were also tested for peel. The elapsed time for the five pound weight to peel the three and half in length of the bonded assembly was then measure. The faster the time to rip through the joint the weaker is the rubber coupon. The longer it takes the weight to fall the more crosslinks have formed and the more indication of curing has taken place. The average time for the five pound weight to fall for the three assemblies that were not processed under X-Ray was 2 seconds. The average time for the five pound weight to fall for the five assemblies that were processed under X-Ray was three and half minutes. This indicated that crosslinking is taking place.

X-Ray Curable Rubber Containing Sulfur Chemistry as Well as Peroxide:

Another category forming a rubber base chemistry was prepared using the mixture described above as well as the inclusion of additional agents to accelerate the cure and was found to be effective in networking the rubber coupon forming the joint. In this case, a chain transfer agent (mercaptopopinate) was added. Also, the rubber base included a trifunctional monomer. Also, the addition of cobalt-acetate or copper-naphthenate promotes the kinetics.

In this case, the cure can proceed with the sulfur-vulcanization as well as a peroxide based curing. Assemblies have a peel time of close to five minutes were made which indicate that the formation of crosslink of the rubber.

Multifunctional monomers (MFM) can be added to enhance the properties various chemistries can be used. MFM are more important in the case of the peroxide curable rubbers. Multi-functional agents which can be added to the mixture are organic molecules with a high reactivity to free radicals. A tri-functional monomer as part of the rubber mix for either the peroxide cure or for an addition to the Natural Rubber cured with sulfur under X-Ray.

In one embodiment of this invention, multifunctional co-agents such as described in Chapter 1 of "Aspects Regarding Radiation Crosslinking of Elastomers," by Manaila et al, are suitable for the present invention. The "Aspects Regarding Radiation Crosslinking of Elastomers," article is attached, and the contents of which are incorporated herein by reference in entirety. Multifunctional co-agents can be classified in two groups: Type I and Type II co-agents.

Type I: Addition and hydrogen abstraction reactions: these co-agents consist of rather polar molecules with a low molecular weight and activated double bonds. Their main characteristic is that they are highly reactive towards radicals, so scorch takes place very fast, which sometimes can be a disadvantage. By using this kind of coagents not only the rate of cure is increased but also the crosslink density or state of cure. A disadvantage that may be present when using this type of co-agents is that, due to polarity, the compatibility of these co-agents with the polymer matrix is limited. Some examples of Type I co-agents are: acrylates, methacrylates, bismaleimides and zinc salts.

Type II: Addition reactions: these co-agents are, in general, less polar molecules, which form more stable free radicals. The use of these co-agents leads to an increase in crosslink density but unlike Type I, Type II co-agents do not typically increase the cure rate. Due to their low polarity, Type II co-agents have a good compatibility with many elastomers. Some examples are: high-vinyl 1,2-polybutadiene, divinylbenzene, allyl esters of cyanurates, isocyanurates and sulphur.

One liquid rubber compound that successfully cured using peroxide chemistry was Hypro 1300 X43 VTBN-liquid rubber (methacrylate terminated butadiene-acrylonitrile). Two chemistries were prepared as follows. The first chemistry was prepared with Hypro 1300 80%, Dipropylene glycol diacrylate 14%; 6% TPO (thermoplastic polyolefin). The second chemistry was prepared using the following mixture of Hypro 1300 80%, Pentaerythritol tetraacrylate (PETA) 14%; 6% TPO. To both of these chemistries were added a LaOBr Phosphor for activating peroxide based curing. These chemistries were effective in curing various high energy substrates; however, these chemistries were not as compatible with the low energy substrates and therefore did not wet the surface as well as the other examples evaluated.

Additional agents can be added to accelerate the cure. An example of such accelerator is QDO (Quinone Dioxime) from Lord Corporation. QDO is a non-sulfur vulcanizing agent that can be added to synthetic elastomers to accelerate the curing kinetics.

The Formation of Adherent Structures:

FIG. 1A shows two substrates where an adherent structure has been formed on the surfaces thereof. A variety of adherent structures are described elsewhere, but for the purpose of illustration, the adherent structure in FIG. 1A can be considered by way of an example to be the cured or vulcanized natural and synthetic rubber compounds and/or the blends noted above. Once the adherent structure has been formed, the polymerizable adhesive compositions noted above and described in more detail in other sections of this specification can be applied in between the substrates, the substrates pressed together, and the polymerizable adhesive composition cured to form the structure in the lower half of FIG. 1A.

In these methods and systems, the surface of the element to be bonded can comprise a low energy material having a surface energy of less than 50 $mJ/m^2$, less than 40 $mJ/m^2$, or less than 30 $mJ/m^2$.

In these methods and systems, the surface of the element to be bonded (and optionally the interior) can comprise at least one of a polytetrafluoroethylene, a poly(perfluoroalkylacrylate), a polystyrene, a polyacrylate, a poly(methyl methacrylate), a poly(dimethylsiloxane), a polyethylene, a polychlorotrifluoroethylene, a polypropylene, a polyvinyl chloride, a polyvinyl fluoride, a polyvinylidenedichloride, a polyvinylidenedifluoride, a polyacrylamide, a polyethylene terephthalate, a poly(6-aminocoproicacid), and a poly(11-aminoundecaroicacid). In these methods and systems, the surface of the element to be bonded (and optionally the interior) can comprise at least one of a silicone and a poly(dimethyl siloxane).

In one embodiment of this invention, besides priming the substrates as described above, other processes can be used such as a plasma etch (for example an air plasma which would be cost effective) and or a chemical etch to form the adherent structures noted above. Accordingly, in various methods and systems of this invention, the adherent structure can be formed onto or into the surface of the element to be bonded by modifying the surface of the element to increase a surface energy thereof. In these methods and systems, the adherent structure can be formed onto or into the surface of the element to be bonded by exposing the surface to a plasma treatment. The plasma treatment can be at reduced pressures or at or above atmospheric pressure conditions. In these methods and systems, the adherent structure can be formed onto or into the surface of the element to be bonded by exposing the surface to a chemical etchant.

In these various methods and systems, the adherent structure can be formed onto or into the surface of the element to be bonded by applying a primer to said surface of the element to be bonded. The primer can comprise a two-component urethane-based primer. The two-component urethane-based primer can be a moisture activated primer.

One issue associated with the use of inorganic phosphors is that these phosphors tend to be fairly large in dimension on the order of microns. In one embodiment of the invention, luminescing organic pigments are used as though organic phosphors described above. These situations of the organic phosphors are much smaller in size than the inorganic phosphors noted above. Accordingly, such phosphors can be integrally mixed into the polymerizable adhesive composition or into the rubber-containing bonding compounds. This organic or "molecular" type of phosphor then allows for the concentration of phosphor in the curing and bonding layers to be minimized relative to that which will be necessary for the larger organic size phosphors. Accordingly the cross linking between the phosphors will generate a more robust and complete chemical bond between substrates.

In the various methods and systems of this invention, the at least one energy converting material can be an organic phosphor. The at least one photoinitiator is configured to be activated by emitted light from one or more of organic phosphors. The organic phosphor can be at least one of anthracene, sulfoflavine, fluorescein, eosin, polyvinyltoluene, styrene, fluors, and rhodamine. The organic phosphor is linked to the at least one photoinitiator.

In one embodiment of this invention, primers (as noted above) can be applied to those substances (for example the commercially available primer known as from ATPRIME® from Reichhold) which involves a two part primer part A and part B. The present invention has found this primer to be particularly advantageous for the bonding together of dissimilar substrates. Any convention primer can be used as desired. Preferred primers that can be used in the present invention include, but are not limited to, silane/silanol functional materials, polymeric isocyanates, energy curable polymers, solvent based epoxy functional, solvent based synthetic rubber, ethyl acetates, chlorinated polymers, hydroxyl terminated polymers, isocyanate terminated oligomers, amine functional polymers, metal titanates, phosphate and phosphonate esters, metal salts, and combinations thereof.

In one embodiment of the invention fluorescent organic molecules can be attached to different reaction sites and serve as the photo initiators. In one embodiment, these fluorescent organic molecules can be rolled into a polymer chain. The polymer chain can support side group attachments or chain terminations and can be a part of a network including the fluorescent organic molecules and the polymerizable adhesive compositions.

In one embodiment of this invention, the substrate can be considered a textile or a fabric. The fabric can then include a set of fibers that includes the fluorescent molecules woven into a thread of the textile. The interweaving or threading of the fluorescent organic molecules through the textile allows for activation of the polymerizable adhesive composition disposed at the interface between the textile. The infiltration of polymerizable adhesive composition into the interstices of the textile itself promoted the bonding and adherence the 15 textile to the opposing substrate.

Figure 1B:
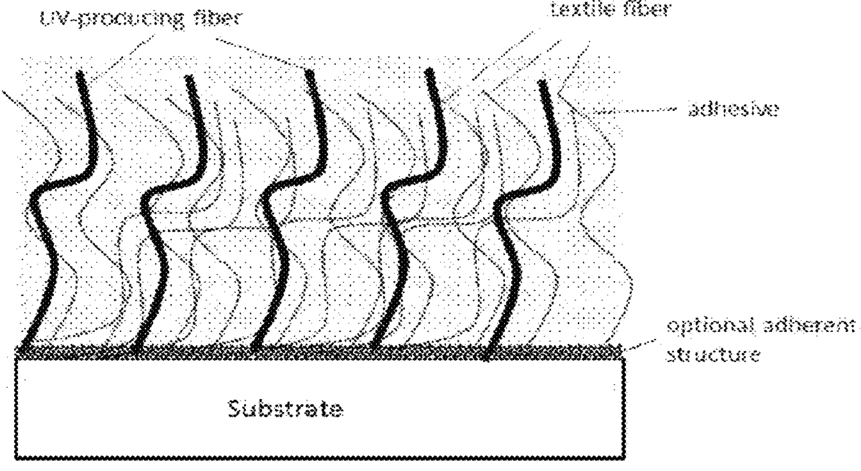
FIG. 1B is a schematic depicting a textile bonded to a substrate using the methods and systems of the present invention.

FIG. 1B is a schematic depicting a textile bonded to a substrate by way of UV fibers in the textile activating a polymerizable adhesive composition which had previously been supplied. As shown in FIG. 1B, adherent structures on the surface of the substrate can be used if needed.

In the present invention, the energy converting material can be any material that can convert the imparted energy either into higher energy photons ("upconverting material") or into lower energy photons ("downconverting material"). Suitable upconverting materials and downconverting materials are described in U.S. provisional patent application 61/161,328, filed Mar. 18, 2009; U.S. provisional patent application 61/259,940, filed Nov. 10, 2009; U.S. Provisional Applications Ser. No. 60/954,263, filed Aug. 6, 2007, and 61/030,437, filed Feb. 21, 2008; U.S. application Ser. No. 12/059,484, filed Mar. 31, 2008; U.S. application Ser. No. 11/935,655, filed Nov. 6, 2007; U.S. Provisional Applications Ser. No. 61/042,561, filed Apr. 4, 2008; 61/035,559, filed Mar. 11, 2008; and 61/080,140, filed Jul. 11, 2008; U.S. patent application Ser. No. 12/401,478 filed Mar. 10, 2009; U.S. patent application Ser. No. 11/935,655, filed Nov. 6, 2007; U.S. patent application Ser. No. 12/059,484, filed Mar. 31, 2008; U.S. patent application Ser. No. 12/389,946, filed Feb. 20, 2009; and U.S. patent application Ser. No. 12/417,779, filed Apr. 3,2009, the entire disclosures of each of which are hereby incorporated by reference. The imparted energy can be any desired energy as needed to penetrate the material between the imparted energy source and the adhesive composition itself. For example, the imparted energy can be near-infrared (NIR), with an upconverting material to convert the imparted energy into UV photons that can be absorbed by the photoinitiator used. Preferably, the imparted energy is X-ray energy, with the energy converting material being a downconverting material, such as a phosphor or scintillator. For convenience, the following discussion will refer to downconverting materials and the use of X-rays as the imparted energy. However, this is not intended to be limiting of the present invention and any desired combination of imparted energy and energy converting material can be used, so long as the photons generated by the energy converting material are capable of being absorbed by the photoinitiator.

In an associated method, without limitation: the polymerizable adhesive composition can be dispensed in a selected pattern through a needle or screen printing, or otherwise through a mask having a selected pattern; or otherwise through photo-patterning; or otherwise through pre-forming the adhesive composition into a sheet (optionally with isotropic or anisotropic conductivity). Pressure can be applied to the polymerizable adhesive composition if necessary to assist in the bonding.

The dispensing of the polymerizable adhesive compositions and the adhesive properties thereof can be adjusted to meet any one or more of the following:

The dispensing can be performed using any conventional dispensing system, including, but not limited to, dispensing using piston or auger pumps, spin coating, spray coating, or screen printing.

The adhesive can contain a tracer element for inspection, if desired.

The adhesive can contain a pigment for optical inspection, if desired.

The adhesive can be made to change color after curing, if desired.

Figure 1C:
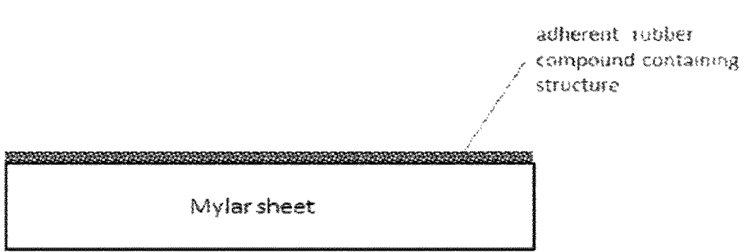
FIG. 1C is a schematic depicting an adhesive transfer sheet for transfer of natural or synthetic rubber compounds onto a substrate to be bonded.

In one embodiment of this invention, an adhesive transfer sheet can be used to transfer the above-noted natural or synthetic rubber compounds onto a substrate to be bonded. FIG. 1C is a schematic depicting an adhesive transfer sheet for transfer of natural or synthetic rubber compounds onto a substrate to be bonded. With this approach, a sheet made of mylar (for example) is pulled through a solution of the above-noted natural or synthetic rubber compounds in which various down converters and/or up converters are also in suspension.

The rubber compounds and the down and/or up converters transfer to the mylar sheet forming a continuous or quasi-continuous coating thereof. In this approach, the coated sheet is now able to be cut or otherwise shaped to fit prescribed regions where two or more substrates such as the low energy substrates (noted elsewhere) are to be bonded together. Once applied to one of the substrates, the adhesive transfer sheet is pressed and the rubber compounds with the down and/or up converters are transferred to the first substrate, and the mylar sheet removed. This transfer process can conform or otherwise dispose the rubber compounds (with the down and/or up converters) to a surface of the first substrate. In some embodiments, the down and/or up converters may be omitted if the vulcanization of the rubber compound is to occur by direct x-ray inducement or other high energy particle bombardment, such as electron beam induced curing of the rubber compounds.

Subsequently, a second substrate (or more substrates) can be pressed into contact with the transferred rubber compounds (with the down and/or up converters), and thereafter upon x-ray or other appropriate activation energy the rubber compounds can be used to cure or otherwise vulcanize the rubber compounds, thus binding the substrates together.

Figure 1D:
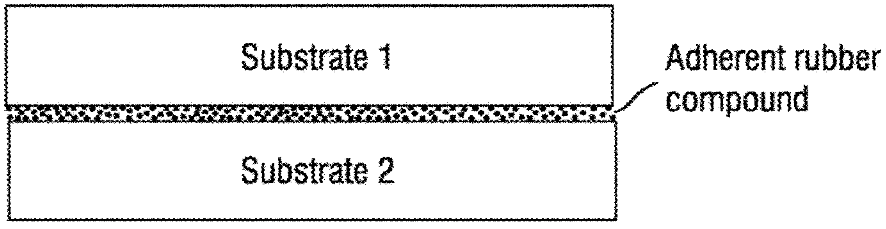
FIG. 1D is a schematic depicting the bonding of two substrates together using rubber compounds of the present invention.

FIG. 1D is a schematic depicting the bonding of two substrates together using rubber compounds of the present invention.

Thus, in one embodiment of this invention, there is provided an adhesive transfer member including a release substrate, one or more rubber compounds disposed on a surface of the release element, and an energy converting material intermixed said one or rubber compounds in the a surface of the release element. The adhesive transfer member can include downconverting or upcoming material (such as those described above or below). The downconverting material can include inorganic particulates selected from the group consisting of: metal oxides; metal sulfides; doped metal oxides; and mixed metal chalcogenides. The downconverting material can include at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS and alkali lead silicate including compositions of $SiO_2$, $B_2O_3$, $Na_2O$, $K_2O$, PbO, MgO, or Ag, and combinations or alloys or layers thereof. The downconverting material can include a dopant including at least one of Er, Eu, Yb, Tm, Nd, Mn Tb, Ce, Y, U, Pr, La, Gd and other rare-earth species or a combination thereof. The dopant can include at a concentration of 0.01%-50% by mol concentration. A preferred embodiment uses a combination of $Y_2O_3$: Gd+LaOBr: Tm phosphors or $Y_2O_3$: Gd+LaOBr:Tb phosphors. The upconverting material can include at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof.

Bonding Of Materials: The present invention permits the bonding of composites to other composites (especially to low energy surface materials), to metals and metal alloys, to rubbers, to leather and to inorganic materials (such as ceramics), particularly useful in bonding of non-like materials to one another. In one embodiment, the bonding to the low energy surface materials in turn permits the polymerizable adhesive compositions including the adherent surface structures to in turn be bonded to variety of other materials including those described above and below.

Attaching mechanical fasteners to composites: The present invention permits the bonding of small metallic components to large composite panels such as rivets which can be useful to fasten two separate structures. Conventionally, this requires the use of metal on metal contact to accomplish a welded connection. The present invention's polymerizable adhesive compositions including the adherent surface structures permit a much wider manufacturing freedom of operation. For aerospace and automotive applications, for example, a KUKA robot (sold by KUKA Aktiengesellschaft of Augsburg, Germany) can be equipped with an adhesive applicator (such as a dispenser) and an X-ray source as well as a pick and place machine to: dispense the adhesive, perform optical inspection, place a rivet and hold it in place, and cure with X-ray, all within a record time compared to any other known methods. Furthermore, the advantage of room temperature bonding minimizes warpage.

Natural composites: The present invention permits the fabrication of large wood beams, or other natural composite materials, which has been conventionally accomplished, for example, from small wood pieces by resin coating the wood pieces and bonding the assembly under high pressure and heat to cure the adhesive. The present invention's polymerizable adhesive compositions including the adherent surface structures allow room temperature bonding and no moisture needs to be volatized during cure. This is far better than the conventional methods of making such composites which typically use microwaves for heat generation, but creates enormous amounts of heat in the process, sometimes even resulting in the workpiece catching fire!

Bonding Of Metals: The present invention permits the bonding of metallic chassis and doors in automotives (to replace conventional induction heating). Metal sheets can be bent in special shapes and then adhesively bonded together by the present invention's polymerizable adhesive compositions including the adherent surface structures by first forming the adherent surface structures and then dispensing a bead of the polymerizable adhesive composition around the chassis and mating the metallic pieces, fixing their position, followed by curing.

Fluidic Channels: The present invention permits the creation of fluidic channels in plastics, metals and inorganic substrates by bonding patterned substrates together to form said fluidic channels. The joining of dissimilar plastics, the joining of semiconductors to plastic can be done by first forming the adherent surface structures and then dispensing the polymerizable adhesive composition onto respective surfaces to form and seal the fluidic channels Multichip Modules: The present invention permits die on KOVAR substrate, as well as lid sealing on multi-chip-modules to be bonded by first forming the adherent surface structures and then dispensing the polymerizable adhesive composition onto respective surfaces to adhere the die to the KOVAR.

MEMS: The present invention permits sealing MEMS with glass wafers at room temperature (without head shift) can be bonded by first forming the adherent surface structures on the glass wafers and then dispensing the polymerizable adhesive composition onto respective surfaces to adhere the MEMS and glass wafer together.

Attaching deformable substrates, particularly dissimilar substrates: The present invention permits the attaching rubber to foam, leather to rubber, leather to leather, or fabric to fabric, or any combination of deformable substrates which can be provided by first forming the adherent surface structures on at least one of the mating surface and then dispensing the polymerizable adhesive composition onto the respective surfaces to adhere the elements together.

In the description that follows, various aspects of the invention will be described in greater detail so that the skilled artisan may gain a fuller understanding of how the invention may be made and used. Although the present description discusses the use of X-ray as the triggering radiation for the curing process, other types of ionizing radiation can be used as the triggering radiation, using similar down-converting agents, including, but not limited to, gamma rays or particle beams, such as proton beams or electron beams.

CTE—Mismatch

The mismatch between the coefficients of thermal expansion of different materials can be illustrated through the following table. The present invention enables joining materials without heat and hence circumvents the stresses that are typically trapped during thermal heating necessitated by thermal curing adhesives. The current invention enables curing between materials of drastically different CTEs.

TABLE 1

| Material | Coefficient OF Thermal Expansion/ppm/C. |
|---|---|
| Silica Glass | 0.6 |
| E-Glass | 4.8 |
| Alumina | 8.7 |
| Steel | 14 |
| Aluminum | 23-24 |
| Polyimide | 38-54 |
| Epoxy | 45-65 |
| Polyester | 55-100 |
| Polystyrene | 60-80 |
| Polypropylene | 85-200 |
| Silicone resin | 160-180 |

Photoinitiators

Photoinitiators are typically divided into two classes: Type I photoinitiators which undergo a unimolecular bond cleavage when irradiated, yielding free radicals, and Type II photoinitiators which undergo a bimolecular reaction, in which the excited state of the photoinitiator interacts with a second molecule (called a coinitiator) to generate free radicals. UV photoinitiators may be of either Type I or Type II, whereas visible light photoinitiators are almost exclusively Type II.

Type I UV photoinitiators include, but are not limited to, the following classes of compounds: benzoin ethers, benzil ketals, α-dialkoxyacetophenones, α-aminoalkylphenones, and acylphosphine oxides. Type II UV photoinitiators include, but are not limited to, benzophenones/amines and thioxanthones/amines. Visible photoinitiators include, but are not limited to, titanocenes.

A large number of useful photoinitiator compounds are known in the art. The following compounds [available from Sigma-Aldrich Corp., St. Louis, MO] have been characterized and their UV absorbance spectra are available: Acetophenone, 99%; Anisoin, 95%; Anthraquinone, 97%; Anthraquinone-2-sulfonic acid, sodium saltmonohydrate, 97%; (Benzene) tricarbonylchromium, 98%; Benzil, 98%; Benzoin, sublimed, 99.5+%; Benzoin ethyl ether, 99%; Benzoin isobutyl ether, tech., 90%; Benzoin methyl ether, 96%; Benzophenone, 99%; Benzophenone/1-Hydroxycyclohexyl phenyl ketone, 50/50 blend; 3,3',4,4'-Benzophenonetetracarboxylic dianhydride, sublimed, 98%; 4-Benzoylbiphenyl, 99%; 2-Benzyl-2-(dimethylamino)-4'-morpholinobutyrophenone, 97%; 4,4'-Bis(diethylamino)benzophenone, 99+%; 4,4'-Bis(dimethylamino)benzophenone, 98%; Camphorquinone, 98%; 2-Chlorothioxanthen-9-one, 98%; (Cumene) cyclopentadienyliron (II) hexafluorophosphate, 98%; Dibenzosuberenone, 97%; 2,2-Diethoxyacetophenone, 95%; 4,4'-Dihydroxybenzophenone, 99%; 2,2-Dimethoxy-2-phenylacetophenone, 99%; 4-(Dimethylamino)benzophenone, 98%; 4,4'-Dimethylbenzil, 97%; 2,5-Dimethylbenzophenone, tech., 95%; 3,4-Dimethylbenzophenone, 99%; Diphenyl(2,4,6-trimethylbenzoyl) phosphine oxide/2-Hydroxy-2-methylpropiophenone, 50/50 blend; 4'-Ethoxyacetophenone, 98%; 2-Ethylanthraquinone, 97+%; Ferrocene, 98%; 3'-Hydroxyacetophenone, 99+%; 4'-Hydroxyacetophenone, 99%; 3-Hydroxybenzophenone, 99%; 4-Hydroxybenzophenone, 98%; 1-Hydroxycyclohexyl phenyl ketone, 99%; 2-Hydroxy-2-methylpropiophenone, 97%; 2-Methylbenzophenone, 98%; 3-Methylbenzophenone, 99%; Methybenzoylformate, 98%; 2-Methyl-4'-(methylthio)-2-morpholinopropiophenone, 98%; Phenanthrenequinone, 99+%; 4'-Phenoxyacetophenone, 98%; Thioxanthen-9-one, 98%; Triarylsulfonium hexafluoroantimonate salts, mixed, 50% in propylene carbonate; and Triarylsulfonium hexafluorophosphate salts, mixed, 50% in propylene carbonate.

Other suitable photoinitiators include the various IRGACURE products commercially available from BASF Corporation. The Key Products Selection Guide 2003 for Photoinitiators for UV Curing is hereby incorporated by reference in its entirety. A representative chemical class of photoinitiators is provided as examples. It would be appreciated that derivatives of such chemistries is also included. The representative list includes alpha_-Hydroxyketone and derivatives based on (1-Hydroxy-cyclohexyl-phenyl-ketone; 2-Hydroxy-2-methyl-1-phenyl-1-propanone; 2-Hydroxy-1-[4-(2-hydroxyethoxy)phenyl]-2-methyl-1-propanone). Phenylglyoxylate and derivatives based on (Methylbenzoylformate; oxy-phenyl-acetic acid 2-[2 oxo-2 oxy-phenyl-acetic acid 2-[2 oxo-2 phenyl-acetoxy-ethoxy]-ethyl ester and oxy-phenyl-acetic 2-[2-hydroxy-ethoxy]-ethyl ester). Benzyldimethyl-ketal and derivatives based on (Alpha, alpha-dimethoxy-alpha-phenylacetophenone). Alpha-Aminoketone and derivatives based on (2-Benzyl-2-(dimethylamino)-1-[4-(4-morpholinyl)phenyl]-1-butanone; 2-Methyl-1-[4-(methylthio)phenyl]-2-(4-morpholinyl)-1-propanone/IRGACURE 369 (30 wt %)+IRGACURE 651 (70 wt %). Mono Acyl Phosphine (MAPO) and derivatives based on (Diphenyl(2,4,6-trimethylbenzoyl)-phosphine oxide. MAPO alpah-Hydroxyketone and derivatives based on DAROCUR TPO (50 wt %)+DAROCUR 1173 (50 wt %). Bis Acyl Phosphine (BAPO) and derivatives based on Phosphine oxide, phenyl bis(2,4,6-trimethyl benzoyl). BAPO Dispersion based on (IRGACURE 819 (45% active) dispersed in water). BAPO/alpha_-Hydroxyketone (IRGACURE 819 (20 wt %)+DAROCUR 1173 (80 wt %). Metallocene (Bis(eta 5-2,4-cyclopentadien-1-yl), Bis [2,6-difluoro-3-(1H-pyrrol-1-yl), phenyl]titanium). Iodonium salt and derivatives based on Iodonium, (4-methylphenyl) [4-(2-methylpropyl)phenyl]-, hexafluorophosphate (1-).

The polymerizable adhesive composition of the present invention can comprise a polymerizable composition or a crosslinkable composition. The term organic vehicle is used herein to indicate the portion of the curable adhesive composition that ultimately forms the resin upon curing, whether by polymerization or crosslinking. Thus, a polymerizable organic vehicle comprises at least one polymerizable monomer. A crosslinkable organic vehicle thus comprises a plurality of crosslinkable polymer chains. Ideally, the organic vehicle is of a suitable viscosity for dispensing/applying to the desired substrate.

The monomer system may be selected based upon overall requirements such as strength, flexibility or compliance, matching with substrate properties, and the type of bonding involved, such as electrically conductive bonding versus a strictly structural adhesive bond.

Some suitable monomer systems that may be used for various applications of the invention include, without limitation: epoxies, phenolics, urethanes, acrylics, cyanoacrylates, silicones, polysulfides, polyimides, polyphenylquinoxalines, and styrenes. UV-light curing acrylic adhesives and UV-light curing silicones are commercially available.

Accordingly, in various embodiments of the present invention, the monomer systems and photoinitiators noted above bonds to the adherent structures described herein to promote the bond between two or more substrates. In various embodiments of the present invention, the monomer systems and photoinitiators noted above include the down converters and up converters described herein.

Energy Converting Materials

Many other downconverting particles, upconverting particles, plasmonics active particles and combinations of these are disclosed in U.S. provisional patent application 61/161,328, filed Mar. 18, 2009; U.S. provisional patent application 61/259,940, filed Nov. 10, 2009; U.S. Provisional Applications Ser. No. 60/954,263, filed Aug. 6, 2007, and 61/030,437, filed Feb. 21, 2008; U.S. application Ser. No. 12/059,484, filed Mar. 31, 2008; U.S. application Ser. No. 11/935,655, filed Nov. 6, 2007; U.S. Provisional Applications Ser. No. 61/042,561, filed Apr. 4, 2008; 61/035,559, filed Mar. 11, 2008; and 61/080,140, filed Jul. 11, 2008; U.S. patent application Ser. No. 12/401,478 filed Mar. 10, 2009; U.S. patent application Ser. No. 11/935,655, filed Nov. 6, 2007; U.S. patent application Ser. No. 12/059,484, filed Mar. 31, 2008; U.S. patent application Ser. No. 12/389,946, filed Feb. 20, 2009; and U.S. patent application Ser. No. 12/417,779, filed Apr. 3,2009, the entire disclosures of each of which are hereby incorporated by reference.

Phosphor selection criteria were based on peak intensity of the emission, peak position with UV of the emission, the need to have a workable phosphor with minimal storage requirements, handling and packaging, the ability of the phosphor to couple to X-ray energy, the control over its particle size and particle size distribution; and, finally their surface chemistry.

The peak emission target is between 310 nm and 400 nm or simply the UVA spectrum. It is desirable to have the maximum conversion of X-ray intensity into UVA intensity. This conversion described in various interrelated terms. Sometimes it is referred to as the quantum yield or probability of interaction between X-ray and phosphors. These interrelated terms include the coupling efficiency, emission effectiveness or the Effective-Z between the X-ray and the phosphor. A list of some of the best X-ray phosphors is reported in Table 2.

TABLE 2

| | | Emission Spectrum | X-ray Absorption | | | Microstructure | | |
|---|---|---|---|---|---|---|---|---|
| # | Phosphor | Peak Emission (nm) | Emiss Eff (%) | Eff (Z) | K-edge (keV) | Specific Gravity | Crystal Structure | Hygroscopic |
| 1 | $BaFCl:Eu^{2+}$ | 380 | 13 | 49.3 | 37.38 | 4.7 | Tetragonal | N |
| 2 | $BaSO_{4-}:Eu^{2+}$ | 390 | 6 | 45.5 | 37.38 | 4.5 | Rhombic | N |
| 3 | $LaOBr:Tm^{3+}$ | 360, 460 | 14 | 49.3 | 38.92 | 6.3 | Tetragonal | N |
| 4 | $YTaO_4$ | 337 | | 59.8 | 67.42 | 7.5 | Monolithic | N |
| 5 | $YTaO_4$:Nb (*) | 410 | 11 | 59.8 | 67.42 | 7.5 | Monolithic | N |
| 6 | $CaWO_4$ | 420 | 5 | 61.8 | 69.48 | 6.1 | Tetragonal | N |
| 7 | $LaOBr:Tb^{3+}$ | 420 | 20 | 49.3 | 38.92 | 6.3 | Tetragonal | N |
| 8 | $Y_2O_2S:Tb^{3+}$ | 420 | 18 | 34.9 | 17.04 | 4.9 | Hexgonal | N |
| 9 | ZnS:Ag | 450 | 17 | 26.7 | 9.66 | 3.9 | Hexgonal | N |
| 10 | (Zn, Cd)S:Ag | 530 | 19 | 38.4 | 9.66/26.7 | 4.8 | Hexgonal | N |
| 11 | $Gd_2O_2S:Tb^{3+}$ | 545 | 13 | 59.5 | 50.22 | 7.3 | Hexgonal | N |
| 12 | $La_2O_2S:Tb^{3+}$ | 545 | 12.5 | 52.6 | 38.92 | 6.5 | Hexgonal | N |

Accordingly, in various embodiments of the present invention, the energy converting materials noted above activate the photoinitiators noted above to affect curing of the adhesive medium between two or more substrates. In other embodiments, the energy converting materials promote curing or vulcanization of the natural or synthetic rubber compounds noted above.

UVA/UVB Emissions

In some applications the desirable incident or initiation energy is different than X-ray (such as EUV) while the desirable down-converted output intensity remains in the UVA. In other applications the desirable incident or initiation energy is X-ray but the desirable down-converted energy output of the phosphor is in the UVB. Yet in other cases the desirable incident or initiation energy is X-ray but the desirable down-converted energy output of the phosphor is in the UVA and the UVB. The selected phosphors were selected to work with excitation sources including X-ray, extreme UV and e-beam. Within the X-ray regime, the selected phosphors can couple to a flux of X-ray photons emanating from commercially available equipment sources used for therapeutic tumor treatments, medical imaging and semiconductor inspection.

Figure 2A:
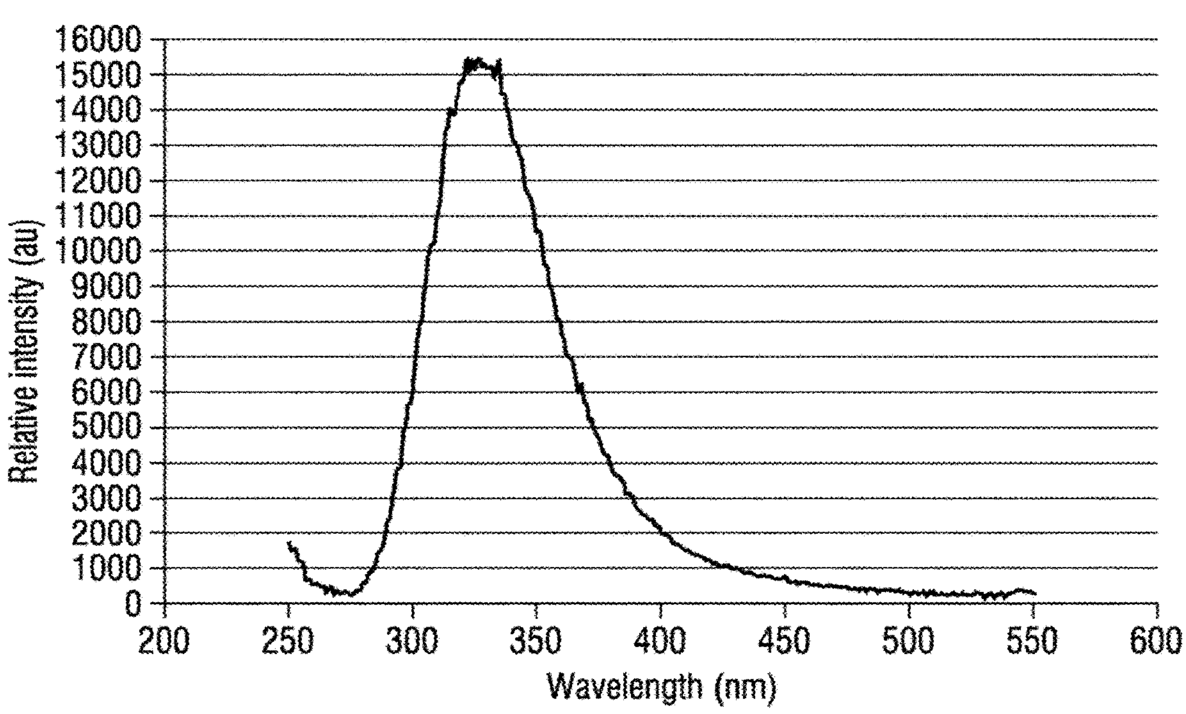
FIG. 2A provides an emission spectrum of a material that emits in the UVB regime, upon irradiation with X-rays.

An example of a material that emits in the UVA regime is provided in FIG. 2A. The X-ray system used to carry out the experiment was the Faxitron X-ray System. An example of a material having an output in the UVB is provided in FIG. 2B. An example of a material having an output in the UVA, UVB and the visible is provided in FIG. 3.

Accordingly, in various embodiments of the present invention, the phosphors noted above activate the photoinitiators noted above to produce UV light and affect curing of the adhesive medium between two or more substrates. In other embodiments, the phosphors promote curing or vulcanization of the natural or synthetic rubber compounds noted above.

Mixed or Alloyed Phosphors

Figure 4:
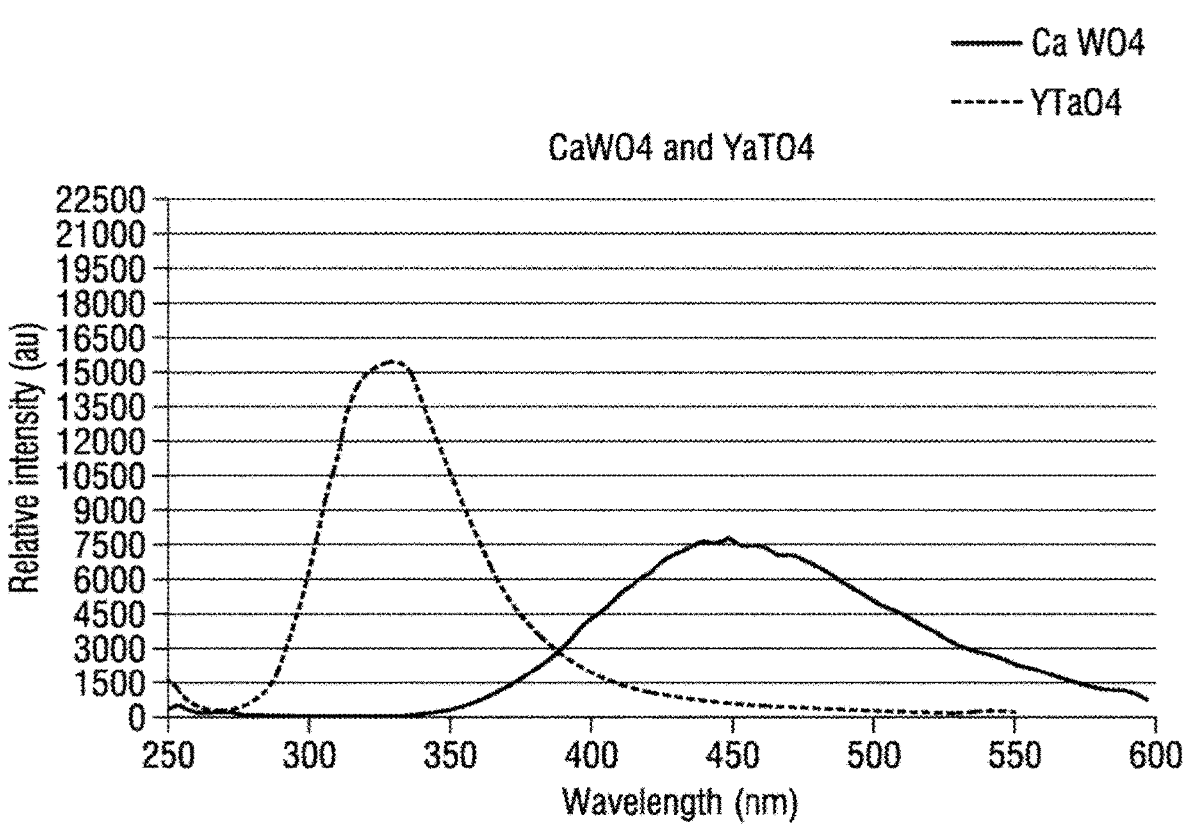
FIG. 4 provides emission spectra of two separate materials, $CaWO_4$ and $YaTO_4$, upon irradiation with X-rays.
Figure 5:
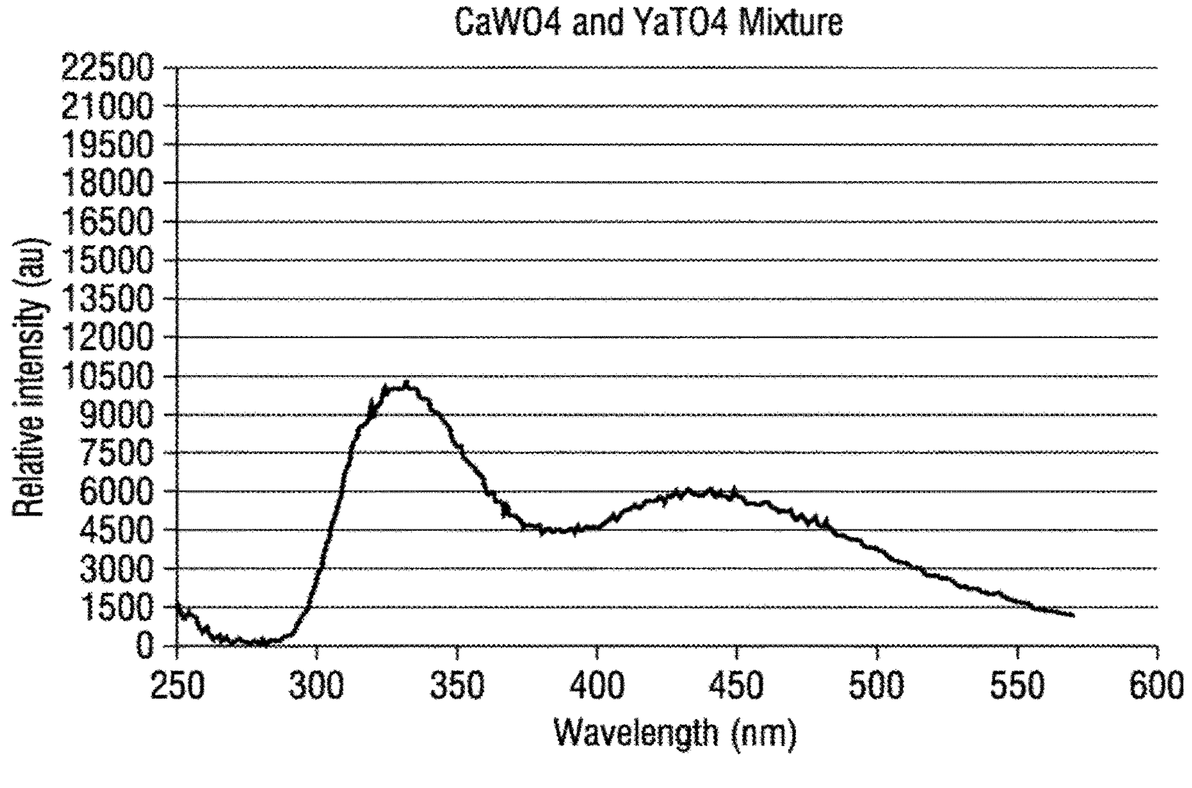
FIG. 5 provides an emission spectrum of a mixture of $CaWO_4$ and $YaTO_4$, upon irradiation with X-rays.

Another possibility of interest is the ability to mix at least two phosphors to broaden the output of the mixture compared with the starting phosphors. In this example, two phosphors each emitting in a distinct region were mixed together and the output spectral output was measured to demonstrate the ability to influence the output intensity of the mixture compared to the starting materials. (See FIGS. 4 and 5)

The intensity of the initiation energy (X-ray in this case) influences the UV output of the phosphor. The following examples are provided to illustrate how modifying the intensity of photonic energy of X-ray can modulate the light output of the X-ray. The relative intensity output of a phosphor ($CaOW_4$) was measured as a function of the energy of the X-ray photons. The X-ray energy was modified by modifying the peak voltages that exist between the filament and the target. The target in this case was tungsten. The measurements were carried out using the same mass of phosphor under 50 kVp, 90 kVp and 130 kVp. The relative intensity of the emission in arbitrary units is indicative but not conclusive in terms of comparing different materials. However, within the same conditions used to conduct measurements, it is clear that the higher X-ray intensity the higher the relative intensity of the emitted wavelength. (See FIG. 6)

The phosphors can be synthesized from different chemicals and using different processes to control their morphology, influence their properties and light intensity output but more importantly their stability in ambient air environments. It is preferred to have phosphors that are not hygroscopic. Phosphors are easier to handle and to work with when they are stable in water and do not contain dopants that are toxic; however, even when phosphors are not stable in water and do contain dopants that are toxic, the particles of the phosphors can be coated using chemistry synthesis methods that leads to the build-up of a protective coating which shields the phosphor from the environment (water for example) and shields the environment from the toxic dopant in the phosphor (bromide for example). The protective coating can be silica or can be diamond or diamond-like carbon. Silica can be formed using sol-gel derived techniques. Diamond and diamond-like carbon can be derived from chemical vapor deposition (CVD) based on hydrogen-methane gas mixtures. Handling and packaging of phosphors can be achieved through dispersion in solution or in powder form. It was found that silica coated phosphors make a good powder that does not agglomerate.

In addition to high intensity, emission at the correct wavelengths, another desirable attribute of phosphors is to have low specific gravity (if possible). A low specific gravity may help avoid sedimentation and settling when the phosphors are mixed into another media such as a resin or a resin blend containing photo-initiators.

Accordingly, in various embodiments of the present invention, the mixed phosphors noted above activate the photoinitiators noted above to affect curing of the adhesive medium between two or more substrates. In other embodiments, the mixed phosphors promote curing or vulcanization of the natural or synthetic rubber compounds noted above.

Rheology Adjustment

The particle size of the phosphor is a relevant factor. The smaller the particle size the higher the surface area. The small particles were found to alter the rheology of resins containing photo-catalysts more effectively than larger phosphor particles. The larger the particles size the higher the intensity output. The phosphors were found to perform well in terms of conversion of X-ray into UVA and activating photo-catalysts inside resin systems when they contain a particle size distribution (not a mono-modal particle size distribution). The phosphors having small particles (i.e. having a high surface area) were successfully used to increase the viscosity of the resin without the use of active silica (or AEROSIL). In one embodiment, phosphor nanoparticles are added to adjust viscosity in-lieu of active silica. The best photo-activation and viscosity adjustment was found when nano-particles were used with a phosphor having particles up to the 5 microns particle size. In essence bimodal distribution of particles can help the packing factor (or loading content of phosphors into the resin) as well as helps in terms of rheological control and UVA light intensity generation for the formulation of adhesives having controllable viscosity, good curing under X-ray. A tri-modal or large distribution of particle sizes are effective in balancing rheology of the adhesive and cure response of the adhesive under X-ray.

Organic Materials

In addition to the inorganic compounds (or phosphors) described in the current invention, organic compounds can be used to achieve the same or a similar purpose to affect curing of the adhesive medium between two or more substrates or to promote curing or vulcanization of the natural or synthetic rubber compounds noted above. For example, anthracene and anthracene based compounds can be used to achieve the objective of the invention (curing with no line of sight and thermal energy). Anthracene exhibits a blue (400-500 nm peak) fluorescence under ultraviolet light. Furthermore, it was found that anthracene exhibits fluorescence under X-Ray energy.

Various plastic scintillators, plastic scintillator fibers and related materials are made of polyvinyltoluene or styrene and fluors. These and other formulations are commercially available, such as from Saint Gobain Crystals, as BC-414, BC-420, BC-422, or BCF-10.

TABLE 3

| Phosphor | Product Reference | Peak Emission (nm) |
|---|---|---|
| Organic | BC-414 | 392 |
| Organic | BC-420 | 391 |
| Organic | BC-422 | 370 |

Other polymers are able to emit in the visible range and these include:

TABLE 4

| Phosphor (Fiber Forms) | Product Reference | Peak Emission (nm) | # of Photons Per MeV |
|---|---|---|---|
| Organic | BCF-10 | 432 | 8000 |
| Organic | BC-420 | 435 | 8000 |
| Organic | BC-422 | 492 | 8000 |

Furthermore, these organic compounds that can convert X-ray to UV energy can be interwoven into synthetic polymer chains. Here, the plasma or chemical treatments described above may be an excellent way to form the adherent structures on the into synthetic polymer chains to permit binding and adhesion. These chains can be used as the base resin system for a cross-linking adhesive; hence leading to the formation of a new set of X-ray activatable resin systems.

UV receptive chemistries can be made more reactive by adding photo-sensitizers. This process is referred to as photo-sensitization. Certain photosensitive chemical compounds can be added to supplement photonic energy to the reactant and the reactant site to promote or enhance curing.

For UV curing applications, it is of interest to have chemistries that upon exposure to the UV radiation would form an intermediate in an excited state that in turn emits light of the correct wavelength for further curing to take place. In other words, a sensitizer plays a role in energy transfer.

Many light sensitizing chemistries are known and widely used in the industry and these include to name but a few, acenaphthene quinone, aceanthrene quinone, or a mixture thereof with anthrone and/or naphthaquinone, violanthrone, isoviolanthrone, fluoresceine, rubrene, 9,10-diphenylanthracene, tetracene, 13,13'-dibenzantronile, levulinic acid.

Accordingly, in various embodiments of the present invention, the organic phosphors noted above activate the photoinitiators noted above to affect curing of the adhesive medium between two or more substrates. In other embodiments, the organic phosphors promote curing or vulcanization of the natural or synthetic rubber compounds noted above.

Spectral Matching

Table 5 shows a wide variety of energy modulation agents which can be used in this invention.

TABLE 5

| Item # | Phosphor Color | Emission Spectrum Peak Emission (nm) | Emiss Eff (%) | Eff (Z) | X-Ray Absorption K-edge (keV) | Specific Gravity | Crystal Structure | Hygroscopic |
|---|---|---|---|---|---|---|---|---|
| 24 | Zn3(PO4)2:Ti+ | 310 | | | | | | N |
| 33 | BaF2 | 310 | | | | | | Slightly |
| 30 | CsI | 315 | | | | | | N |
| 23 | Ca3(PO4)2:Ti+ | 330 | | | | | | N |
| 4 | YTaO4 | 337 | | 59.8 | 67.42 | 7.5 | Monolithic | N |
| 38 | CsI:Na | 338 | | | | | | Y |
| 14 | BaSi2O5:Pb2+ | 350 | | | | | | N |

TABLE 5-continued

| Item # | Phosphor Color | Emission Spectrum Peak Emission (nm) | Emiss Eff (%) | Eff (Z) | X-Ray Absorption K-edge (keV) | Specific Gravity | Crystal Structure | Hygroscopic |
|---|---|---|---|---|---|---|---|---|
| 27 | Borosilicate | 350 | | | | | | N |
| 34 | LaCl3(Ce) | 350 | | | | | | Y |
| 16 | SrB4O7F:Eu2+ | 360 | | | | | | N |
| 20 | RbBr:Tl+ | 360 | | | | | | ? |
| 15 | (Ba, Sr, Mg)3Si2O7:Pb2+ | 370 | | | | | | N |
| 17 | YAlO3:Ce3+ | 370 | | | | | | N |
| 37 | BC-422 | 370 | | | | | Organic | ? |
| 1 | BaFCl:Eu2+ | 380 | 13 | 49.3 | 37.38 | 4.7 | Tetragonal | N |
| 2 | BaSO4−:Eu2+ | 390 | 6 | 45.5 | 37.38 | 4.5 | Rhombic | N |
| 19 | BaFBr:Eu2+ | 390 | | | | | | ? |
| 36 | BC-420 | 391 | | | | | Organic | ? |
| 35 | BC-414 | 392 | | | | | Organic | ? |
| 25 | SrMgP2O7:Eu2+ | 394 | | | | | | N |
| 18 | BaBr2:Eu2+ | 400 | | | | | | N |
| 22 | (Sr, Ba)Al2Si2O8:Eu2+ | 400 | | | | | | N |
| 5 | YTaO4:Nb (*) | 410 | 11 | 59.8 | 67.42 | 7.5 | Monolithic | N |
| 21 | Y2SiO5:Ce3+ | 410 | | | | | | N |
| 6 | CaWO4 | 420 | 5 | 61.8 | 69.48 | 6.1 | Tetragonal | N |
| 7 | LaOBr:Tb3+ | 420 | 20 | 49.3 | 38.92 | 6.3 | Tetragonal | N |
| 8 | Y2O2S:Tb3+ | 420 | 18 | 34.9 | 17.04 | 4.9 | Hexgonal | N |
| 13 | Lu2SiO5:Ce3+ | 420 | | | | | | N |
| 26 | Lu1.8 Y0.2SiO5:Ce | 420 | | | | | | N |
| 9 | ZnS:Ag | 450 | 17 | 26.7 | 9.66 | 3.9 | Hexgonal | N |
| 29 | CdWO4 | 475 | | | | | | Slightly |
| 28 | Bi4Ge3O12 (BGO) | 480 | | | | | | N |
| 10 | (Zn, Cd)S:Ag | 530 | 19 | 38.4 | 9.66/26.7 | 4.8 | Hexgonal | N |
| 11 | Gd2O2S:Tb3+ | 545 | 13 | 59.5 | 50.22 | 7.3 | Hexgonal | N |
| 12 | La2O2S:Tb3+ | 545 | 12.5 | 52.6 | 38.92 | 6.5 | Hexgonal | N |
| 31 | Y3Al5O12 (Ce) | 550 | | | | | | N |
| 3 | LaOBr:Tm3+ | 360, 460 | 14 | 49.3 | 38.92 | 6.3 | Tetragonal | N |
| 32 | CaF2(Eu) | 435/300 | | | | | | N |

It will be appreciated that the most efficient system will be one in which the particular photo-initiator is selected based on its absorption, its photo-catalysis sensitivity to the intensity of the incident radiation (i.e.; the efficiency of energy transfer).

The emission wavelength in many embodiments of the present invention depends on the particular down converter material chosen to carry out the cure of the photo-catalytic reaction under consideration. Accordingly, to ensure the most efficient energy transfer from the phosphor to the photoinitiator, the phosphors are paired with the correct photoinitiators to match the emitted frequency/wavelength from the down-converter material to the peak absorption of the photo-initiator. This is referred to as a spectral match in the current invention. The spectral matching mentioned above increases the chances of successful attempts needed to overcome the activation energy barrier gating reactions. Table 6 shows the relative peak absorption of certain photo-initiators and the relative peak emissions of certain phosphors. The pairing of photo-initiators and phosphors was done accordingly to the table and successfully demonstrated as illustrated in the examples.

TABLE 6

| Photoinitiator | Absorption Peaks | Peak Absorption | Phosphor | Peak Emission |
|---|---|---|---|---|
| IRGACUR 784 | 398, 470 | 398 | LaOBr:Tm3+ (coated) | 360, 460 |
| DAROCUR 4265 | 240, 272, 380 | 380 | CWO4:Pb | 425 |
| IRGACUR 2100 | 275, 370 | 370 | YTaO4:Nb (*) | 410 |
| IRGACUR 2022 | 246, 282, 370 | 370 | Y2SiO5:Ce | 410 |
| IRGACUR 819DW | 295, 370 | 370 | BaSO4−:Eu2+ (coated) | 390 |
| IRGACUR 819 | 295, 370 | 370 | SrB6O10:Pb | 360 |
| DAROCUR TPO | 295, 368, 380, 393 | 368 | BaSi2O5:Pb2+ | 350 |
| IRGACURE 651 | 250, 340 | 340 | CsI:Na (Coated) | 338 |
| IRGACURE 184 | 246, 280, 333 | 333 | YTaO4 | 137 |
| IRGACURE 500 | 250, 332 | 332 | | |
| DAROCUR 1173 | 245, 280, 331 | 331 | | |
| IRGACURE 754 | 255, 325 | 325 | | |
| DAROCUR MBF | 255, 325 | 325 | | |
| IRGACURE 369 | 233, 324 | 324 | | |
| IRGACURE 1300 | 251, 323 | 323 | | |
| IRGACURE 907 | 230, 304 | 304 | | |
| IRGACURE 2959 | 276 | 270 | | |

Accordingly, in various embodiments of the present invention, the spectrally-matched phosphors (inorganic or organic) noted above activate the photoinitiators to affect curing of the adhesive medium between two or more substrates. In other embodiments, the spectrally-matched phosphors (inorganic or organic) promote curing or vulcanization of the natural or synthetic rubber compounds noted above.

Phosphor and Photo-Initiator Design Factors

Furthermore, the distance between a phosphor particle and a photo-initiator influences the efficiency of energy transfer. The shorter the distance between the photo-initiators and the phosphors the better chances of energy transfer leading to successful reactions will take place. Inside a mixture of a curable system there are many particles and a relatively elevated concentration of photo-initiators. As a result, there is more than one distance between particles and photo-initiators. In these cases, the average distance between phosphor particles and photo-initiators is used a metric, but other distance metrics could be used.

The photo-initiators can be attached onto the surface of phosphor particles using tethering of adsorption techniques among others. In the case of tethering, a high vs. low molecular weight would be an effective way to change the distance between the photo-initiators and the particles respective surfaces. In the case of deposition through adsorption, the distance between the surface of the phosphors and the photo-initiators can be altered by inner-layering a coating that is transparent to the radiation emitted by the phosphors. $SiO_2$ is an example of such inner layer since it is transparent to UV.

Packing factor and average distance between the phosphors and the photo-initiators can be impacted using a surface coating. The packing factor of a phosphor having innate surface chemistry would therefore be different than that for a phosphor having a relatively thick coating.

The combination of the spectral match defined above, the average distance between the photo-initiators and the phosphors, the intensity of radiation generated by the phosphor particles under an initiation radiation, the particle size distribution constitutes the most efficient embodiment of the present invention.

In regards to the packing factor of the phosphors, a large enough silica coating deposited on the surfaces of particles would change the effective packing factor of effective density of the powder (i.e.; mass per unit volume of powder). Similarly, a phosphor coated with a coating having an irregular shape can further influence the mass per unit volume. As an example a powder of an average particle size of 5 microns can be coated with a enough silica to obtain an average size of 15 microns.

Figure 7:
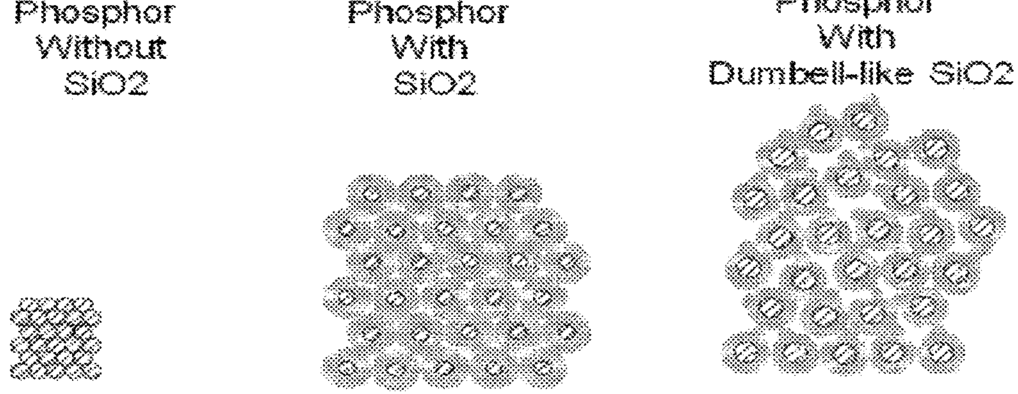
FIG. 7 provides a representation of the effects of a large coating thickness or coating shape on packing factor of a phosphor.

The phosphor itself becomes more or less responsive to the incident X-ray beam as a result of the coating that can alter its effective density of the mass of the powder per unit volume. The probability of interaction between the X-ray energy and the phosphors decreases with increasing coating wall thickness. An illustration is provided in FIG. 7 where the same amount of phosphor (i.e.; the X-ray coupling agent) can occupy a larger thickness.

Figure 8:
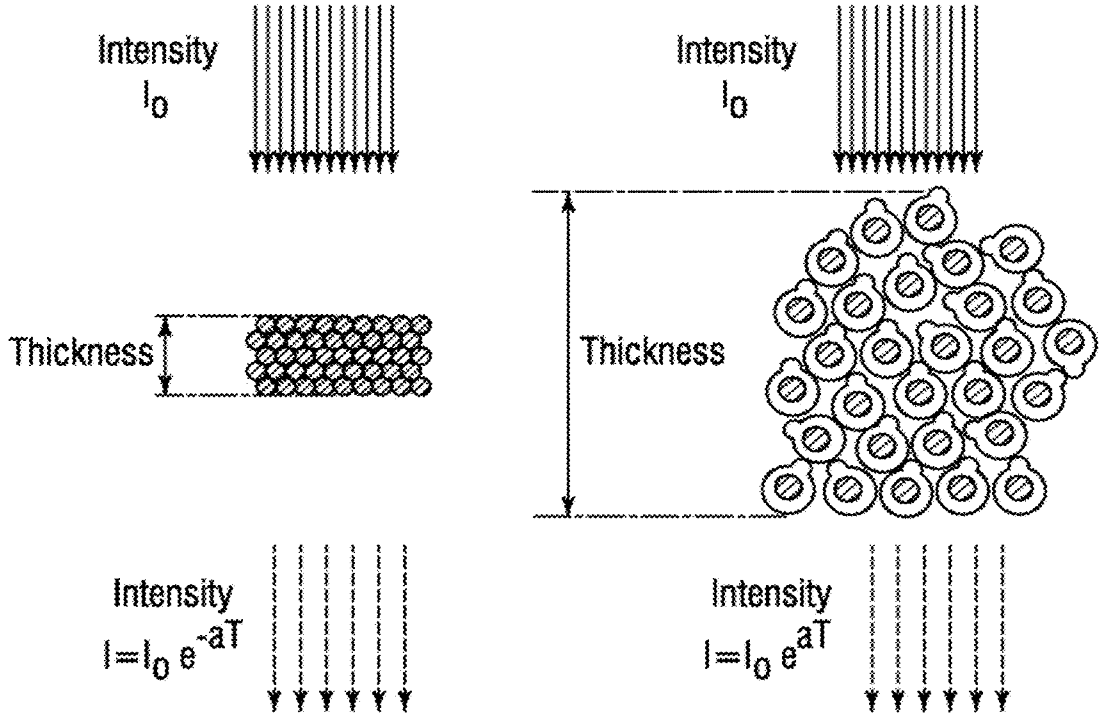
FIG. 8 provides the changes in attenuation of intensity of X-ray between a phosphor that has a coating and an innate phosphor surface.

By virtue of changing the concentration of phosphor or by changing the effective packing factor of the phosphor, the probability of interaction of the X-ray energy with the phosphor filled resin can be altered. The intensity of X-ray can be attenuated differently between a phosphor that has a coating and an innate phosphor surface (see FIG. 8).

As noted above, in one embodiment of this invention, organic phosphors can be used having a significantly smaller size than convention inorganic polymers.

The coated phosphors can be used as the filler in the resin system. The widely used filler in the industry is silica. In some cases alumina and boron-nitride are used. The silicate fillers are used to substitute some of the resin volume without degrading the properties of curable material. The filling of silica powder leads to cost savings. Filled systems are typically more mechanically stable and more cost effective than the unfilled systems.

Accordingly, in various embodiments of the present invention, the coated phosphors (inorganic or organic) noted above activate the photoinitiators to affect curing of the adhesive medium between two or more substrates. In other embodiments, the coated phosphors (inorganic or organic) promote curing or vulcanization of the natural or synthetic rubber compounds noted above.

Cure Categorization:

The UV curing materials can be diverse; but, as a general categorization, the following materials sets are outlined by specific resin families, associated initiators, cure mechanism and appropriate application. This is by no means an inclusive list but just a general categorization to further illustration. The present invention is compatible with each of these categories including radical cross-linking or polymerization, cationic crosslinking, base catalyzed crosslinking.

Direct X-Ray Cure:

Direct curing with x-ray energy (with or without the use of phosphors) is also possible in the present invention. For example, one can add a chemical compound that has the capability of being activated directly under x-ray energy, such as methyl ethyl ketone peroxide (MEKP), which is an organic peroxide, to assist in initiating the polymerization. Also, benzoyl peroxide, another compound in the in the peroxide family that has two benzoyl groups bridged by a peroxide link, can be used to assist in the initiation of the polymerization under x-ray. The effect of phosphors and these peroxide based chemicals can be additive.

Co-Curing

Figure 9:
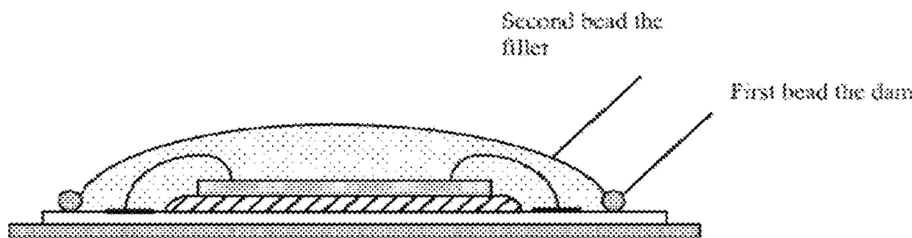
FIG. 9 provides a representation of an embodiment of a dam-and-fill application of the present invention.

In some applications it is useful to have two adhesive beads. One adhesive bead is filled with a phosphor having a high effective packing density and another adhesive bead having a lower packing density. In this case, under the same X-ray energy intensity, one bead would cure faster than the other. In some dam and fill applications, such as in RF-ID, one could apply a dam, cure it, and then fill and cure the fill. (See FIG. 9) However, one could co-cure the 2 adhesive beads using the method described here by the ability to couple more initiation energy into the containment bead as compared with the filler. These methods allow the curing of the containment bead and the filler material at the same time (co-curing) or curing one after the other (sequential curing). The same base adhesive can be used for both cases (possibly the same chemical formulation) with the containment bead having a phosphor of a different conversion efficiency than that of the filler material. This can be readily done by proper choice of the phosphor, or content of the phosphor. In a way the adhesive beads can be cured effectively at the same time but one sees more UV intensity than the other and cure faster than the other under the same X-ray beam.

Figure 10:
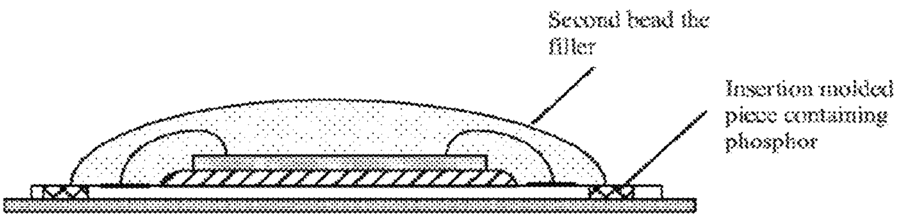
FIG. 10 provides a representation of an embodiment of the present invention using an insertion molded piece placed in the substrate to intensify the UV output.

Yet in another embodiment of the present invention, an insertion molded piece of plastic containing the appropriate amount of phosphor is added as part of the material to be cured. (See FIG. 10) As a molded frame this acts as the source of UV under X-ray energy. In this case the inserted molded piece gives extra UV energy to the dam (or perimeter area) and leads to faster curing. This allows the materials to cure more selectively at the borders. This example describes the usefulness of insertion molding as described in FIG. 10.

In one embodiment of the present invention, the polymerizable adhesive compositions including the adherent surface structures are utilized to improve and enhance the bonding strength.

Additionally photo-sensitizing chemistries can be used to enhance the photo-catalytic based reactions.

Accordingly, in various embodiments of the present invention, the light activated curing of the adhesive medium between two or more substrates can be assisted by other curing mechanisms. In other embodiments, the curing or vulcanization of the natural or synthetic rubber compounds noted above can be assisted by the other curing mechanisms.

SOL Gel Coating

Surface Modification for Special Phosphors.

Synthesizing phosphors in the micron and nanometer particle sizes can be done using various methods. Also various phosphors may have different surface chemistries. Some phosphors could be potentially hygroscopic or toxic in high doses. One way to enable the use of hygroscopic or potentially toxic phosphors is to form a containing barrier layer around phosphor particles. This has the double benefit of standardizing different phosphor chemistries to have the same common surface chemistry with predictable behavior as well as shield the phosphor inside a barrier layer. A sol-gel derived silicate coating is one method by which this can be achieved. Silica happens to be UV transparent and is congruent with most oxides and most phosphors that are not hygroscopic (as listed in the phosphor table).

The protective coating can be silica or can be diamond or diamond-like carbon. Silica can be formed using sol-gel derived techniques. Diamond and diamond-like carbon can be derived from CVD based on hydrogen-methane gas mixtures. These are but representative examples of the methods that are possible.

Dispersion:

The uniform distribution of phosphors inside a curable system influences the homogeneity of the curable material and therefore the mechanical and optical properties of the curable material. The mixing uniformity and the particles size distribution have an influence on the curing system response in terms of cure extent as a function of time under the initiation energy. The uniformity of the dispersion can be short lived if the phosphors have a high specific density leading to settling in the resin.

Dispersants

The surface of the phosphors can be modified for two general purposes. One method leads to tethering or adsorbing the photo-initiators onto the surface of the phosphors. The other method is to add dispersant chemistries to the surface of phosphors to enable the phosphors to remain in suspension after the adhesive is formulated and the ingredients have been mixed together. In general phosphors are preferred to be in powder form with minimal aggregation between particles. The dispersion of phosphor powder in a resin system can be achieved using various methods. These dispersion methods keep the phosphors in suspension by limiting or preventing the potential re-flocculation caused by the particles' Brownian motion at room temperature or at temperatures above room temperatures by 20° C. to 30° C. These slightly elevated above room temperature are useful in dispensing the adhesives through a needle using a piston or an auger pump.

The surface modification of the phosphors to maintain a uniform dispersion after mixing is important. Various organic polymer agents can be used to increase the wetting characteristics of the phosphors into the resin chemistry. Similarly, various dispersing agents can be added to maintain the phosphor particles in suspension inside the mix. The dispersing agents are built from polyurethane or polyacrylate polymeric structures having high molecular weight (3000-50000). Various dispersing agent are available in the market. The dispersants can be anchored onto inorganic surface by virtue of surface charge (the electrostatic attraction of oppositely charged surfaces) and can be anchored or adsorbed to the organic substances like the chains in the resin by virtue of dipolar interactions, hydrogen bonding and London/van-der-Waals forces. Once anchored in place the high molecular weight dispersants increase the steric hindrance for particles to diffuse too close to one another hence preventing agglomeration of phosphors.

Tethering

The downconverting particles and photo-initiators used in the present invention can be added as separate components to the curable adhesive formulation, or can be tethered to one another to provide increased likelihood of activation of the photoinitiator upon emission from the downconverting particles. Tethering of photoinitiators to the downconverting particles can be done by any conventional chemistry, so long as it does not interfere with the emission characteristics of the downconverting particles (other than potential slight movement of the peak emission in the red or blue direction), and so long as it does not interfere with the ability of the photoinitiator to initiate polymerization of the curable adhesive composition. One may also use combinations of two or more phosphors, two or more photoinitiators, or both, to achieve more complex curing kinetics. Further, one can use organic downconverters, such as anthracene, rather than the various inorganic downconverters noted above. With the organic downconverters, there are additional possibilities including, but not limited to, use of the organic downconverter material as a separate component in the curable adhesive composition, tethering the organic downconverter to the photoinitiator, as described for the inorganic downconverter particles above, or even incorporation of the organic downconverter groups into one or more of the monomer components of the curable adhesive composition.

Figure 17:
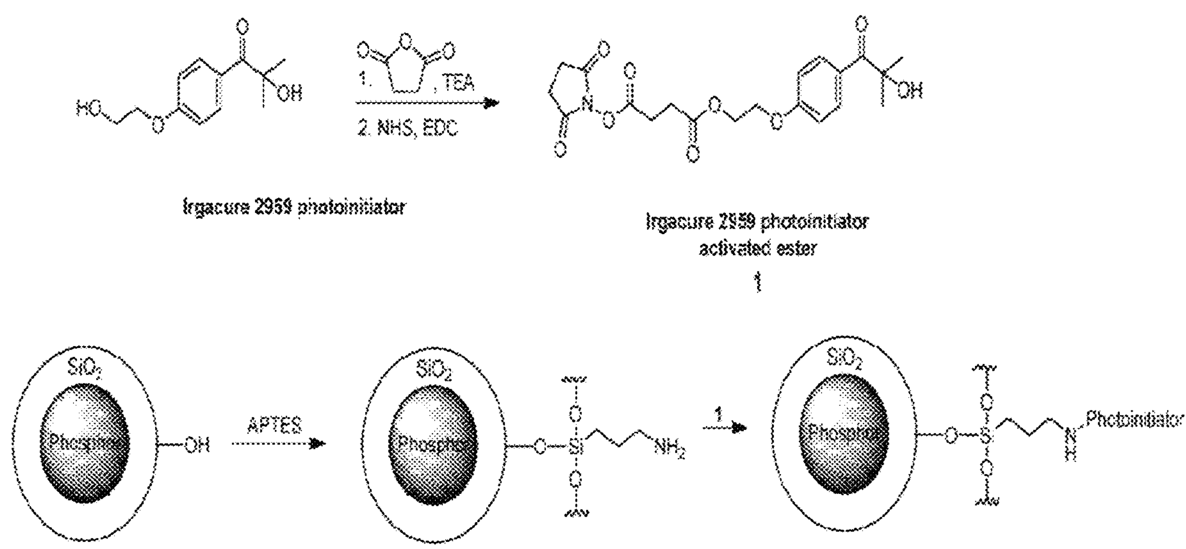
FIG. 17 provides a representation of one suitable chemistry for tethering inorganic down converter particles to the photoinitiator.

One suitable chemistry for tethering inorganic down converter particles to the photoinitiator is shown in FIG. 17, whereby a silica coated phosphor is reacted with aminopropyltriethoxysilane (APTES), then the modified photoinitiator is bound to the pendant aminopropyl group.

Other possible modifications include, but are not limited to, the following:

a. Modification of existing adhesives by adding special downconverting particles from X-ray to UV in the range of susceptibility of a Photoinitiator Accordingly, in various embodiments of the present invention, the coated and/or tethered phosphors noted above activate the photoinitiators to affect curing of the adhesive medium between two or more substrates. In other embodiments, the coated and/or tethered phosphors promote curing or vulcanization of the natural or synthetic rubber compounds noted above.

Building Composited Particles

In applications that require the use of micron level particles that are cost effective down converters, the surface of a carrier particle made of silica can be decorated with desirable phosphors with nanometer particle size. The phosphors are chosen for the right emission UV wavelength and intensity under X-ray.

The downconverting particle comprises a composite of nanoparticles and a silicate carrier particle. The silicate carrier particle has the same surface characteristics as a particle typically used as a filler (including silica). In this case the down converting particles are bonded to the surface of the base carrier particle followed by a coating as shown in FIGS. 11A and 11B.

By way of illustration the construction of such a composite particle is hereby provided. This description is non-inclusive of all the possibilities but provides one viable synthesis method.

The core or carrier particle can be made of glass, such as $SiO_2$ or alkali-lead-silicate and have a diameter of about 2 microns. Nanometer-scale downconverting particles are applied to the surface of the core particle, and subsequently made to adhere or bond to the surface of the core particle (see FIG. 11B). Some of the methods enabling this bonding process include precipitation techniques from a solution. Another method is based on condensation by heating the downconverting particles to much elevated temperatures compared to the core particles while maintaining the silicate based particles above their softening point. At the correct respective ranges of temperature, which are readily determined by one of ordinary skill in the art based on the compositions of the core particle and downconverting particle chosen, the downconverting particles and the carrier particles are forced into contact, leading to condensation, thus allowing surface deposition to take place. The downconverting particles can be any of the phosphors listed in Table 5 or elsewhere described herein.

Accordingly, in various embodiments of the present invention, the composite phosphor particles noted above activate the photoinitiators to affect curing of the adhesive medium between two or more substrates. In other embodiments, the composite phosphor particles (inorganic or organic) promote curing or vulcanization of the natural or synthetic rubber compounds noted above.

Quantum Dots and Alloyed Derivatives

Figure 12:
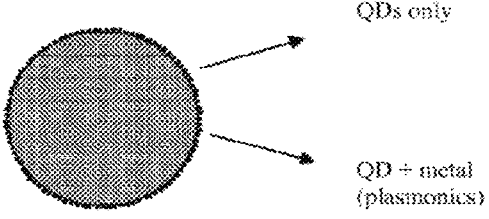
FIG. 12 provides a representation of a silica carrier particle coated with quantum dots or alloyed quantum dots or metal alloys exhibiting plasmonic behavior under X-ray.

The downconverting particles, for example, can be quantum dots with the suitable range of downconversion from X-ray to UV. The quantum dots and/or oxides used for the downconversion process can further comprise elements, or alloys of compounds or elements tuned for plasmonic activity (see FIG. 12). In a preferred embodiment, the quantum dots preferably comprise a mixture of zinc sulfide and zinc selenide, more preferably in a ratio within a compositional window of 60% zinc sulfide, 40% zinc selenide to 70% zinc sulfide, 30% zinc selenide. The metal alloys used for plasmonics comprise silver/gold mixtures, more preferably within the compositional window of 60% silver and 40% gold, to 70% silver and 30% gold.

Figure 13:
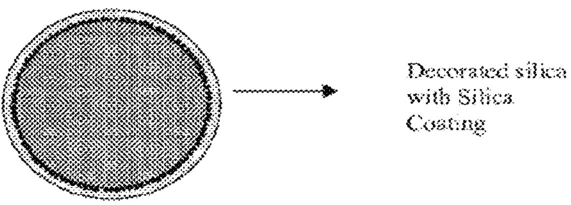
FIG. 13 provides a representation of a silica carrier particle decorated with nano-sized downconverters and then coated with silica.

After the carrier core particle is decorated with the down converting particles, coating the outer layer is desirable to encapsulate and protect the down converting particles as well as modify the surface. The outer layer coating can be accomplished using sol-gel processing followed by heat treatment. This leads to the formation of a composited particle consisting of a core particle with down-converting particles on the surface and the whole is coated with a silicate coating. (see FIG. 13). This special filler particle is used to replace an existing filler material.

Accordingly, in various embodiments of the present invention, the quantum dot structures noted above activate the photoinitiators to affect curing of the adhesive medium between two or more substrates. In other embodiments, the quantum dot structures promote curing or vulcanization of the natural or synthetic rubber compounds noted above.

Tethering to Composite Particles

Figure 14:
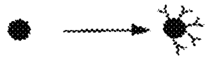
FIG. 14 provides a representation of a photoinitiator tethered or adsorbed on the surface of a nano-sized phosphor particle.

The present invention includes special provisions for a modified use of existing photoinitiators by tethering the photoinitiator to nanoparticles having downconverting properties. This close proximity of nanoparticle to photoinitiator maximizes the chance for photoinitiation or photo-catalysis, and can achieve improved cure efficiencies. (see FIG. 14)

Figure 15A:
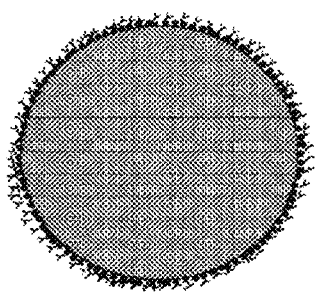
FIGS. 15A and 15B provide representations of a silica micro particle decorated with nano-size phosphor particles having photoinitiators tethered or adsorbed on the surfaces thereof and photoinitiators tethered directly on a silica coating around a particle that is decorated with nano-sized phosphors, respectively.
Figure 15B:
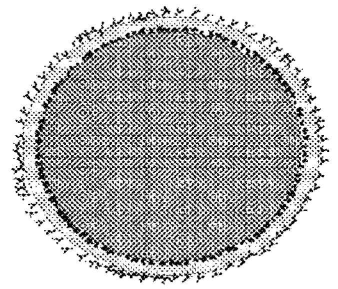

In the tethered case, the downconverting particles are added during mixing an adhesive preparation using tethered particles on a carrier particle and mixing into the adhesive. As an alternative embodiment, the tethered photoinitiator and downconverting particles can be positioned on the surfaces of micron level carrier particles. (See FIGS. 15A and 15B) The carrier particles are then used as filler. This time no surface coating is necessary and the photoinitiator is in direct contact with the resin. (FIG. 15A). Alternatively, this arrangement can also use a coating of $SiO_2$, on which are tethered the photoinitiators. (FIG. 15B).

Since in this particular embodiment, micron size particles (large particles) are added to the mix, the impact on adhesive rheology is minimized compared to adding nano-size particles. This method can thus present added advantages, including the ability to use the micron size particles as a filler to otherwise alter the cured adhesive or polymer properties.

Accordingly, in various embodiments of the present invention, the tethered composite energy modulators noted above activate the photoinitiators to affect curing of the adhesive medium between two or more substrates. In other embodiments, the tethered composite energy modulators promote curing or vulcanization of the natural or synthetic rubber compounds noted above.

Composite Particles

Figures 16A, 16B:
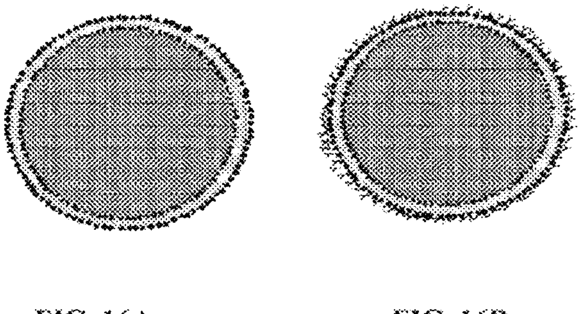
FIGS. 16A and 16B provide representations of a double layered decoration that is non-tethered with photoinitiators and a double layered decoration with tethered photoinitiators, respectively.

Achieving brighter luminescing particles can be done by having the carrier particle decorated with two layers of phosphors. First the carrier particle is decorated with nano-sized phosphors (FIG. 16A), then coated using sol gel derived silica and lastly decorated a second time with phosphors of the correct size (FIG. 16B). This technique can be repeated to obtain more phosphors or down conversion particles at the outer-layers of the carrier particles.

Accordingly, in various embodiments of the present invention, the composite phosphor structures noted above activate the photoinitiators to affect curing of the adhesive medium between two or more substrates. In other embodiments, the composite phosphor structures promote curing or vulcanization of the natural or synthetic rubber compounds noted above.

Generalized Aspects of the Invention

The present invention reactive chemistries located across an interface between two substrates preferably are complimentary and reactive to one another. In one preferred embodiment, the reactive chemistries of the present invention can form the surface of one or both substrates, an adherent structure which can result in bonding one layer to the other across the interface. In an alternate embodiment, an adherent structure can be used which reacts with each substrate surface independently to affect the bond between the layers. In a further embodiment, the substrate surfaces are coated with reactive chemistry such as the natural and/or synthetic rubber compounds noted above, which results in reactive moiety formation, and the creation of chemical bonds (an adherent structure) to the surface, and between the coatings on each surface. In the present invention, the application of X-ray radiation to the novel chemistry causes the formation and/or release of a catalyst at the bonding interface.

The present invention relates to reactive chemistries and associated methods of use to bond two substrates across their interface under X-Ray, e-beam and UV radiation, wherein the reactive chemistries react by way of a mechanism including, but not limited to, radical formation (which can be by hydrogen or other atom or group abstraction, chain scission, or any other mechanism forming radicals), cation or anion formation, photo-initiation, and a combination of two or more of the above in the absence of line-of-sight. These mechanisms forming an adherent structure to which a curable resin can adhere, thereby providing a mechanism to bond even low energy surfaces together.

The present invention methods are used for bonding two or more substrates together wherein the bond formation at the interface between two substrates is achieved without the requirement of UV activation or thermal heating. However, in an alternate embodiment, either or both of UV activation and thermal heating can be used in some cases to assist in the achievement of better bonding properties, as desired.

Within the context of the present invention, the term “substrate” or “substrates” is used merely to refer to an object being acted upon in the present invention method, such that the bonding of two substrates causes at least one surface of a first substrate to bond to at least one surface of a second substrate. While the method is described with respect to bonding two substrates to one another, it is possible to use the present invention method to simultaneously, or sequentially, bond multiple substrates to one another, depending on the final structure desired.

In this invention, substrates are caused to form a bond either directly or indirectly under the application of X-Ray energy, e-beam or a combination of UV and X-Ray and e-beam energy. In the present invention, these sources of energy can operate interchangeably, depending on the chemistry used.

In the case of the direct bond formation between two substrates, the chemistries of the two substrates is modified and made to include the novel reactive chemistries at their interfaces (such as the natural and/or synthetic rubber compounds noted above with or without energy converters) to form an adherent structure. The novel reactive chemistries can be disposed at the interface of the two substrates by virtue of being interwoven (or blended) in the composition of the objects or can be applied as a surface modification or coating on the surface of the substrate to be bonded (an adherent structure). In the case where one substrate is made of a polymer material, the reactive chemistry may be blended in as a co-polymer. The substrates can be made of any material, including, but not limited to, polymers and plastics, glass, ceramics, metals, metal oxides, etc.

In the case of indirect bond formation between two substrates, a layer of the present invention chemistry is applied either to one or both substrate surfaces to be bonded, or as a separate layer in the interface formed between the two substrate surfaces to be bonded, followed by pressing the objects together and exposing the thus formed assembly to X-Ray energy or other high energy penetrating radiation. The layer of the present invention chemistry is preferably applied as a conformable coating or as a conformable film.

The present invention reactive chemistries are capable of being activated by X-Ray energy and or the combination of X-Ray and UV radiation. In embodiments that use UV radiation, when line-of-sight is not possible, or when the substrate material is not UV transmissive, the UV radiation at the interface of the two substrates in the present invention is generated through the down conversion of X-Ray energy into UV energy enabled by energy modulating agents, preferably in particle form. Suitable energy modulation agents and particles are disclosed in U.S. application Ser. No. 12/764,184, filed Apr. 21, 2010; U.S. application Ser. No. 12/763,404, filed Apr. 20, 2010; U.S. application Ser. No. 12/843,188, filed Jul. 26, 2010; U.S. application Ser. No. 12/891,466, filed Sep. 27, 2010; U.S. application Ser. No. 12/943,787, filed Nov. 10, 2010; U.S. application Ser. No. 13/054,279, filed Jul. 13, 2011; U.S. application Ser. No. 13/102,277, filed May 6, 2011; U.S. application Ser. No. 13/204,355, filed Aug. 5, 2011; U.S. application Ser. No. 12/725,108, filed Mar. 16, 2010; U.S. application Ser. No. 12/059,484, filed Mar. 31, 2008; U.S. application Ser. No. 11/935,655, filed Nov. 6, 2007; U.S. application Ser. No. 12/401,478 filed Mar. 10, 2009; U.S. application Ser. No. 11/935,655, filed Nov. 6, 2007; and Ser. No. 12/059,484, filed Mar. 31, 2008; U.S. application Ser. No. 12/389,946, filed Feb. 20, 2009; and U.S. application Ser. No. 12/417, 779, filed April 3,2009, the entire disclosures of each of which are hereby incorporated by reference.

In a preferred embodiment of the present invention, the generation of the reactive moiety, and formation of the bonds between substrates is performed at ambient temperature. This is particularly important in the case where the two substrates to be bonded are made of materials having differing coefficients of thermal expansion.

Another object of the present invention is to provide a film composition containing a polymer that undergoes reactive moiety formation under exposure to ionizing radiation, and that contains a down-converting energy modulation agent, preferably a phosphor or scintillator material.

The reactive moieties of the present invention can be any reactive moiety that can be formed by reaction of the reactive composition with ionizing radiation, either by direct interaction with the ionizing radiation, or indirectly through energy conversion by an energy modulating agent to generate UV or another energy that generates the reactive moiety. The reactive moieties include, but are not limited to, free radicals, cations, anions, carbenes, nitrenes, etc. For ease of discussion, the following discussion is drawn to generation of free radicals. However, one of ordinary skill would understand that the same procedures can be used to generate the other forms of reactive moieties, which can then interact with compositions to form bonds, thus resulting in bonding of two substrates.

In one embodiment of the invention, peroxides and more suitably organic peroxides (used commercially) can also be used to initiate and create free-radical polymerization. Some peroxides are initiated by ionizing radiation and others are thermally activated. Examples of suitable peroxides of interest in the present invention include, but are not limited to:

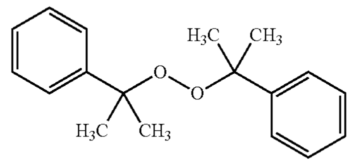

Dicumyl peroxide

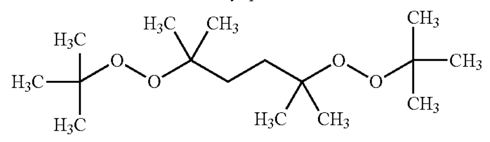

2,5-Bis(tert-butylperoxy)-2,5-dimethylhexane, (preferably blended with calcium carbonate and silica)

-continued

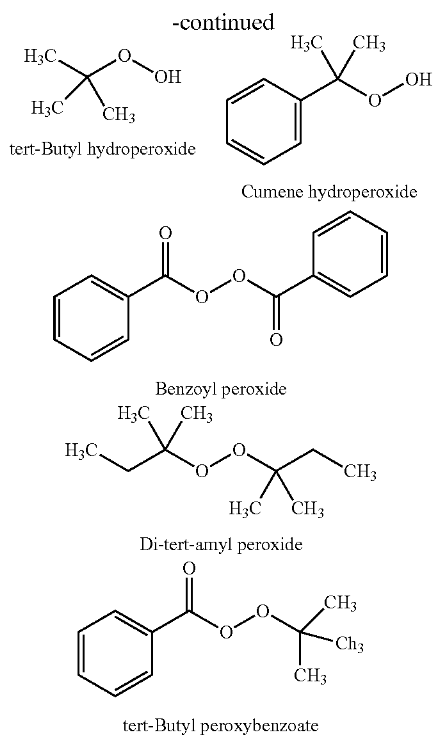

tert-Butyl hydroperoxide

Cumene hydroperoxide

Benzoyl peroxide

Di-tert-amyl peroxide tert-Butyl peroxybenzoate

Once a free-radical initiation takes place, the polymerization of various chemistries can take place. However, in such free radical initiated reactions, oxygen inhibition can take place, resulting in incomplete polymerization, and incomplete reaction between chains. The oxygen dissolved in a given polymeric substance can play the role of a chain terminator in a free-radical curing reaction, by way of the formation of a peroxy radical, as shown in the scheme below. Oxygen inhibition is particularly pronounced in systems lacking active hydrogen.

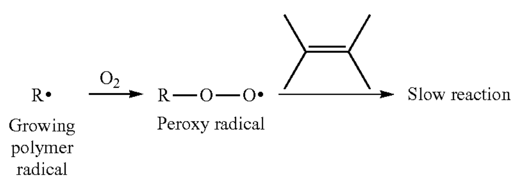

Active hydrogen containing compounds are able to counteract the peroxy radical which leads to further reaction. In various embodiments of this invention, oxygen inhibition can be circumvented using various techniques. Some active systems to counteract oxygen inhibition include the presence of hindered/secondary amines (~NH) and allylic (C═C—$CH_2$—) moieties. Methacrylates contain such allylic hydrogen moities and are less susceptible than acrylates to oxygen inhibition.

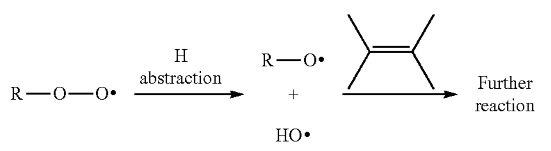

Another strategy for counteracting oxygen inhibition is by the inclusion of compounds having multiple active hydrogens. This can particularly be improved by increasing the functionality from di- to tri- and tetra-functionality. Tetra-functional alcohols provide monomers with six and eight functionalities.

The compositions of the present invention can be fine-tuned to include the appropriate concentration of these monomers along with systems with active hydrogen as well as photo and/or heat active peroxides. Iron, and more generally, catalytic transition metals result in the formation of hydroxyl radicals (HO·) superoxide generating systems. Those of ordinary skill in the art understand that superoxide can reduce ADP-Fe(III) to ADP-Fe(II) and, this iron facilitates the apparent production of (HO·). Chelating agents (in the proper proportions) can also alter the reactivity of iron in superoxide-generating systems. It has been shown that EDTA3 enhances the reactivity of iron toward $O_2\cdot$—while DETAPAC4 drastically slows the $O_2\cdot$—reaction with iron. The use of catalysts and chelating agents is beneficial to optimizing the desirable free radical generation that leads to the desirable reactions.

In a further preferred embodiment, catalysts can be added for increasing free radical formation. Suitable catalysts include, but are not limited to, manganese naphthenate, cobalt naphthenate, and vanadium pentoxide quaternary ammonium salt can be used.

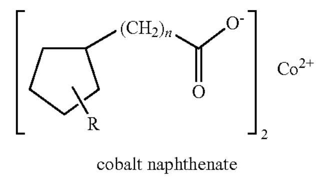

cobalt naphthenate

R = H and or alkyl

In the case where there is a combination of a UV and a heat activated peroxide, an initial UV activation can subsequently engender an exothermic reaction which in turn engender the activation of a thermal peroxide. Another simple method of minimizing oxygen inhibition is to carry out the reaction using an inert atmosphere. The flow of nitrogen and argon on the surface of the materials can be used to limit the oxygen exposure and minimize oxygen induced cure inhibition.

The present invention in various embodiments can utilize a widely variety of resins to join to the adherent structures noted above. The examples provided here are illustrative of examples rather than inclusive of the possibilities.

In the present invention, the term polymer includes both homopolymers and copolymers, which collectively can be referred to as (co) polymers. Polymers are molecules with many repetitive units (monomers). The units can be the same (identical) in which case this would be a homopolymer. On the other hand the polymer be made of dissimilar units (monomers) in which case the polymer would be a copolymer. Covalent bonding is prevalent but there are cases where ionic bonds and hydrogen bonding is present, depending on the particular monomers present. Examples of monomeric species include, but are not limited to, acrylates, methacrylates, olefins (such as ethylene, propylene, butylene and mixtures thereof), ethers, styrenes, fluoroolefins (such as fluoroethylenes, tetrafluoroethylenes, etc), esters, carbonates, urethanes, vinyl chlorides, vinyl chloride acetates, amides, imides, acetals, methylpentenes, sulfones, acrylics, styrene acrylics, acrylonitrile, etc. Examples of a co-polymer would include, for example, a polymer made from two or more of these species. Furthermore, the definition extends to more than two monomeric species including terpolymers, and a variety of side groups of different structures than the blended monomeric species. The term polymer is inclusive of any of these variations. Within the present invention, when the present invention composition contains a polymer, it is important that the polymer be able to generate a free radical species by any free radical generation mechanism available to the polymer, including, but not limited to, hydrogen, atom or group abstraction, chain scission, radical addition to unsaturation points in the polymer, etc.

In one embodiment of the present invention, it is desired to initiate a chemical reaction using a deeply penetrating and ionizing form of energy such as X-Ray or e-beam (the initiation energy). The term "X-Ray susceptible polymer" refers to a polymer chemistry that undergoes free radical formation, such as by atom/group abstraction, chain scission, or other mechanism, under X-Ray; and, as a result will have various characteristics (at least one) changing post exposure to the initiation energy. The molecular weight of the polymer can be reduced or a side group can be cleaved. Either one of these characteristics is desirable in the present invention. Extended exposure to the initiation energy could result in degradation and therefore there is a low threshold of energy (Lower dose for initiation) required to initiate the reaction and an upper energy dose which represents a damage threshold (upper dose control limit).

In one embodiment of the present invention, an example of a "X-Ray susceptible polymer" can include, but is not limited to, aliphatic polymers. Aliphatic polymers can include alicyclic (no-aromatic rings), alkanes (single bonds), alkenes (unsaturated with double bonds), alkynes (triple bonds) of carbon and hydrogen atoms. One example of an aliphatic polymer would be polyethylene, or a polyethylene-polypropylene copolymer.

Peroxides are widely used commercially to initiate and create free-radical initiation. The reactive free radical species generated then reacts with its environment to form chemical bonds. Such methods are used, for example, to graft maleic anhydride to polyolefins. In general chain scission can outpace competing reactions. For example, in the particular case of propylene, chain scission and grafting are competitive reactions. However, chain scission outpaces grafting which curbs the achievable molecular weight of the grafted resin.

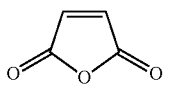

Maleic anhydride

Suitable polyolefins include, but are not limited to polyethylene (PE), polypropylene (PP) and ethyl vinyl acetate (EVA). Polyethylene is conventionally classified according to its density as Very Low Density Polyethylene (VLDPE), Low Density Polyethylene (LDPE), Linear Low Density Polyethylene (LLDPE), Medium Density Polyethylene (MDPE), and High Density Polyethylene (HDPE).

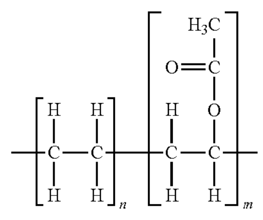

Ethylene-vinyl acetate

Examples of propylene polymers include propylene homopolymers and copolymers of propylene with ethylene or another unsaturated co-monomer. Copolymers also include terpolymers, tetrapolymers, etc. Typically, the units originating from propylene monomer comprise at least about 70 weight percent of the copolymer.

The mechanical and chemical properties of these resins can be tailored to become suitable for the desired application. The resin type, the catalyst, molecular weight, molecular weight distribution (MWD), crystallinity, branching and density all play a role in the microstructure and the behavior of the resin and its performance in the end use application. The choice of these characteristics depending on end use is well within the skill of one of ordinary skill in the art.

As a free radical inducing species for use in the present composition, suitable compounds include, but are not limited to, organic peroxides, azo free-radical initiators, and bicumene. Preferably, the free-radical inducing species is an organic peroxide. The organic peroxide can be added via direct injection or via blending with the chemistry of the polymer. The addition of the organic peroxide is in an amount sufficient to provide a concentration of free radicals sufficient for initiating reaction at enough sites to effect bonding, preferably from about 0.005 weight percent to about 20 weight percent, more preferably from about 0.25 weight percent to about 10 weight percent, most preferably from about 0.5 weight percent to about 5 weight percent.

In a similar fashion to the technical strategies employed to prohibit oxygen inhibition, the present invention methods can optionally employ one or more co-grafting reagents in order to minimize (or curb) chain scission. For this reason reagents containing two or more terminal carbon-carbon double bonds or triple bonds can be combined with free-radical generation to mitigate the loss in melt viscosity of polypropylene by coupling of polymer chains.

The present invention compositions can optionally further contain various conventional components that are suitable for the desired application. These can include, but are not limited to, the following agents: fillers, clays, fire retardant, scorch inhibitors, and blowing agents such as azodicarbonamide.

Activation with X-Ray and UV:

A preferred method of generating free-radicals in the present invention include the use of X-rays, electron-beam and gamma radiation. The present invention can use either X-ray or e-beam both as a source of free radical generation instead of, or in addition to UV light. UV generation is performed via the use of energy modulation agents, preferably in the form of particles, that absorb X-ray and convert it to UV. These particles are disposed at the interface where bonding is targeted to take place. The UV light (regardless of its generation) can in turn engender additional free radical generation.

Functional Energy Modulation Agents:

In one aspect of the invention, an energy modulation agent is added to the chemistry where the energy modulation agent is combined with an organic peroxide and an organic vehicle. Examples of the energy modulation agent include, but are not limited to: $BaFCl:Eu^{2+}$, $BaSO_4^-$: $Eu^{2+}$, LaOBr: $Tm^{3+}$, $YTaO_4$, $YTaO_4$:Nb(*), $CaWO_4$, LaOBr:$Tb^{3+}$, $Y_2O_2S$: $Tb^{3+}$, ZnS:Ag, (Zn,Cd) S:Ag, $Gd_2O_2S:Tb^{3+}$, $La_2O_2S:Tb^{3+}$. A more comprehensive list is provided in the following table.

Surface Preparation:

Adhesion develops through various factors including mechanical interlocking, adsorption, electrostatic, diffusion, weak boundary layer, acid base, chemical (covalent bonding), etc. In general, the greater the surface irregularities and porosity at a joint area, the greater the joint strength. The greater the compatibility of the size of the adhesives and the interstices in the adherend, the greater the bond strength can be. Roughness of the surfaces can increase or decrease the joint strength.

The factors affecting joint strength include: surface energetics (wetting), intrinsic stresses and stress concentrations, mechanical response of various bulk phases and inter-phases involved, geometrical considerations, mode of applying external stresses, mode of fracture or separation, visco-elastic behavior.

The wetting and the setting of the adhesive bead is important for a good bond formation. The spreading coefficient of an adhesive depends on the various surfaces and associated surface tensions involved. The surface tensions are referred to here as the energetic requirements. The substrate (solid), the adhesive (liquid) and the vapor (open air in most cases) all play a role. Wetting of the surface depends on the surface energy between the solid and the liquid, the liquid to vapor surface tension and between solid to vapor surface tension. Substrates such as Teflon, PET, Nylon, PE, and PS have low energy. Substrates such as metals, metal oxides, and ceramics have high energy.

The adhesive chemistry (the liquid in this example) can be tailored to adjust the energetic requirements at the various surfaces. But that is not sufficient. For example, most RTV silicone resins fulfill the energetic requirements but give negligible adhesion unless primers are used. Adhesive joints can be made stronger by surface treatments of the surfaces to be joined. Also inter-phases can be made between the adherend and the adhesive.

For the above considerations (surface energetic requirements and primers treatments) many surface modification techniques are used to achieve the goal of strong and durable adhesion at joints. The treatment of polymer surfaces is used for various reasons including one or more of the following list extending to making the polymers more adhesionable, increase their printability, make them more wettable, provide an enclosing layer, improve tribological behavior, potentially prepare them for metal plating, improve their flame resistance, provide antistatic properties, control permeation.

Dry surface modification includes, but is not limited to, a surface plasma ionized through RF or microwave, flame, UV, UV sensitized, ozone, UV/ozone, X-ray, LASER, electron beam, ion bombardment, and friction against other materials.

Wet surface modification encompasses chemical reactions such as oxidation, sulfonation, ozonation, phosphatization, chromate conversion, amination, grafting, selective etching, deposition of coupling layers (silanes), surfactant adsorption, photochemical compounds, solvent (surface swelling), prevention of diffusion of low molecular weight materials to the surface, and others.

In various embodiments of the present invention, the adhesives can be applied to the substrates using a variety of methods. In the simplest form the adhesive formulations were scooped from the mixing cup using a spatula and deposited on the top surface of one substrate. In other cases the adhesives were placed in syringes and hand pressed through a needle with an 18 to 22 gauge. In other cases the materials were dispensed through the needle of EDF air piston pump (also using 18 to 22 gauge needles). In some cases the substrates had a spacer element sandwiched between the substrates to keep the materials from being squeezed out from between the substrates. The adhesive cure has been demonstrated for adhesive bead thicknesses from 60 microns to 1000 microns.

| | Resin percent in Adhesive | 2100 percent in adhesive | 184 Weight percent in adhesive | Ratio of Adhesive % | Phosphor % by Weight | Phosphor Type | Cure Hardness |
|---|---|---|---|---|---|---|---|
| Around 100 microns | 0.94 | 0.02 | 0.04 | 0.75 | 0.25 | $CaWO_4$ | Yes |
| Between Glass Slides | 0.94 | 0.02 | 0.04 | 0.6 | 0.4 | $CaWO_4$ | Yes |
| | 0.88 | 0.04 | 0.08 | 0.75 | 0.25 | $CaWO_4$ | Yes |
| Around 250 microns | 0.94 | 0.02 | 0.04 | 0.75 | 0.25 | $CaWO_4$ | No |
| Between Glass Slides | 0.94 | 0.02 | 0.04 | 0.6 | 0.4 | $CaWO_4$ | No |
| | 0.88 | 0.04 | 0.08 | 0.75 | 0.25 | $CaWO_4$ | Yes |

In some cases, this was achieved using a polyimide film, while in other cases the spacer elements were glass beads. The curing of the adhesive thickness of the adhesive beads was successfully demonstrated at 60 microns to 250 microns. These thicknesses represent adhesive beads that would be compatible with applications such as B-staged films and chip on board applications. In other cases the adhesive bead was between 500 microns to 1000 microns. These thicknesses represent adhesive beads that would be compatible with applications such as hermetic sealing applications.

The control over the rheology and thickness of the adhesive beads was achieved using filler elements such as AEROSIL and nanoparticles of doped $Y_2O_3$. Gadolinium was found to be the preferred doping elements in these cases. In order to achieve thicknesses of 500 microns and above the adhesive formulations had between 0.5% and 5% of filler. In some cases, the adhesive bead was applied between 2 polycarbonate substrates and kept in this configuration for 24 hours. No-flow or displacement was observable. The adhesive bead was therefore made to provide the end-user with enough work and pot life after dispense and to tolerate interruptions of the work in process during manufacturing. This is significant because no scarping of the work in process after dispense is required.

| Formulations | 1 | 2 | 3 | 4 | 5 | 6 |
|---|---|---|---|---|---|---|
| Resin | 5 | 5 | 5 | 5 | — | — |
| Resin (shadow cure) | — | — | — | — | 5 | 5 |
| PI (369) | 1.3 | 1.3 | 1.3 | 1.3 | — | — |
| PI (2959) | — | — | — | — | 0.5 | 0.5 |
| LaOB:Tm | 1.5 | 2.5 | 3.5 | 2.5 | 2.5 | 2.5 |
| $Y_2O_3$ | — | — | — | 0.3 | — | — |
| AEROSIL | 0.2 | 0.2 | 0.2 | 0.2 | 0.2 | 0.2 |
| CABOSIL | — | — | — | — | | — |
| MEKP | — | — | — | 0 | 0.1 | — |

The step of X-ray radiation is preferably done in an enclosure that stops the radiation from leaking to the outside world. The enclosure can be made of various materials that include heavy metals such as lead. A single assembly can be held static or can be moved during cure inside the enclosure. Such movement could include a rotation movement that can be achieved using a turn table. Such movement could also include a translational movement that can be achieved using an external conveyor belt and an internal conveyor. Both the internal and the external conveyor belts work in synch to shuttle parts in and out of the X-ray enclosure. The door can open up and close down to shuttle assemblies in and out of the X-ray radiation chamber. When the door is open (or up position) the X-ray energy is off to adhere to safety measures. The X-ray enclosure can have automated doors with sensors linked to a controller. The enclosure can have doors that open up and down to shuttle at least one assembly in and out of the X-ray enclosure for irradiation leading to curing. Furthermore, the assembly to be cured can be positioned inside a process fixture. The process fixture carries with it the assemblies.

X-ray systems with the capability of programming recipes including pulsing up to 30 times per sec can be done. A level of control over the kVp as well as amperage can be done to exert control over output power as well as photon energy which in turns means control over depth of penetration.

Additionally, curing time and efficiency can be adjusted as desired by adjustment of various parameters, including, but not limited to, temperature, radiation source intensity, distance of the radiation source from the adhesive composition to be cured, and photon flux generated by the radiation source.

X-ray delivery head is on one side of the assembly, either above the adhesive bead or below the adhesive bead which can be described (though not exact) that the adhesive bead is generally perpendicular to the direction of propagation. In some cases the adhesive bead is generally parallel to the X-ray radiation path. It is recognized however that the X-ray radiation is emitted in a flood beam have multiple directions around one predominant direction of propagation.

Ink Jet Cartridges

Ink jet cartridges are typically made of a plastic housing made of a thermoplastic moldable resin, such as polyethylene terephthalate (PET), polyethylene, or polysulfone for example, as the base material. Polysulfone describes a family of thermoplastic polymers that have toughness, mechanical stability and ink resistance.

Typically, a print head made of silicon, has numerous nozzles that are used as ink outlets. The nozzle array on the silicon and the ink reservoirs are connected through a manifold structure having fluidic channels. The fluidic channels are employed to direct the inks of different colors from the primary reservoirs to appropriate printhead nozzle arrays.

Multicolor cartridges have a plurality of ink reservoirs, often three ink reservoirs. In such three ink cartridges, each of the reservoirs contains a primary color. These reservoirs need to be isolated from one another. The separation between the compartments has to be hermetic to avoid ink mixing between the various compartments. A plastic piece is adhesively bonded to seal the separate reservoirs.

The joint of interest that seals or separates the various reservoirs must be made to withstand the prolonged contact with inks. Inks happen to be aggressive from a chemical stand point. Furthermore, the sealing joint needs to be able to overcome the mechanical stresses that may exist over the product's functional life and the pressure differential that needs to be regulated between atmospheric pressure and the internal pressure in the reservoir.

The present invention's polymerizable adhesive compositions including the adherent surface structures can be used in the formation of inkjet cartridges.

Composites:

The present invention polymerizable adhesive compositions including the adherent surface structures noted above can also be used in the formation of composites, by the adhesion of two or more plies, which are the fundamental building blocks of layered composites. The composites can be built by layering the plies, with the plies adhered one to the other using the adhesive composition of the present invention.

The composite is preferably formed by preparation of a prepreg material formed of the plurality of plies, with each ply placed in the desired configuration with respect to the other plies, and having the curable adhesive composition of the present invention between respective layers of the plies. Once the prepreg is assembled, and the layers aligned as desired, the curable adhesive can be cured by application of the desired ionizing radiation, such as X-rays, thereby adhering the plies together to form the composite.

While many of the above described embodiments use downconverting particles that are dispersed throughout the curable adhesive composition, many other configurations are available for use with the present invention. For example, the downconverting particles can be adhered to a thin film (preferably to both sides of the thin film) which can be placed between two surfaces, each of which is coated with the curable adhesive monomer and photoinitiator formulation. Upon irradiation, the downconverting particles emit energy at the desired wavelength, activating the photoinitiator, and initiating curing of both layers of adhesive, thus bonding each of the surfaces to an opposite side of the thin film having the downconverting particles. One of ordinary skill, upon reviewing the present invention, would readily understand a wide variety of configurations that could be used to create novel adhered structures.

In preferred embodiments of the present invention adhesive chemistries, the reaction system is a combination of one or more photoinitiators, one or more phosphors/energy modulation agents, one or more curable adhesive precursors to form an adhesive resin upon curing, and optionally one or more additives. In these preferred embodiments, the reaction system comprises:

(1) one or more photoinitiators selected from the group consisting of benzophenone (BP), benzildimethyl ketal, sulfonium salts, oxime esters, photoacid generators, 1-hydroxy-cyclohexyl-phenyl-ketone, 2-hydroxy-2-methyl-1-phenyl-1-propanone, 2-hydroxy-1-{4-[4-(2-hydroxy-2-methyl-propionyl)-benzyl]-phenyl}-2-methylpropan-1-one, 2-hydroxy-1-[4-(2-hydroxyethoxy)phenyl]-2-methyl-1-propanone, 2,4,6- trimethylbenzoyl-diphenylphosphine oxide, 2,4,6-trimethylbenzoyl-diphenyl phosphinate, bis(2,4,6-trimethylbenzoyl)-phenylphosphineoxide, [1-(4-phenylsulfanylbenzoyl) heptylideneamino]benzoate, [1-[9-ethyl-6-(2-methylbenzoyl) carbazol-3-ylethylideneamino]acetate, 2-methyl-1 [4-(methylthio)phenyl]-2-morpholinopropan-1-one, 2-benzyl-2-dimethylamino-1-(4-morpholinophenyl)-butan-1-one, 2-dimethylamino-2-(4-methyl-benzyl)-1-(4-morpholin-4-yl-phenyl)-butan-1-one, iodonium (4-methylphenyl) [4-(2-methylpropyl)phenyl]-hexafluorophosphate (1-), and sulfonium salt cationic initiator;

(2) one or more phosphors/energy modulation agents selected from the group consisting of any of the phosphors and energy modulation agents described above;

(3) one or more curable adhesive resin precursors selected from the group consisting of bisphenol A epoxy acrylate, bisphenol A epoxy methacrylate, a chemically modified liquid diglycidyl ether of bisphenol A acrylate, bisphenol F epoxy acrylate, bisphenol F epoxy methacrylate, 2.6 functional bisphenol F novolac acrylate, 3.6 functional bisphenol F novolac acrylate, cycloaliphatic epoxy acrylate, dimerized fatty acid modified epoxy acrylate, urethane modified epoxy acrylate, acrylonitrile containing liquid elastomer acrylate, neopentyl glycol diglycidyl ether modified 50% with 82:18 butadiene: acrylonitrile liquid rubber acrylate, liquid epoxy resin adduct of butadiene copolymer with 18% acrylonitrile acrylate, glycidyl ester of neodecanoic acid, epoxidized meta xylylenediamine acrylate, sorbitol polyglycidyl ether acrylate, polyglycerol-3-polyglycidyl ether, propoxylated glycerin triglycidyl ether, castor oil triglycidyl acrylate, castor oil triglycidyl methacrylate, dipropylene glycol DGE, dicyclopentadiene polyester acrylate, dicyclopentadiene polyester methacrylate, polyether polyurethane acrylate, polyether polyurethane methacrylate, polyester polyurethane acrylate, polyester polyurethane methacrylate, polybutadiene acrylate, tripropyleneglycol diacrylate, 4-t-butylcyclohexyl acrylate, ethyldiglycol acrylate, and triethyleneglycol divinyl ether; and (4) optionally, one or more additives selected from the group consisting of organic acids (methacrylic acid, acrylic acid), amino silanes, epoxy silanes, carboxy silanes, vinyl silanes, mercapto silanes, cobalt abietates, cobalt resinates, cobalt stearates, cobalt naphthenates, cobalt neodecanoates, cobalt boroacylates, peroxides, perbenzoates, copper thiosulfates, nanosilica, precipitated amorphous silica, and crystalline silica;

and all permutations of components (1)-(4).

These various combinations can be used with or with one or more primers (such as those disclosed and discussed above), depending on the materials to be bonded together.

In most preferred embodiments, and for best results in the curing reaction, the phosphor, photoinitiator, and curable adhesive resin precursors are matched such that the active emission of the phosphor upon being treated with x-ray or other high energy sources activates the photoinitiator to initiate polymerization of the curable adhesive resin precursor to cure and form the cured adhesive resin.

Having generally described this invention, a further understanding can be obtained by reference to certain specific examples which are provided herein for purposes of illustration only and are not intended to be limiting unless otherwise specified.

The materials chemistries were prepared by first weighing the key chemical ingredients and mixing these chemical ingredients under heat. A functionalized Acrylate resin was obtained from BASF. The resin was made from a mixture of 4 commercially available products including Laromer LR 9023, Laromer PO 94F, Laromer TPGDA, Laromer LR 9004.

The photoinitiators were also obtained from BASF and consisted of IRGACURE 369 and IRGACURE 2529. The phosphors were obtained from Phosphor Technologies. The LaOBr:$Tb^{3+}$ phosphor as well as the $YTaO_4$ were used in the preparation of the curing formulations. The third phosphor was $Y_2O_3$ doped with Gadolinium ($Y_2O_3$:Gd). This third phosphor was synthesized in nano-particle size. It was used both as a phosphor and as a thickening agent.

The temperature that was used during all the mixing steps was 80° C. The sequence of adding the various chemicals was as follows: 1-resin, 2-photoinitiator, 3-phosphor and 4-thickening agent. In one case the thickening agent was the $Y_2O_3$: Gd. The mixtures stirred every 10 minutes for one hour to two hours. This ensured the obtainment of a homogenous mixture.

In one case MEKP was added to an adhesive formulation to assess the effectiveness of X-Ray curing on coupling energy to MEKP and enhancing the cure kinetics. It was found that recipe or formulation number 2, 3 and 4 cured faster than other formulations. However adhesion was compromised when excess photo-initiator was used. For this reason recipe 4worked best. It cured faster that recipe 2 and had better adhesion than recipe 3.

Curing of the various formulations was done on PET, glass, polycarbonate, polyimide, polysulfone, a carbon prepreg, a FR4 PCB. The adhesive bead was sandwiched between two similar substrates and cured while in between the substrates. No temperature was increased while in the x-ray. The temperature was measured using a hand-held IR thermometer. The only time a noticeable temperature increase of up to 10° C. was observed is in the case of the formulation containing MEKP.

| Formulations | 1 | 2 | 3 | 4 | 5 | 6 |
|---|---|---|---|---|---|---|
| Resin | 5 | 5 | 5 | 5 | — | — |
| Resin (shadow cure) | — | — | — | — | 5 | 5 |
| IRGACURE (369) | 1.3 | 1.3 | 1.3 | 1.3 | — | — |
| IRGACURE (2959) | — | — | — | — | 0.5 | 0.5 |
| LaOBr:Tb | 1.5 | 2.5 | 3.5 | 2.5 | 2.5 | 2.5 |
| $Y_2O_3$ | — | — | — | 0.3 | — | — |
| AEROSIL | 0.2 | 0.2 | 0.2 | 0.2 | 0.2 | 0.2 |
| CABOSIL | — | — | — | — | | — |
| MEKP | — | — | — | 0 | 0.1 | — |

Additional formulations were cured. The elapsed time under X-Ray was 10 min, 12.5 min, 15 min, 17.5 min and 20 min. The formulations that were made using the LaOBr:$Tb^{3+}$ phosphor cured between 10 min and 12.5 min. The formulations that were made using the phosphor $YTaO_4$ cured between 12.5 min and 15 min. The formulations using the third phosphor was $Y_2O_3$ doped with Gadolinium ($Y_2O_3$:Gd) cured in 17.5 minutes. However when the LaOBr:$Tb^{3+}$ mixed with $Y_2O_3$:Gd were added to the adhesive formulations, the cure was accomplished in 10 min.

| Formulations | 1 | 2 | 3 | 4 | 5 | 6 |
|---|---|---|---|---|---|---|
| Resin 1 | 6 | 6 | 6 | 6 | 6 | 6 |
| Resin 2 (shadow Cure ) | 0 | 0 | 0 | 0 | 0 | 0 |
| PI (369) | 0.6 | 0.6 | 0.6 | 0.6 | 0.6 | 0.6 |
| LaOBr:Tb | 1.5 | | | 1.5 | | |

-continued

| Formulations | 1 | 2 | 3 | 4 | 5 | 6 |
|---|---|---|---|---|---|---|
| $Y_2O_3$ - Ian | | 1.5 | | | 1.5 | |
| $YTaO_4$ | | | 1.5 | | | 1.5 |
| AEROSIL | 0.3 | 0.3 | 0.3 | 0.3 | 0.3 | 0.3 |

Besides the objects noted above, the bonding and curing and cross-linking processes described herein can be applied in the production of a variety of products adhering pieces together (having similar or dissimilar properties) to form final or intermediate products in a production process. Such products include, but are not limited to, athletic equipment, sporting equipment, industrial equipment, construction equipment, office equipment, baseballs, basketballs, volleyballs, golf balls, footballs, soccer balls, bowling pins, bowling balls, golf clubs, laminated furniture items, car panels, car interior products, tires, plastic covers, plastic containers, consumer and food packaging products, medical packaging products, etc.

Preferred Embodiments of the Invention

Embodiment 1. A method of adhesive bonding, comprising:

a) providing an adherent structure including one or more rubber compounds on a surface of an element to be bonded;

b) placing a polymerizable adhesive composition, including at least one photoinitiator and at least one energy converting material, in contact with the adherent structure and two or more components to be bonded to form an assembly;

c) irradiating the assembly with radiation at a first wavelength, capable of conversion by the at least one energy converting material to a second wavelength capable of activating the at least one photoinitiator to produce from the polymerizable adhesive composition a cured adhesive composition; and d) adhesively joining the two or more components by way of the adherent structure and the cured adhesive composition.

Embodiment 2. The method of embodiment 1, wherein said at least one energy converting material is a downconverting material.

Embodiment 3. The method of embodiment 2, wherein said downconverting material comprises inorganic particulates selected from the group consisting of: metal oxides; metal sulfides; doped metal oxides; and mixed metal chalcogenides.

Embodiment 4. The method of embodiment 2, wherein said downconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS; $ZnSe_xS_y$; $ZnSe_xS_y$: Cu, Ag, Ce, Tb; and alkali lead silicate including compositions of $SiO_2$, $B_2O_3$, $Na_2O$, $K_2O$, PbO, MgO, or Ag, and combinations or alloys or layers thereof.

Embodiment 5. The method of embodiment 4, wherein the downconverting material comprises a dopant including at least one of Er, Eu, Yb, Tm, Nd, Mn Tb, Ce, Y, U, Pr, La, Gd and other rare-earth species or a combination thereof.

Embodiment 6. The method of embodiment 2, wherein the downconverting material comprises at least one of CaS, ZnSeS, and iron sulfate.

Embodiment 7. The method of embodiment 2, wherein said first wavelength of radiation is at least one of X-rays, electron beams, and UV light.

Embodiment 8. The method of embodiment 1, wherein said at least one energy converting material comprises an upconverting material.

Embodiment 9. The method of embodiment 8, wherein said first wavelength of radiation is near infrared.

Embodiment 10. The method of embodiment 8, wherein said upconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof.

Embodiment 11. The method of embodiment 1, wherein said polymerizable adhesive composition comprises a monomer forming a thermoset resin.

Embodiment 12. The method of embodiment 1, further comprising adding a peroxide to the polymerizable adhesive composition.

Embodiment 13. The method of embodiment 1, wherein said at least one photoinitiator is selected from the group consisting of: benzoin ethers, benzil ketals, α-dialkoxyacetophenones, α-aminoalkylphenones, acylphosphine oxides, benzophenones/amines, thioxanthones/amines, and titanocenes.

Embodiment 14. The method of embodiment 1, wherein said polymerizable adhesive composition comprises inorganic particulates selected from the group consisting of: metals and metal alloys, ceramics and dielectrics, and metal-coated polymers.

Embodiment 15. The method of embodiment 14, wherein said polymerizable adhesive composition comprises an organic component selected from the group consisting of: solvents, viscosity modifiers, surfactants, dispersants, and plasticizers.

Embodiment 16. The method of embodiment 1, wherein providing an adherent structure comprises:

providing a solution containing natural or synthetic rubber compounds on said surface of the element to be bonded;

removing said solvent;

polymerizing said rubber compounds.

Embodiment 17. The method of embodiment 16, wherein the polymerization comprises exposing the rubber compounds to at least one of x-rays, e-beam, or UV flux.

Embodiment 18. The method of embodiment 17, wherein the exposing comprises breaking double bonds in the rubber compounds followed by bonding of the rubber compounds to the surface of the element to be bonded.

Embodiment 19. The method of embodiment 16, wherein the solution is provided with a concentration of the natural or synthetic rubber compounds between 33% and 45%.

Embodiment 20. The method of embodiment 1, wherein the surface of the element to be bonded comprises a low energy material having a surface energy of less than 50 $mJ/m^2$.

Embodiment 21. The method of embodiment 1, wherein the surface of the element to be bonded comprises a low energy material having a surface energy of less than 40 $mJ/m^2$.

Embodiment 22. The method of embodiment 1, wherein the surface of the element to be bonded comprises a low energy material having a surface energy of less than 30 $mJ/m^2$.

Embodiment 23. The method of embodiment 1, wherein the surface of the element to be bonded comprises at least one of a polytetrafluoroethylene, a poly(perfluoroalkylacrylate), a polystyrene, a polyacrylate, a poly(methyl methacrylate), a poly(dimethylsiloxane), a polyethylene, a polychlorotrifluoroethylene, a polypropylene, a polyvinyl chloride, a polyvinyl fluoride, a polyvinylidenedichloride, a polyvinylidenedifluoride, a polyacrylamide, a polyethylene terephthalate, a poly(6-aminocoproicacid), and a poly(11-aminoundecaroicacid).

Embodiment 24. The method of embodiment 1, wherein the surface of the element to be bonded comprises at least one of a silicone and a poly(dimethyl siloxane).

Embodiment 25. The method of embodiment 1, wherein providing an adherent structure comprises modifying said surface of the element to increase a surface energy thereof.

Embodiment 26. The method of embodiment 25, wherein modifying comprises exposing said surface to a plasma treatment.

Embodiment 27. The method of embodiment 25, wherein modifying comprises exposing said surface to a plasma treatment at atmospheric pressure conditions.

Embodiment 28. The method of embodiment 25, wherein modifying comprises exposing said surface to a chemical etchant.

Embodiment 29. The method of embodiment 1, wherein providing an adherent structure comprises applying a primer to said surface of the element to be bonded.

Embodiment 30. The method of embodiment 29, wherein the primer comprises a two-component urethane-based primer.

Embodiment 31. The method of embodiment 30, wherein the two-component urethane-based primer comprises a moisture activated primer.

Embodiment 32. The method of embodiment 1, wherein said at least one energy converting material comprises an organic phosphor.

Embodiment 33. The method of embodiment 32, wherein the at least one photoinitiator is configured to be activated by emitted light from one or more of organic phosphors.

Embodiment 34. The method of embodiment 32, wherein the organic phosphor comprises at least one of anthracene, sulfoflavine, fluorescein, eosin, polyvinyltoluene, styrene, fluors, and rhodamine.

Embodiment 35. The method of embodiment 32, wherein the organic phosphor is linked to the at least one photoinitiator.

Embodiment 36. A curable polymer system comprising:

an adherent structure attached to a low energy surface of an element to be bonded, said surface having a surface energy less than 50 $mJ/m^2$;

at least one polymerizable adhesive composition for adhesive attachment to the adherent structure;

at least one photoinitiator responsive to a selected wavelength of light; and at least one energy converting material selected to emit said wavelength of light when exposed to an imparted radiation.

Embodiment 37. The system of embodiment 36, wherein said at least one energy converting material is a downconverting material.

Embodiment 38. The system of embodiment 37, wherein said downconverting material comprises inorganic particulates selected from the group consisting of: metal oxides; metal sulfides; doped metal oxides; and mixed metal chalcogenides.

Embodiment 39. The system of embodiment 37, wherein said downconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS; $ZnSe_xS_y$; $ZnSe_xS_y$: Cu, Ag, Ce, Tb; and alkali lead silicate including compositions of $SiO_2$, $B_2O_3$, $Na_2O$, $K_2O$, PbO, MgO, or Ag, and combinations or alloys or layers thereof.

Embodiment 40. The system of embodiment 39, wherein the downconverting material comprises a dopant including at least one of Er, Eu, Yb, Tm, Nd, Mn Tb, Ce, Y, U, Pr, La, Gd and other rare-earth species or a combination thereof.

Embodiment 41. The system of embodiment 37, wherein the downconverting material comprises at least one of CaS, ZnSeS, and iron sulfate.

Embodiment 42. The system of embodiment 36, wherein said at least one energy converting material comprises an upconverting material.

Embodiment 43. The system of embodiment 42, wherein said upconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof.

Embodiment 44. The system of embodiment 36, wherein said polymerizable adhesive composition comprises a monomer forming a thermoset resin.

Embodiment 45. The system of embodiment 44, further comprising a peroxide included in the polymerizable adhesive composition.

Embodiment 46. The system of embodiment 36, wherein said at least one photoinitiator is selected from the group consisting of: benzoin ethers, benzil ketals, $\alpha$-dialkoxyacetophenones, $\alpha$-aminoalkylphenones, acylphosphine oxides, benzophenones/amines, thioxanthones/amines, and titanocenes.

Embodiment 47. The system of embodiment 36, wherein said polymerizable adhesive composition further comprises inorganic particulates selected from the group consisting of:

metals and metal alloys, ceramics and dielectrics, and metal-coated polymers.

Embodiment 48. The system of embodiment 46, wherein said polymerizable adhesive composition further comprises an organic component selected from the group consisting of: solvents, viscosity modifiers, surfactants, dispersants, and plasticizers.

Embodiment 49. The system of embodiment 36, wherein the adherent structure comprises:

a polymerized natural or synthetic rubber compound.

Embodiment 50. The system of embodiment 36, wherein the surface of the element to be bonded comprises a low energy material having a surface energy of less than 50 $mJ/m^2$.

Embodiment 51. The system of embodiment 36, wherein the surface of the element to be bonded comprises a low energy material having a surface energy of less than 40 $mJ/m^2$.

Embodiment 52. The system of embodiment 36, wherein the surface of the element to be bonded comprises a low energy material having a surface energy of less than 30 $mJ/m^2$.

Embodiment 53. The system of embodiment 36, wherein the surface of the element to be bonded comprises at least one of a polytetrafluoroethylene, a poly(perfluoroalkylacrylate), a polystyrene, a polyacrylate, a poly(methyl methacrylate), a poly(dimethylsiloxane), a polyethylene, a polychlorotrifluoroethylene, a polypropylene, a polyvinyl chloride, a polyvinyl fluoride, a polyvinylidenedichloride, a polyvinylidenedifluoride, a polyacrylamide, a polyethylene terephthalate, a poly(6-aminocoproicacid), and a poly(11-aminoundecaroicacid).

Embodiment 54. The system of embodiment 36, wherein the surface of the element to be bonded comprises at least one of a silicone and a poly(dimethyl siloxane).

Embodiment 55. The system of embodiment 36, further comprising a primer for application to said surface of the element to be bonded.

Embodiment 56. The system of embodiment 55, wherein the primer comprises a two-component urethane-based primer.

Embodiment 57. The system of embodiment 55, wherein the two-component urethane-based primer comprises a moisture activated primer.

Embodiment 58. The system of embodiment 36, wherein said at least one energy converting material comprises an organic phosphor.

Embodiment 59. The system of embodiment 58, wherein the at least one photoinitiator is configured to be activated by emitted light from one or more of organic phosphors.

Embodiment 60. The system of embodiment 58, wherein the organic phosphor comprises at least one of include anthracene, sulfoflavine, fluorescein, eosin, polyvinyltoluene, styrene, fluors, and rhodamine.

Embodiment 61. The system of embodiment 58, wherein the organic phosphor is linked to the at least one photoinitiator.

Embodiment 62. An inkjet cartridge, comprising a printhead and a cartridge body, wherein the printhead and cartridge body are held together by the cured adhesive composition of embodiment 36.

Embodiment 63. A wafer to wafer bonded assembly, comprising a plurality of semiconductor wafers bonded together the cured adhesive composition of embodiment 36.

Embodiment 64. An encapsulated semiconductor component, comprising a semiconductor assembly having the cured adhesive composition of embodiment 36.

Embodiment 65. An integrated circuit assembly comprising a plurality of electrically connected material layers, wherein the plurality of electrically connected material layers are held together by the cured adhesive composition of embodiment 36.

Embodiment 66. An adhesive transfer member comprising:

a release substrate;

one or more rubber compounds disposed on a surface of the release element; and an energy converting material intermixed with said one or rubber compounds in the surface of the release element.

Embodiment 67. The member of embodiment 66, wherein said energy converting material is a downconverting material.

Embodiment 68. The member of embodiment 67, wherein said downconverting material comprises inorganic particulates selected from the group consisting of: metal oxides; metal sulfides; doped metal oxides; and mixed metal chalcogenides.

Embodiment 69. The member of embodiment 67, wherein said downconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS; $ZnSe_xS_y$; $ZnSe_xS_y$: Cu, Ag, Ce, Tb; and alkali lead silicate including compositions of $SiO_2$, $B_2O_3$, $Na_2O$, $K_2O$, PbO, MgO, or Ag, and combinations or alloys or layers thereof.

Embodiment 70. The member of embodiment 67, wherein the downconverting material comprises a dopant including at least one of Er, Eu, Yb, Tm, Nd, Mn Tb, Ce, Y, U, Pr, La, Gd and other rare-earth species or a combination thereof.

Embodiment 71. The member of embodiment 67, wherein the downconverting material comprises at least one of CaS, ZnSeS, and iron sulfate.

Embodiment 72. The member of embodiment 66, wherein said at least one energy converting material comprises an upconverting material.

Embodiment 73. The member of embodiment 72, wherein said upconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof.

Embodiment 74. The member of embodiment 66, wherein said release substrate comprises mylar.

Embodiment 75. The member of embodiment 66, further comprising a peroxide added to the one or more rubber compounds.

Embodiment 76. An article comprising:

a first member;

a second member;

adherent structure including one or more rubber compounds attached to at least one of the first and second member; and a polymerizable adhesive composition joining the first member to the second member and including at least one photoinitiator and at least one energy converting material.

Embodiment 77. The article of embodiment 76, wherein the article includes at least one of a textile, a clothing article, a construction article, a semiconductor device, a plastic article, and a metal article.

Embodiment 78. The article of embodiment 76, wherein the at least one energy converting material comprises a downconverting material.

Embodiment 79. The article of embodiment 78, wherein the downconverting material comprises inorganic particulates selected from the group consisting of: metal oxides; metal sulfides; doped metal oxides; and mixed metal chalcogenides.

Embodiment 80. The article of embodiment 78, wherein the downconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS; $ZnSe_xS_y$; $ZnSe_xS_y$: Cu, Ag, Ce, Tb; and alkali lead silicate including compositions of $SiO_2$, $B_2O_3$, $Na_2O$, $K_2O$, PbO, MgO, or Ag, and combinations or alloys or layers thereof.

Embodiment 81. The article of embodiment 78, wherein the downconverting material comprises a dopant including at least one of Er, Eu, Yb, Tm, Nd, Mn Tb, Ce, Y, U, Pr, La, Gd and other rare-earth species or a combination thereof.

Embodiment 82. The article of embodiment 78, wherein the downconverting material comprises at least one of CaS, ZnSeS, and iron sulfate.

Embodiment 83. The article of embodiment 76, wherein the at least one energy converting material comprises an upconverting material.

Embodiment 84. The article of embodiment 83, wherein the upconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof.

Embodiment 85. The article of embodiment 76, wherein the at least one photoinitiator is selected from the group consisting of: benzoin ethers, benzil ketals, α-dialkoxyacetophenones, α-aminoalkylphenones, acylphosphine oxides, benzophenones/amines, thioxanthones/amines, and titanocenes.

Embodiment 86. The article of embodiment 76, wherein the polymerizable adhesive composition comprises inorganic particulates selected from the group consisting of: metals and metal alloys, ceramics and dielectrics, and metal-coated polymers.

Embodiment 87. The article of embodiment 76, wherein the polymerizable adhesive composition comprises an organic component selected from the group consisting of: solvents, viscosity modifiers, surfactants, dispersants, and plasticizers.

Embodiment 88. The article of embodiment 76, wherein the adherent structure comprises a natural or synthetic rubber compound.

Embodiment 89. The article of embodiment 76, wherein at least one of the first and second members comprises at least one of a polytetrafluoroethylene, a poly(perfluoroalkylacrylate), a polystyrene, a polyacrylate, a poly(methyl methacrylate), a poly(dimethylsiloxane), a polyethylene, a polychlorotrifluoroethylene, a polypropylene, a polyvinyl chloride, a polyvinyl fluoride, a polyvinylidenedichloride, a polyvinylidenedifluoride, a polyacrylamide, a polyethylene terephthalate, a poly(6-aminocoproicacid), and a poly(11-aminoundecaroicacid).

Embodiment 90. The article of embodiment 76, wherein at least one of the first and second members comprises at least one of a silicone and a poly(dimethyl siloxane).

Embodiment 91. The article of embodiment 76, further comprising a primer disposed on at least one of the first and second members.

Embodiment 92. The article of embodiment 76, wherein the primer comprises a two-component urethane-based primer.

Embodiment 93. The article of embodiment 92, wherein the two-component urethane-based primer comprises a moisture activated primer.

Embodiment 94. The article of embodiment 92, wherein the at least one energy converting material comprises an organic phosphor.

Embodiment 95. The article of embodiment 94, wherein organic phosphor comprises at least one of anthracene, sulfoflavine, fluorescein, eosin, polyvinyltoluene, styrene, fluors, and rhodamine.

Embodiment 96. The article of embodiment 95, wherein the organic phosphor is linked to the at least one photoinitiator.

Embodiment 97. A method of adhesive bonding comprising:

a) providing a polymerizable adhesive composition on a surface of an element to be bonded to form an assembly;
b) irradiating the assembly with radiation at a first wavelength capable of vulcanization of bonds in the polymerizable adhesive composition by activation of sulfur-containing compound with at least one-ray, e-beam, visible, or infrared light to thereby generate ultraviolet light in the polymerizable adhesive composition; and
c) adhesively joining two or more components together by way of the polymerizable adhesive composition.

Embodiment 98. The method of embodiment 97, wherein irradiating comprises severing bonds in the adhesive composition to promote said vulcanization.

Embodiment 99. The method of embodiment 97, wherein irradiating comprises irradiating at least one energy converting material in the polymerizable adhesive composition.

Embodiment 100. The method of embodiment 99, wherein said at least one energy converting material is a downconverting material.

Embodiment 101. The method of embodiment 100, wherein said downconverting material comprises inorganic particulates selected from the group consisting of: metal oxides; metal sulfides; doped metal oxides; and mixed metal chalcogenides.

Embodiment 102. The method of embodiment 100, wherein said downconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS; $ZnSe_xS_y$; $ZnSe_xS_y$: Cu, Ag, Ce, Tb; and alkali lead silicate including compositions of $SiO_2$, $B_2O_3$, $Na_2O$, $K_2O$, PbO, MgO, or Ag, and combinations or alloys or layers thereof.

Embodiment 103. The method of embodiment 100, wherein the downconverting material comprises a dopant including at least one of Er, Eu, Yb, Tm, Nd, Mn Tb, Ce, Y, U, Pr, La, Gd and other rare-earth species or a combination thereof.

Embodiment 104. The method of embodiment 97, wherein the sulfur-containing compound comprises at least one of CaS, ZnSeS, and iron sulfate.

Embodiment 105. The method of embodiment 99, wherein said at least one energy converting material further comprises an upconverting material.

Embodiment 106. The method of embodiment 105, wherein said upconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof.

Embodiment 107. The method of embodiment 97, wherein said polymerizable adhesive composition includes an organic vehicle comprising in part a monomer forming a thermoset resin.

Embodiment 108. The method of embodiment 107, wherein said thermoset resin is selected from the group consisting of: acrylics, phenolics, urethanes, epoxies, styrenes, and silicones.

Embodiment 109. The method of embodiment 97, wherein said polymerizable adhesive composition includes at least one photoinitiator selected from the group consisting of: benzoin ethers, benzil ketals, $\alpha$-dialkoxyacetophenones, $\alpha$-aminoalkylphenones, acylphosphine oxides, benzophenones/amines, thioxanthones/amines, and titanocenes.

Embodiment 110. The method of embodiment 109, wherein said polymerizable adhesive composition further comprises inorganic particulates selected from the group consisting of: metals and metal alloys, ceramics and dielectrics, and metal-coated polymers.

Embodiment 111. The method of embodiment 97, wherein said polymerizable adhesive composition further comprises an organic component selected from the group consisting of: solvents, viscosity modifiers, surfactants, dispersants, and plasticizers.

Embodiment 112. The method of embodiment 97, wherein providing a polymerizable adhesive composition comprises:

providing a solution containing natural or synthetic rubber compounds on said surface of the element to be bonded;

removing said solvent;

polymerizing said rubber compounds.

Embodiment 113. The method of embodiment 112, wherein the polymerization comprises exposing the rubber compounds to at least one of x-rays, e-beam, or UV flux.

Embodiment 114. The method of embodiment 113, wherein the exposing produces breakage of double bonds in the rubber compounds followed by bonding of the rubber compounds to the surface of the element to be bonded.

Embodiment 115. The method of embodiment 97, wherein the surface of the element to be bonded comprises at least one of a polytetrafluoroethylene, a poly(perfluoroalkylacrylate), a polystyrene, a polyacrylate, a poly(methyl methacrylate), a poly(dimethylsiloxane), a polyethylene, a polychlorotrifluoroethylene, a polypropylene, a polyvinyl chloride, a polyvinyl fluoride, a polyvinylidenedichloride, a polyvinylidenedifluoride, a polyacrylamide, a polyethylene terephthalate, a poly(6-aminocoproicacid), and a poly(11-aminoundecaroicacid).

Embodiment 116. The method of embodiment 97, wherein the surface of the element to be bonded comprises at least one of a silicone and a poly(dimethyl siloxane).

Embodiment 117. A curable polymer comprising:

a polymerizable adhesive composition; and said polymerizable adhesive composition including a sulfur-containing compound, and capable of being cured by vulcanization of bonds in the polymerizable adhesive composition upon exposure to at least one of x-rays, e-beam, or IR flux.

Embodiment 118. The polymer of embodiment 117, further comprising an energy converting material comprising at least one of a downconverting material and an up converting material.

Embodiment 119. The polymer of embodiment 118, wherein the energy converting material comprises a downconverting material.

Embodiment 120. The polymer of embodiment 119, wherein said downconverting material comprises inorganic particulates selected from the group consisting of: metal oxides; metal sulfides; doped metal oxides; and mixed metal chalcogenides.

Embodiment 121. The polymer of embodiment 119, wherein said downconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS; $ZnSe_xS_y$; $ZnSe_xS_y$: Cu, Ag, Ce, Tb; and alkali lead silicate including compositions of $SiO_2$, $B_2O_3$, $Na_2O$, $K_2O$, PbO, MgO, or Ag, and combinations or alloys or layers thereof.

Embodiment 122. The polymer of embodiment 121, wherein the downconverting material comprises a dopant including at least one of Er, Eu, Yb, Tm, Nd, Mn Tb, Ce, Y, U, Pr, La, Gd and other rare-earth species or a combination thereof.

Embodiment 123. The polymer of embodiment 117, wherein the sulfur-containing compound comprises at least one of CaS, ZnSeS, and iron sulfate.

Embodiment 124. The polymer of embodiment 118, wherein the energy converting material comprises an upconverting material.

Embodiment 125. The polymer of embodiment 124, wherein said upconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof.

Embodiment 126. The polymer of embodiment 117, further comprising a surface to be bonded comprising at least one of a polytetrafluoroethylene, a poly(perfluoroalkylacrylate), a polystyrene, a polyacrylate, a poly(methyl methacrylate), a poly(dimethylsiloxane), a polyethylene, a polychlorotrifluoroethylene, a polypropylene, a polyvinyl chloride, a polyvinyl fluoride, a polyvinylidenedichloride, a polyvinylidenedifluoride, a polyacrylamide, a polyethylene terephthalate, a poly(6-aminocoproicacid), and a poly(11-aminoundecaroicacid).

Embodiment 127. The polymer of embodiment 117, further comprising a surface to be bonded comprising at least one of a silicone and a poly(dimethyl siloxane).

Embodiment 128. The polymer of embodiment 117, further comprising a primer for application to said surface of the element to be bonded.

Embodiment 129. The polymer of embodiment 128, wherein the primer comprises a two-component urethane-based primer.

Embodiment 130. The polymer of embodiment 129, wherein the two-component urethane-based primer comprises a moisture activated primer.

Embodiment 131. The polymer of embodiment 118, wherein said at least one energy converting material comprises an organic phosphor.

Embodiment 132. The polymer of embodiment 131, wherein the organic phosphor comprises at least one of include anthracene, sulfoflavine, fluorescein, eosin, polyvinyltoluene, styrene, fluors, and rhodamine.

Embodiment 133. A method of adhesive bonding, comprising:

a) providing an adherent structure including one or more rubber compounds on respective surfaces to be adhesively joined;

b) contacting the surfaces together; and c) irradiating the adherent structure with radiation capable of directly or indirectly cross-linking the one or more rubber compounds.

Embodiment 134. The method of embodiment 133, wherein irradiating comprises irradiating with at least one of x-rays, e-beam, or infrared radiation.

Embodiment 135. The method of embodiment 133, wherein irradiating comprises irradiating an energy converting material comprising at least one of a downconverting material and an up converting material.

Embodiment 136. The method of embodiment 135, wherein the energy converting material comprises a downconverting material.

Embodiment 137. The method of embodiment 135, wherein said downconverting material comprises inorganic particulates selected from the group consisting of: metal oxides; metal sulfides; doped metal oxides; and mixed metal chalcogenides.

Embodiment 138. The method of embodiment 135, wherein said downconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS;

$ZnSe_xS_y$; $ZnSe_xS_y$: Cu, Ag, Ce, Tb; and alkali lead silicate including compositions of $SiO_2$, $B_2O_3$, $Na_2O$, $K_2O$, PbO, MgO, or Ag, and combinations or alloys or layers thereof.

Embodiment 139. The method of embodiment 135, wherein the downconverting material comprises a dopant including at least one of Er, Eu, Yb, Tm, Nd, Mn Tb, Ce, Y, U, Pr, La, Gd and other rare-earth species or a combination thereof.

Embodiment 140. The method of embodiment 133, wherein irradiating comprises irradiating a sulfur-containing compound.

Embodiment 141. The method of embodiment 140, wherein the sulfur-containing compound comprises at least one of CaS, ZnSeS, and iron sulfate.

Embodiment 142. The method of embodiment 135, wherein the energy converting material comprises an upconverting material.

Embodiment 143. The method of embodiment 142, wherein said upconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof.

Embodiment 144. The method of embodiment 133, wherein at least one of the respective surfaces comprises at least one of a polytetrafluoroethylene, a poly(perfluoroalkylacrylate), a polystyrene, a polyacrylate, a poly(methyl methacrylate), a poly(dimethylsiloxane), a polyethylene, a polychlorotrifluoroethylene, a polypropylene, a polyvinyl chloride, a polyvinyl fluoride, a polyvinylidenedichloride, a polyvinylidenedifluoride, a polyacrylamide, a polyethylene terephthalate, a poly(6-aminocoproicacid), and a poly(11-aminoundecaroicacid).

Embodiment 145. The method of embodiment 133, wherein at least one of the respective surfaces comprises at least one of a silicone and a poly(dimethyl siloxane).

Embodiment 146. The method of embodiment 135, wherein the energy converting material comprises an organic phosphor.

Embodiment 147. The method of embodiment 146, wherein the organic phosphor comprises at least one of anthracene, sulfoflavine, fluorescein, eosin, polyvinyltoluene, styrene, fluors, and rhodamine.

Embodiment 148. The method of embodiment 133, wherein contacting the surfaces together comprises:

applying the one or more rubber compounds to a release substrate;

contacting the release substrate to one of the respective surfaces; and removing the release substrate and leaving the one or more rubber compounds disposed on said one of the respective surfaces.

Embodiment 149. The method of embodiment 148, wherein the release substrate comprises mylar.

Embodiment 150. The method of embodiment 148, wherein the release substrate is silicone coated.

Embodiment 151. The method of embodiment 133, wherein contacting the surfaces together comprises:

applying the one or more rubber compounds to a release substrate by immersing the release substrate in a solution of the one or more rubber compounds.

Additional modifications and variations of the present invention are possible in light of the above teachings. It is therefore to be understood that within the scope of the appended claims, the invention may be practiced otherwise than as specifically described herein.

The invention claimed is:

1. A method of adhesive bonding, comprising:

a) providing an adherent structure including one or more rubber compounds on a surface of an element to be bonded, wherein providing an adherent structure comprises modifying said surface of the element to be bonded to increase a surface energy thereof;

b) placing a polymerizable adhesive composition, including at least one photoinitiator and at least one energy converting material, in contact with the adherent structure and two or more components to be bonded to form an assembly;

c) irradiating the assembly with radiation at a first wavelength, capable of conversion by the at least one energy converting material to a second wavelength capable of activating the at least one photoinitiator to produce from the polymerizable adhesive composition a cured adhesive composition; and d) adhesively joining the two or more components by way of the adherent structure and the cured adhesive composition.

2. The method of claim 1, wherein said at least one energy converting material is a downconverting material.

3. The method of claim 2, wherein said downconverting material comprises inorganic particulates selected from the group consisting of:

metal oxides; metal sulfides; doped metal oxides; and mixed metal chalcogenides.

4. The method of claim 2, wherein said downconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS; $ZnSe_xS_y$; $ZnSe_xS_y$:Cu, Ag, Ce, Tb; and alkali lead silicate including compositions of $SiO_2$, $B_2O_3$, $Na_2O$, $K_2O$, PbO, MgO, or Ag, and combinations or alloys or layers thereof.

5. The method of claim 4, wherein the downconverting material comprises a dopant including at least one of Er, Eu, Yb, Tm, Nd, Mn Tb, Ce, Y, U, Pr, La, Gd and other rare-earth species or a combination thereof.

6. The method of claim 2, wherein the downconverting material comprises at least one of CaS, ZnSeS, and iron sulfate.

7. The method of claim 2, wherein said first wavelength of radiation is at least one of X-rays, electron beams, and UV light.

8. The method of claim 1, wherein said at least one energy converting material comprises an upconverting material.

9. The method of claim 8, wherein said first wavelength of radiation is near infrared.

10. The method of claim 8, wherein said upconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof.

11. The method of claim 1, wherein said polymerizable adhesive composition comprises a monomer forming a thermoset resin.

12. The method of claim 1, further comprising adding a peroxide to the polymerizable adhesive composition.

13. The method of claim 1, wherein said at least one photoinitiator is selected from the group consisting of: benzoin ethers, benzil ketals, α-dialkoxyacetophenones, α-aminoalkylphenones, acylphosphine oxides, benzophenones/amines, thioxanthones/amines, and titanocenes.

14. The method of claim 1, wherein said polymerizable adhesive composition comprises inorganic particulates selected from the group consisting of: metals and metal alloys, ceramics and dielectrics, and metal-coated polymers.

15. The method of claim 14, wherein said polymerizable adhesive composition comprises an organic component selected from the group consisting of: solvents, viscosity modifiers, surfactants, dispersants, and plasticizers.

16. The method of claim 1, wherein providing an adherent structure comprises:

providing a solution containing natural or synthetic rubber compounds on said surface of the element to be bonded;

removing said solvent;

polymerizing said rubber compounds.

17. The method of claim 16, wherein the polymerization comprises exposing the rubber compounds to at least one of x-rays, e-beam, or UV flux.

18. The method of claim 17, wherein the exposing comprises breaking double bonds in the rubber compounds followed by bonding of the rubber compounds to the surface of the element to be bonded.

19. The method of claim 16, wherein the solution is provided with a concentration of the natural or synthetic rubber compounds between 33% and 45%.

20. The method of claim 1, wherein the surface of the element to be bonded comprises a low energy material having a surface energy of less than 50 $mJ/m^2$.

21. The method of claim 1, wherein the surface of the element to be bonded comprises a low energy material having a surface energy of less than 40 $mJ/m^2$.

22. The method of claim 1, wherein the surface of the element to be bonded comprises a low energy material having a surface energy of less than 30 $mJ/m^2$.

23. The method of claim 1, wherein the surface of the element to be bonded comprises at least one of a polytetrafluoroethylene, a poly(perfluoroalkylacrylate), a polystyrene, a polyacrylate, a poly(methyl methacrylate), a poly (dimethylsiloxane), a polyethylene, a polychlorotrifluoroethylene, a polypropylene, a polyvinyl chloride, a polyvinyl fluoride, a polyvinylidenedichloride, a polyvinylidenedifluoride, a polyacrylamide, a polyethylene terephthalate, a poly(6-aminocoproicacid), and a poly(11-aminoundecaroicacid).

24. The method of claim 1, wherein the surface of the element to be bonded comprises at least one of a silicone and a poly(dimethyl siloxane).

25. The method of claim 1, wherein modifying comprises exposing said surface to a plasma treatment.

26. The method of claim 1, wherein modifying comprises exposing said surface to a plasma treatment at atmospheric pressure conditions.

27. The method of claim 1, wherein modifying comprises exposing said surface to a chemical etchant.

28. The method of claim 1, wherein said at least one energy converting material comprises an organic phosphor.

29. The method of claim 28, wherein the at least one photoinitiator is configured to be activated by emitted light from one or more of organic phosphors.

30. The method of claim 28, wherein the organic phosphor comprises at least one of anthracene, sulfoflavine, fluorescein, eosin, polyvinyltoluene, styrene, fluors, and rhodamine.

31. The method of claim 28, wherein the organic phosphor is linked to the at least one photoinitiator.

32. A method of adhesive bonding, comprising:

a) providing an adherent structure including one or more rubber compounds on a surface of an element to be bonded, wherein providing an adherent structure comprises applying a primer to said surface of the element to be bonded;

b) placing a polymerizable adhesive composition, including at least one photoinitiator and at least one energy converting material, in contact with the adherent structure and two or more components to be bonded to form an assembly;

c) irradiating the assembly with radiation at a first wavelength, capable of conversion by the at least one energy converting material to a second wavelength capable of activating the at least one photoinitiator to produce from the polymerizable adhesive composition a cured adhesive composition; and d) adhesively joining the two or more components by way of the adherent structure and the cured adhesive composition, wherein providing an adherent structure comprises applying a primer to said surface of the element to be bonded.

33. The method of claim 32, wherein the primer comprises a two-component urethane-based primer.

34. The method of claim 33, wherein the two-component urethane-based primer comprises a moisture activated primer.

35. The method of claim 32, wherein said at least one energy converting material is a downconverting material.

36. The method of claim 35, wherein said downconverting material comprises inorganic particulates selected from the group consisting of:

metal oxides; metal sulfides; doped metal oxides; and mixed metal chalcogenides.

37. The method of claim 35, wherein said downconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, ZnS; ZnSe; MgS; CaS; $ZnSe_xS_y$; $ZnSe_xS_y$:Cu, Ag, Ce, Tb; and alkali lead silicate including compositions of $SiO_2$, $B_2O_3$, $Na_2O$, $K_2O$, PbO, MgO, or Ag, and combinations or alloys or layers thereof.

38. The method of claim 37, wherein the downconverting material comprises a dopant including at least one of Er, Eu, Yb, Tm, Nd, Mn Tb, Ce, Y, U, Pr, La, Gd and other rare-earth species or a combination thereof.

39. The method of claim 35, wherein the downconverting material comprises at least one of CaS, ZnSeS, and iron sulfate.

40. The method of claim 35, wherein said first wavelength of radiation is at least one of X-rays, electron beams, and UV light.

41. The method of claim 32, wherein said at least one energy converting material comprises an upconverting material.

42. The method of claim 41, wherein said first wavelength of radiation is near infrared.

43. The method of claim 41, wherein said upconverting material comprises at least one of $Y_2O_3$, $Y_2O_2S$, $NaYF_4$, $NaYbF_4$, YAG, YAP, $Nd_2O_3$, $LaF_3$, $LaCl_3$, $La_2O_3$, $TiO_2$, $LuPO_4$, $YVO_4$, $YbF_3$, $YF_3$, Na-doped $YbF_3$, or $SiO_2$ or alloys or layers thereof.

44. The method of claim 32, wherein said polymerizable adhesive composition comprises a monomer forming a thermoset resin.

45. The method of claim 32, further comprising adding a peroxide to the polymerizable adhesive composition.

46. The method of claim 32, wherein said at least one photoinitiator is selected from the group consisting of: benzoin ethers, benzil ketals, α-dialkoxyacetophenones, α-aminoalkylphenones, acylphosphine oxides, benzophenones/amines, thioxanthones/amines, and titanocenes.

47. The method of claim 32, wherein said polymerizable adhesive composition comprises inorganic particulates selected from the group consisting of: metals and metal alloys, ceramics and dielectrics, and metal-coated polymers.

48. The method of claim 47, wherein said polymerizable adhesive composition comprises an organic component selected from the group consisting of: solvents, viscosity modifiers, surfactants, dispersants, and plasticizers.

49. The method of claim 32, wherein providing an adherent structure comprises:

providing a solution containing natural or synthetic rubber compounds on said surface of the element to be bonded;

removing said solvent;

polymerizing said rubber compounds.

50. The method of claim 49, wherein the polymerization comprises exposing the rubber compounds to at least one of x-rays, e-beam, or UV flux.

51. The method of claim 50, wherein the exposing comprises breaking double bonds in the rubber compounds followed by bonding of the rubber compounds to the surface of the element to be bonded.

52. The method of claim 49, wherein the solution is provided with a concentration of the natural or synthetic rubber compounds between 33% and 45%.

53. The method of claim 32, wherein the surface of the element to be bonded comprises a low energy material having a surface energy of less than 50 $mJ/m^2$.

54. The method of claim 32, wherein the surface of the element to be bonded comprises a low energy material having a surface energy of less than 40 $mJ/m^2$.

55. The method of claim 32, wherein the surface of the element to be bonded comprises a low energy material having a surface energy of less than 30 $mJ/m^2$.

56. The method of claim 32, wherein the surface of the element to be bonded comprises at least one of a polytetrafluoroethylene, a poly(perfluoroalkylacrylate), a polystyrene, a polyacrylate, a poly(methyl methacrylate), a poly (dimethylsiloxane), a polyethylene, a polychlorotrifluoroethylene, a polypropylene, a polyvinyl chloride, a polyvinyl fluoride, a polyvinylidenedichloride, a polyvinylidenedifluoride, a polyacrylamide, a polyethylene terephthalate, a poly(6-aminocoproicacid), and a poly(11-aminoundecaroicacid).

57. The method of claim 32, wherein the surface of the element to be bonded comprises at least one of a silicone and a poly(dimethyl siloxane).

58. The method of claim 32, wherein modifying comprises exposing said surface to a plasma treatment.

59. The method of claim 32, wherein modifying comprises exposing said surface to a plasma treatment at atmospheric pressure conditions.

60. The method of claim 32, wherein modifying comprises exposing said surface to a chemical etchant.

61. The method of claim 32, wherein said at least one energy converting material comprises an organic phosphor.

62. The method of claim 61, wherein the at least one photoinitiator is configured to be activated by emitted light from one or more of organic phosphors.

63. The method of claim 61, wherein the organic phosphor comprises at least one of anthracene, sulfoflavine, fluorescein, eosin, polyvinyltoluene, styrene, fluors, and rhodamine.

* * * * *